(12) United States Patent
Yoshino et al.

(10) Patent No.: US 10,989,948 B2
(45) Date of Patent: Apr. 27, 2021

(54) METHOD FOR MANUFACTURING ACTIVE MATRIX SUBSTRATE AND METHOD FOR MANUFACTURING LIQUID CRYSTAL DISPLAY DEVICE WITH TOUCH SENSOR

(71) Applicant: Sharp Kabushiki Kaisha, Sakai (JP)

(72) Inventors: Hikaru Yoshino, Sakai (JP); Junichi Morinaga, Sakai (JP); Tetsuo Kikuchi, Sakai (JP); Kengo Hara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/571,325

(22) Filed: Sep. 16, 2019

(65) Prior Publication Data

US 2020/0089037 A1 Mar. 19, 2020

Related U.S. Application Data

(60) Provisional application No. 62/733,267, filed on Sep. 19, 2018.

(51) Int. Cl.
*G02F 1/1333* (2006.01)
*G02F 1/1362* (2006.01)
*H01L 27/12* (2006.01)

(52) U.S. Cl.
CPC ...... *G02F 1/13338* (2013.01); *G02F 1/13624* (2013.01); *G02F 1/136227* (2013.01);
(Continued)

(58) Field of Classification Search
None
See application file for complete search history.

(56) References Cited

U.S. PATENT DOCUMENTS 10,725,326 B2 * 7/2020 Yoshino .............. G02F 1/13338
2008/0035920 A1 2/2008 Takechi et al.
(Continued)

FOREIGN PATENT DOCUMENTS

JP 2008-040343 A 2/2008
JP 2009-244958 A 10/2009
(Continued)

OTHER PUBLICATIONS

Yoshino et. al.; "Active Matrix Substrate and Liquid Crystal Display Device With Touch Sensor Using the Same"; U.S. Appl. No. 16/571,326, filed Sep. 16, 2019.

*Primary Examiner* — Zandra V Smith
*Assistant Examiner* — Lawrence C Tynes, Jr.
(74) *Attorney, Agent, or Firm* — Keating & Bennett, LLP

(57) ABSTRACT

A method for manufacturing an active matrix substrate including a thin film transistor for each pixel, and a first electrode and a first wiring line for touchscreen panel function includes: forming a transparent electrically conductive film on an interlayer insulating layer and within a first contact hole; forming, on a portion of the transparent electrically conductive film, an upper wiring portion to become an upper layer of the first wiring line; patterning the transparent electrically conductive film to make a pixel electrode and form a lower wiring portion to become a lower layer of the first wiring line; forming a dielectric layer covering the pixel electrode and the first wiring line and having a second contact hole through which a portion of the first wiring line is exposed; and forming a common electrode which is electrically connected to the first wiring line within the second contact hole.

13 Claims, 28 Drawing Sheets

(52) U.S. Cl.
CPC ...... *G02F 1/136286* (2013.01); *H01L 27/124* (2013.01); *H01L 27/1225* (2013.01); *G02F 1/136245* (2021.01)

(56) References Cited

U.S. PATENT DOCUMENTS

| | | | |
|---|---|---|---|
| 2010/0182273 A1 | 7/2010 | Noguchi et al. | |
| 2012/0138922 A1 | 7/2012 | Yamazaki et al. | |
| 2013/0249820 A1* | 9/2013 | Woo | G02F 1/13338 345/173 |
| 2013/0320334 A1 | 12/2013 | Yamazaki et al. | |
| 2014/0168537 A1* | 6/2014 | Han | G06F 3/0446 349/12 |
| 2014/0286076 A1 | 9/2014 | Aoki et al. | |
| 2015/0097192 A1 | 4/2015 | Araki et al. | |
| 2016/0187693 A1* | 6/2016 | Woo | G02F 1/13338 257/72 |
| 2016/0349559 A1* | 12/2016 | Woo | G06F 3/0412 |
| 2017/0269440 A1 | 9/2017 | Yoshitomi et al. | |
| 2018/0004322 A1* | 1/2018 | Nakanishi | G06F 3/0443 |
| 2020/0089038 A1* | 3/2020 | Yoshino | G02F 1/136 |

FOREIGN PATENT DOCUMENTS

| | | |
|---|---|---|
| JP | 2012-134475 A | 7/2012 |
| JP | 2014-007399 A | 1/2014 |
| JP | 2014-209727 A | 11/2014 |
| JP | 2015-075605 A | 4/2015 |
| JP | 2016-126321 A | 7/2016 |
| JP | 2017-211638 A | 11/2017 |
| JP | 2018-005484 A | 1/2018 |

* cited by examiner

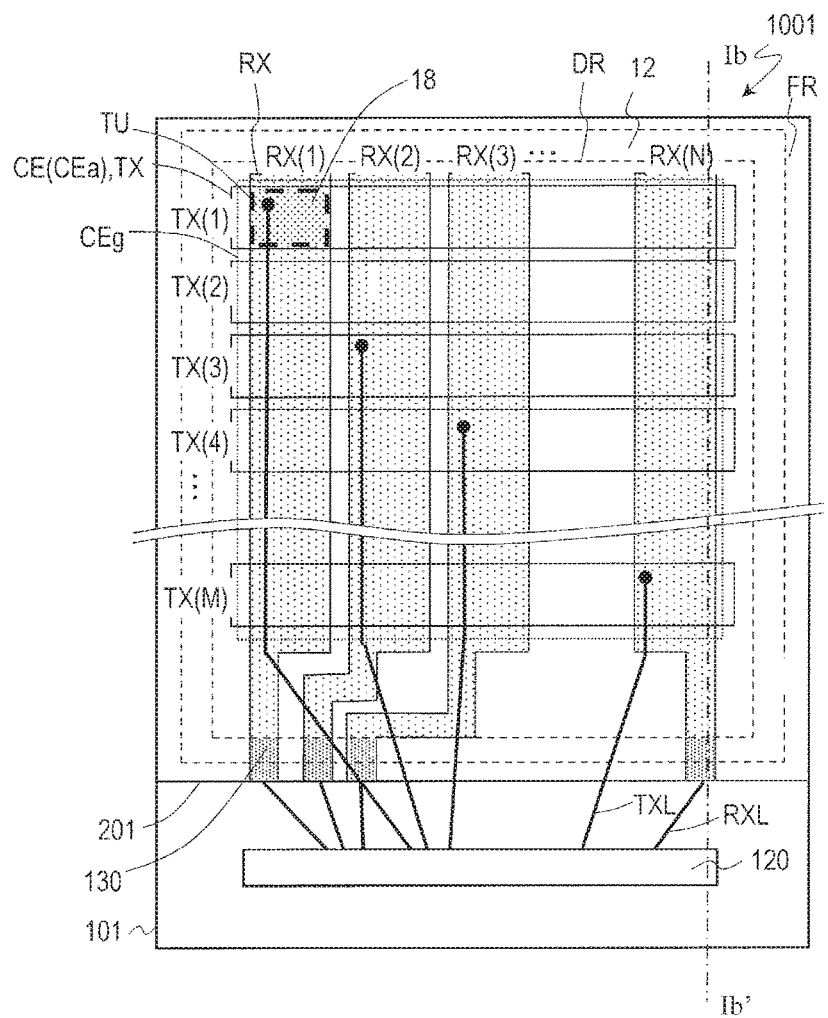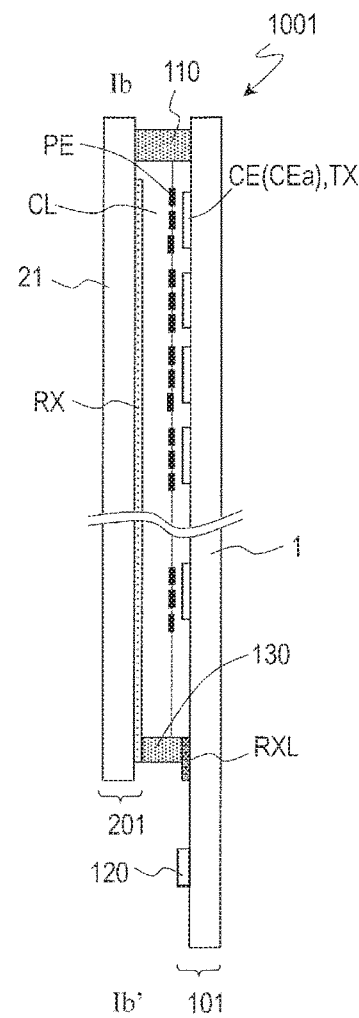
FIG.1A
FIG.1B

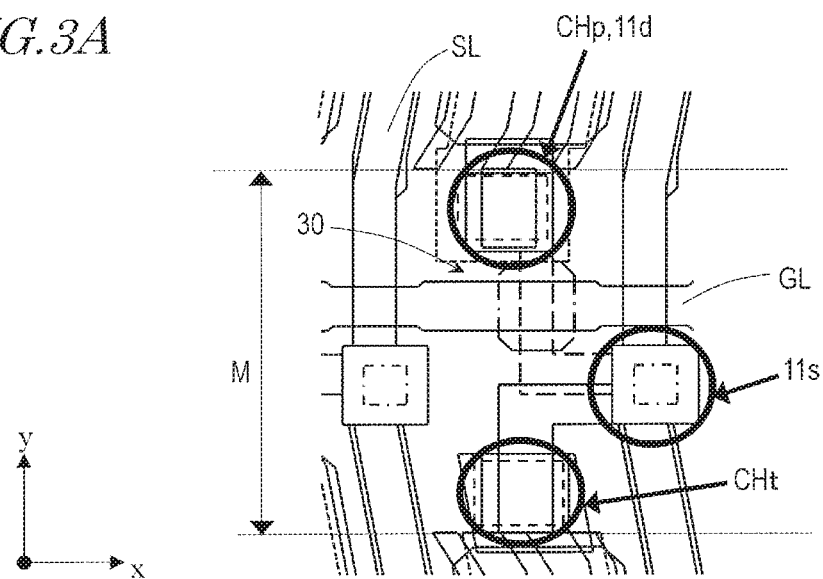
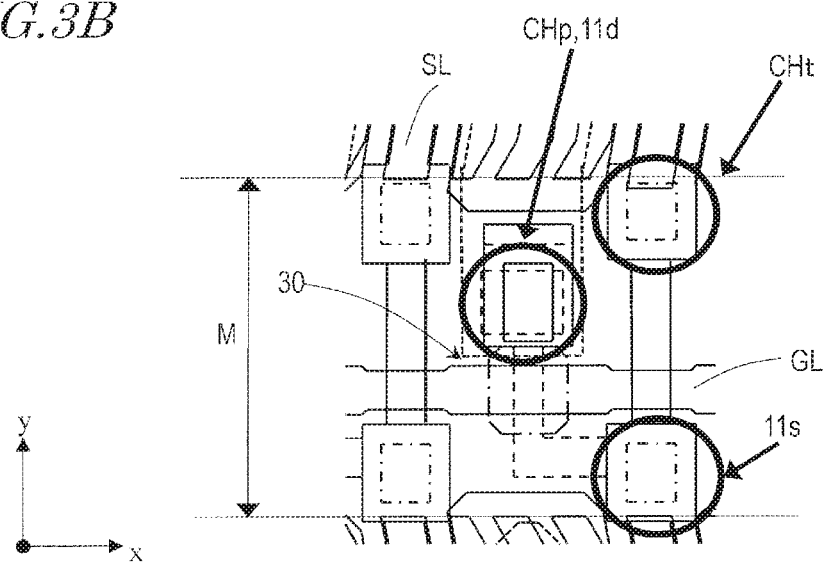

METHOD FOR MANUFACTURING ACTIVE MATRIX SUBSTRATE AND METHOD FOR MANUFACTURING LIQUID CRYSTAL DISPLAY DEVICE WITH TOUCH SENSOR

BACKGROUND

1. Technical Field

The present invention relates to a method for manufacturing an active matrix substrate and to a method for manufacturing a liquid crystal display device with touch sensing in which the active matrix substrate is used.

2. Description of the Related Art

In recent years, display devices having a touch sensor (hereinafter referred to as "touchscreen panels") are widely used in smartphones, table-type mobile terminals, and the like. Various approaches are known for touch sensors, e.g., the resistive type, the capacitance type, and the optical type. In a touch sensor of the capacitance type, a change in electrostatic capacity that is caused by contact or approach of an object (e.g., a finger) is electrically detected, thereby determining whether a touched state exists or not.

Capacitance-type touch sensors may be based on: a self-capacitance method in which a change in electrostatic capacity occurring between an electrode for touch sensing and an object (e.g., a finger) is detected; or a mutual capacitance method in which a pair of electrodes for touch sensing (a transmitter electrode and a receiver electrode) are used to generate an electric field, and a change in the electric field between the electrodes is detected.

Touchscreen panels include add-on types (i.e., those including a touch sensor that is disposed on the viewer side of a polarizer which is already disposed on the viewer's side) and internal-types. Internal-type touchscreen panels include ON-cell type touchscreen panels and IN-cell type touchscreen panels. As used herein, a cell refers to a display cell (hereinafter referred to as a "display panel"); for example, a liquid crystal display panel would include an active matrix substrate (TFT substrate) and a counter substrate that are opposed to each other with a liquid crystal layer therebetween, and is not inclusive of any polarizers. "IN-cell types" refer to those in which a layer that is responsible for touchscreen function is provided within the display panel. On the other hand, "ON-cell types" refer to those in which a layer that is responsible for touchscreen function is disposed between the display panel and a polarizer (e.g., between a counter substrate and a polarizer). There also exist "hybrid types" in which layers that are responsible for touchscreen function are disposed, one within a display panel and another between the display panel and a polarizer. As compared to an add-on type touchscreen panel, an internal-type touchscreen panel is advantageous with its thinner profile, light weight, while also having enhanced light transmittance.

Patent Document 1 (Japanese Laid-Open Patent Publication No. 2016-126321) and Patent Document 2 (Japanese Laid-Open Patent Publication No. 2009-244958) disclose that a common electrode that is provided in an active matrix substrate may be utilized as an electrode for touch sensing, in an internal-type touchscreen panel utilizing a liquid crystal display panel of a lateral field mode, e.g., Fringe Field Switching (FFS) mode.

SUMMARY

In a lateral-field mode liquid crystal display panel with touch sensing, in a displaying region of an active matrix substrate, not only a thin film transistor (hereinafter "TFT") and a pixel electrode to be disposed in each pixel, but also a common electrode serving also as an electrode for touch sensing (hereinafter "sensor electrode") and wiring lines for touch sensing's driving and/or detection purposes (hereinafter collectively referred to as "touch wiring lines") are also provided. According to a study by the inventor, in such an active matrix substrate, not only pixel contact portions for connecting the pixel electrodes and drain electrodes of TFTs but also touch wiring contact portions for connecting the sensor electrodes and the touch wiring lines are formed in the displaying region, thereby lowering the pixel aperture ratio.

An embodiment of the present invention, made in view of the above circumstances, aims to provide a method for manufacturing an active matrix substrate that can suppress a decrease in the pixel aperture ratio, and a method for manufacturing a liquid crystal display device with touch sensing in which the active matrix substrate is used.

Solution for the Problem

The present specification discloses a method for manufacturing active matrix substrates and a method for manufacturing liquid crystal display devices as recited in the following Items.

[Item 1]

A method for manufacturing an active matrix substrate having a plurality of pixel regions, the active matrix substrate including a thin film transistor disposed for each of the plurality of pixel regions, a first electrode for touchscreen panel function, and a first wiring line for touchscreen panel function, the method comprising:

(A) a step of forming, on a substrate having a principal face, an oxide semiconductor layer to become an active layer of the thin film transistor, and a gate electrode which overlaps at least a portion of the oxide semiconductor layer via a gate insulating layer;

(B) a step of forming an insulating layer covering the gate electrode, the gate insulating layer, and the oxide semiconductor layer, and having a source-side aperture through which a portion of the oxide semiconductor layer is exposed and a drain-side aperture through which another portion of the oxide semiconductor layer is exposed, such that, when viewed from a normal direction of the principal face of the substrate, the source-side aperture and the drain-side aperture are located on opposite sides of a region of the oxide semiconductor layer that overlaps the gate electrode;

(C) a step of forming a source electrode on the insulating layer and within the source-side aperture and forming a drain electrode on the insulating layer and within the drain-side aperture, thereby providing the thin film transistor;

(D) a step of forming an interlayer insulating layer that includes an organic insulating layer, the interlayer insulating layer covering the thin film transistor and having a first contact hole through which a portion of the drain electrode is exposed;

(E) a step of forming a first transparent electrically conductive film on the interlayer insulating layer and within the first contact hole;

(F) a step of forming by using a metal film, on a portion of the first transparent electrically conductive film, an upper wiring portion to become an upper layer of the first wiring line;

(G) a step of patterning the first transparent electrically conductive film to form a pixel electrode which is electrically connected to the drain electrode within the first contact hole, and form a lower wiring portion to become a lower layer of the first wiring line below the upper wiring portion;

(H) a step of forming a dielectric layer covering the pixel electrode and the first wiring line and having a second contact hole through which a portion of the first wiring line is exposed;

(I) a step of forming, on the dielectric layer and within the second contact hole, a common electrode which is electrically connected to the first wiring line within the second contact hole, such that the common electrode includes a plurality of common electrode subportions each capable of functioning as the first electrode, wherein, when viewed from a normal direction of the principal face of the substrate, a bottom face of the first contact hole at least partially overlaps a bottom face of the drain-side aperture, and a bottom face of the second contact hole at least partially overlaps a bottom face of the source-side aperture.

[Item 2]

A method for manufacturing an active matrix substrate having a plurality of pixel regions, the active matrix substrate including a thin film transistor disposed for each of the plurality of pixel regions, a first electrode for touchscreen panel function, and a first wiring line for touchscreen panel function, the method comprising:

(A) a step of forming, on a substrate having a principal face, an oxide semiconductor layer to become an active layer of the thin film transistor, and a gate electrode which overlaps at least a portion of the oxide semiconductor layer via a gate insulating layer;

(B) a step of forming an insulating layer covering the gate electrode, the gate insulating layer, and the oxide semiconductor layer, and having a source-side aperture through which a portion of the oxide semiconductor layer is exposed and a drain-side aperture through which another portion of the oxide semiconductor layer is exposed, such that, when viewed from a normal direction of the principal face of the substrate, the source-side aperture and the drain-side aperture are located on opposite sides of a region of the oxide semiconductor layer that overlaps the gate electrode;

(C) a step of forming a source electrode on the insulating layer and within the source-side aperture and forming a drain electrode on the insulating layer and within the drain-side aperture, thereby providing the thin film transistor;

(D) a step of forming an interlayer insulating layer having a multilayer structure which includes an inorganic insulating layer and an organic insulating layer disposed on the inorganic insulating layer, and making in the organic insulating layer a first aperture through which a portion of the inorganic insulating layer is exposed;

(E) a step of forming the first wiring line on the interlayer insulating layer, by using a metal film;

(F) a step of forming a dielectric layer on the interlayer insulating layer, on the first wiring line, and within the first aperture;

(G) a step of patterning the dielectric layer and the inorganic insulating layer by using a first mask to form, in the dielectric layer, a preliminary aperture through which a portion of the first wiring line is exposed, and form, in the dielectric layer and in a portion of the inorganic insulating layer that is exposed through the first aperture, a second aperture through which a portion of the drain electrode is exposed, thereby forming a first contact hole that is composed of the first aperture and the second aperture;

(H) a step of forming, on the interlayer insulating layer and within the first contact hole, a pixel electrode which is electrically connected to the drain electrode within the first contact hole;

(I) a step of forming another dielectric layer on the pixel electrode, on the dielectric layer, and within the preliminary aperture;

(J) a step of patterning the other dielectric layer and the dielectric layer by using a second mask, to make a second contact hole through which a portion of the first wiring line is exposed, the second contact hole being disposed so as to at least partially overlap the preliminary aperture; and (K) a step of forming, on the other dielectric layer and within the second contact hole, a common electrode which is electrically connected to the first wiring line within the second contact hole, the common electrode including a plurality of common electrode subportions each capable of functioning as the first electrode, wherein, when viewed from a normal direction of the principal face of the substrate, a bottom face of the first contact hole at least partially overlaps a bottom face of the drain-side aperture, and a bottom face of the second contact hole at least partially overlaps a bottom face of the source-side aperture.

[Item 3]

A method for manufacturing an active matrix substrate having a plurality of pixel regions, the active matrix substrate including a thin film transistor disposed for each of the plurality of pixel regions, a first electrode for touchscreen panel function, and a first wiring line for touchscreen panel function, the method comprising:

(A) a step of forming, on a substrate having a principal face, an oxide semiconductor layer to become an active layer of the thin film transistor, and a gate electrode which overlaps at least a portion of the oxide semiconductor layer via a gate insulating layer;

(B) a step of forming an insulating layer covering the gate electrode, the gate insulating layer, and the oxide semiconductor layer, and having a source-side aperture through which a portion of the oxide semiconductor layer is exposed and a drain-side aperture through which another portion of the oxide semiconductor layer is exposed, such that, when viewed from a normal direction of the principal face of the substrate, the source-side aperture and the drain-side aperture are located on opposite sides of a region of the oxide semiconductor layer that overlaps the gate electrode;

(C) a step of forming a source electrode on the insulating layer and within the source-side aperture and forming a drain electrode on the insulating layer and within the drain-side aperture, thereby providing the thin film transistor;

(D) a step of forming an interlayer insulating layer having a multilayer structure which includes an inorganic insulating layer and an organic insulating layer disposed on the inorganic insulating layer, and making in the organic insulating layer a first aperture through which a portion of the inorganic insulating layer is exposed;

(E) a step of forming on the interlayer insulating layer a common electrode which includes a plurality of common electrode subportions each capable of functioning as the first electrode;

(F) a step of forming a lower dielectric layer on the common electrode and within the first aperture, and patterning the lower dielectric layer to form, in the lower dielectric layer, a preliminary aperture which at least partially overlaps the first aperture and a second contact hole through which a portion of the common electrode is exposed;

(G) a step of forming the first wiring line on the lower dielectric layer and within the second contact hole, by using a metal film;

(H) a step of forming an upper dielectric layer on the first wiring line and the lower dielectric layer, within the first aperture, and within the preliminary aperture;

(I) a step of patterning the upper dielectric layer and the lower dielectric layer by using a mask to make a second aperture that at least partially overlaps the preliminary aperture, thereby making a first contact hole which includes the first aperture and the second aperture and through which a portion of the drain electrode is exposed; and (J) a step of forming, on the upper dielectric layer and within the first contact hole, a pixel electrode which is electrically connected to the drain electrode within the first contact hole, wherein, the method further comprises, by patterning the inorganic insulating layer in between step (D) and step (E), and/or by patterning the inorganic insulating layer in step (I) with using the mask, a step of making in the inorganic insulating layer a third aperture through which the portion of the drain electrode is exposed, such that the third aperture composes the first contact hole together with the first aperture and the second aperture; and, when viewed from a normal direction of the principal face of the substrate, a bottom face of the first contact hole at least partially overlaps a bottom face of the drain-side aperture, and a bottom face of the second contact hole at least partially overlaps a bottom face of the source-side aperture.

[Item 4]

The method for manufacturing an active matrix substrate of Item 3, further comprising, in between step (D) and step (E), a step of making another preliminary aperture in the inorganic insulating layer by patterning the inorganic insulating layer by using the organic insulating layer as a mask; and step (I) further comprises a step of making, by using the mask, the third aperture in the inorganic insulating layer so as to at least partially overlap the other preliminary aperture.

[Item 5]

The method for manufacturing an active matrix substrate of Item 3, wherein, in step (D), the first aperture is formed in the organic insulating layer so as to expose a portion of the inorganic insulating layer; and step (I) further comprises a step of making, by using the mask, the third aperture in a portion of the inorganic insulating layer that is exposed through the first aperture.

[Item 6]

The method for manufacturing an active matrix substrate of any of Items 1 to 5, wherein, in step (A), the gate electrode is disposed on a portion of the oxide semiconductor layer via the gate insulating layer.

[Item 7]

The method for manufacturing an active matrix substrate of Item 6, further comprising, in between step (A) and step (B), a step of performing a low-resistance treatment for the oxide semiconductor layer by using the gate electrode as a mask, so that a specific resistance of a region of the oxide semiconductor layer that does not overlap the gate electrode is lower than a specific resistance of a region that overlaps the gate electrode.

[Item 8]

The method for manufacturing an active matrix substrate of Item 6 or 7, further comprising a step of forming, on the substrate side of the oxide semiconductor layer and via another insulating layer, a light shielding layer or another gate electrode that at least partially overlaps the portion of the oxide semiconductor layer.

[Item 9]

The method for manufacturing an active matrix substrate of any of Items 1 to 8, wherein, step (A) further comprises a step of forming a plurality of gate bus lines by using a same electrically conductive film as the gate electrode;

step (C) further comprises a step of forming a plurality of source bus lines by using a same electrically conductive film as the source electrode; and the source electrode of the thin film transistor is electrically connected to a corresponding one of the plurality of source bus lines, and the gate electrode is electrically connected to a corresponding one of the plurality of gate bus lines.

[Item 10]

The method for manufacturing an active matrix substrate of Item 9, wherein, when viewed from the normal direction of the principal face of the substrate, the first contact hole, the second contact hole, the source-side aperture, and the drain-side aperture are each disposed so as to overlap neither the plurality of gate bus lines nor the gate electrode.

[Item 11]

The method for manufacturing an active matrix substrate of any of Items 1 to 10, wherein, when viewed from the normal direction of the principal face of the substrate, the second contact hole is located inside the source-side aperture.

[Item 12]

The method for manufacturing an active matrix substrate of any of Items 1 to 10, wherein, when viewed from the normal direction of the principal face of the substrate, the source-side aperture is located inside the second contact hole.

[Item 13]

The method for manufacturing an active matrix substrate of Item 9 or 10, wherein, the source electrode is formed integrally with one corresponding source bus line; and, when viewed from the normal direction of the principal face of the substrate, the source-side aperture is disposed inside a source conducting portion that includes the one corresponding source bus line and the source electrode, the source-side aperture being disposed only on one side of a median line that equally divides a width of the one corresponding source bus line into two, and the second contact hole is disposed so as to overlap the median line inside the source conducting portion.

[Item 14]

The method for manufacturing an active matrix substrate of any of Items 1 to 10, wherein, when viewed from the normal direction of the principal face of the substrate, the bottom face of the second contact hole and the bottom face of the source-side aperture intersect each other.

[Item 15]

The method for manufacturing an active matrix substrate of any of Items 1 to 14, wherein the oxide semiconductor layer comprises an In—Ga—Zn—O based semiconductor.

[Item 16]

An active matrix substrate manufactured by the method of any of Items 1 to 15.

[Item 17]

A method for manufacturing a liquid crystal display device with touch sensing that includes:

an active matrix substrate;

a counter substrate that is opposed to the active matrix substrate; and a liquid crystal layer that is provided between the active matrix substrate and the counter substrate, wherein the method comprises a step of providing the active matrix substrate; and the step is performed by the method of any of Items 1 to 15.

According to an embodiment of the present invention, there is provided a method for manufacturing an active matrix substrate that can suppress a decrease in the pixel aperture ratio, and a method for manufacturing a liquid crystal display device with touch sensing in which such an active matrix substrate is used.

BRIEF DESCRIPTION OF THE DRAWINGS

FIG. 1A An upper plan view of a touchscreen panel 1001 according to a first embodiment.

FIG. 1B A cross-sectional view of a touchscreen panel 1001 according to the first embodiment.

FIG. 3A A plan view showing an arrangement of contact portions according to Reference Example 1.

FIG. 3B A plan view showing an arrangement of contact portions according to Reference Example 2.

DETAILED DESCRIPTION

Figure 2A:
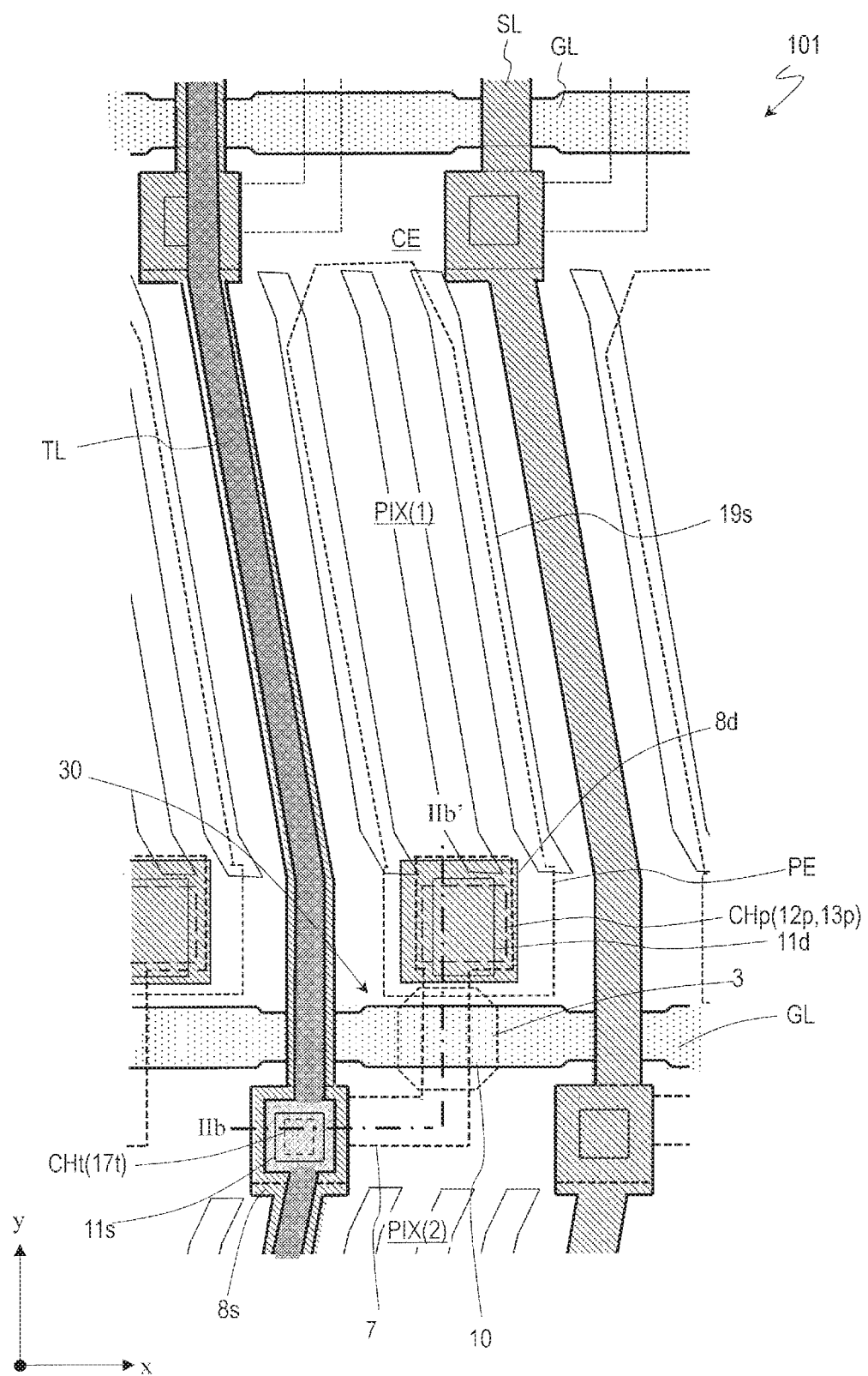
FIG. 2A A plan view showing a portion of a displaying region of an active matrix substrate 101.

Hereinafter, an active matrix substrate according to an embodiment of the present invention and a display with touch sensing (hereinafter, a "touchscreen panel") will be described more specifically. In the following figures, component elements of substantially the same functions will be denoted by like reference numerals, with their description being occasionally omitted.

First Embodiment

<Overall Structure of the Touchscreen Panel 1001>

First, with reference to the drawings, the overall structure of a touchscreen panel will be described in outline, by taking for example an IN-cell type touchscreen panel in which a liquid crystal display panel of a lateral field mode (e.g., FFS mode) is used. Although the touchscreen panel in the illustrated example has a touch sensor under the mutual capacitance method, it may alternatively have a touch sensor under the self-capacitance method.

FIG. 1A and FIG. 1B are an upper plan view and a cross-sectional view of a touchscreen panel 1001 according to the first embodiment, respectively. FIG. 1B shows a cross section taken along line Ib-Ib' in FIG. 1A.

The touchscreen panel 1001 has a displaying region DR and a peripheral region FR that is located around the displaying region DR. Although not shown, the displaying region DR includes a plurality of gate bus lines extending substantially in parallel to the x direction (first direction), a plurality of source bus lines extending substantially in parallel to the y direction (second direction), and a plurality of pixels (not shown) arranged in a two-dimensional array along the x direction and along the y direction. The y direction is a direction which intersects the x direction, and may be orthogonal to the x direction.

The displaying region DR further includes a plurality of touch detection units TU arranged in a two-dimensional array. In the example shown, the touch detection units TU are arranged in a two-dimensional array along the x direction and along the y direction. Each touch detection unit TU may be disposed so as to correspond to two or more pixels (not shown), for example.

On the other hand, in the peripheral region FR, peripheral circuitry including driving circuits, terminal portions, and the like are provided. In the peripheral region FR, a semiconductor chip 120 including some or all driving circuits may be mounted. Although not shown, the driving circuits include a gate driver, a source driver, a scan driver, and a detection driver. These driving circuits are provided (mounted or integrally formed) on an active matrix substrate 101, for example.

The touchscreen panel 1001 includes an active matrix substrate 101, a counter substrate 201 opposed to the active matrix substrate 101, and a liquid crystal layer CL that is provided between the active matrix substrate 101 and the counter substrate 201. The liquid crystal layer CL is sealed between the active matrix substrate 101 and the counter substrate 201 by a sealer 110.

The touchscreen panel 1001 includes pairs of electrodes for applying voltage across the liquid crystal layer CL and pairs of electrodes for touch sensing. In this example, as electrodes for applying voltage across the liquid crystal layer CL, a plurality of pixel electrodes PE and a common electrode CE are provided on the active matrix substrate 101. As the electrodes for touch sensing, transmitter electrodes TX(1) to TX(M) (which may hereinafter be abbreviated as "transmitter electrodes TX"), which are transmission-side electrodes of the touch sensor, and receiver electrodes RX(1) to RX(N), which are reception-side electrodes of the touch sensor (which may hereinafter be abbreviated as "receiver electrodes RX"), are provided. Typically, regarding the active matrix substrate 101 and the counter substrate 201, the receiver electrodes RX are provided on the substrate that is disposed on the viewer's side, whereas the transmitter electrodes TX are provided on the substrate that are disposed on the non-viewer's side. As viewed from the normal direction of the touchscreen panel 1001, each portion at which a transmitter electrode TX and a receiver electrode RX intersect respectively defines a touch detection unit TU. Herein, the common electrode CE of the active matrix substrate 101 is allowed also to function as the transmitter electrodes TX.

The active matrix substrate 101 includes: a substrate (e.g., a glass substrate) 1; and a common electrode CE and a plurality of pixel electrodes PE that are formed on the liquid crystal layer CL side of the substrate 1. The pixel electrodes PE and the common electrode CE are disposed with a dielectric layer interposed between. Although FIG. 1 illustrates that the pixel electrodes PE are disposed on the liquid crystal layer CL side of the common electrode CE, they may be disposed on the substrate 1 side of the common electrode CE. The pixel electrodes PE are electrically independent from pixel to pixel. The common electrode CE includes a plurality of common electrode subportions CEa that are arranged with interspaces CEg therebetween. The common electrode subportions CEa may be disposed so as to correspond to the plurality of pixels. In this example, the common electrode subportions CEa, extending along the x direction, are arranged along the y direction with interspaces CEg therebetween. Each common electrode subportion CEa serves also as a transmitter electrode TX. Each common electrode subportion CEa is connected to a scan driver not shown, via a touch sensor-driving line TXL. The scan drivers may be disposed on the semiconductor chip 120, for example.

The counter substrate 201 includes a substrate (e.g., a glass substrate) 21 and a plurality of receiver electrodes RX formed on the liquid crystal layer CL side of the substrate 21. In this example, the receiver electrodes RX, extending along the y direction, are arranged along the x direction with interspaces therebetween. The receiver electrodes RX may be disposed so as to correspond to the plurality of pixels. Each receiver electrode RX is connected to a detection driver via a touch sensor-detection line RXL. The detection driver may be disposed on the semiconductor chip 120, for example. Each receiver electrode RX may be, in the peripheral region FR, electrically connected to the active matrix substrate 101 via a contact pillar 130 that is disposed between the active matrix substrate 101 and the counter substrate 201.

In the example shown in FIG. 1, the common electrode subportions CEa (transmitter electrodes TX) each extend along the x direction, and the receiver electrodes RX each extend along the y direction; however, each common electrode subportion CEa may extend along the y direction, and each receiver electrode RX may extend along the x direction.

In the illustrated example, the touchscreen panel 1001 has a touch sensor under the mutual capacitance method; alternatively, it may have a touch sensor under the self-capacitance method. In this case, the plurality of common electrode subportions CEa of the common electrode CE are respectively disposed for the corresponding touch detection units TU, and function as electrodes for detecting self-capacitance. Each common electrode subportion CEa is electrically connected to a driver via a wiring line for touch sensing. The specific structure, the driving method, etc., of a touch sensor under the mutual capacitance method or the self-capacitance method are known from Japanese Laid-Open Patent Publication No. 2018-5484 and the like, and therefore any detailed description thereof is omitted. The entire disclosure of Japanese Laid-Open Patent Publication No. 2018-5484 is incorporated herein by reference.

In the present specification, the electrodes for touch sensing (transmitter electrodes TX, electrodes for detecting self-capacitance, etc., that are formed on the active matrix substrate 101) are simply referred to as "sensor electrodes" or "first electrodes", whereas wiring lines for touch sensing that are electrically connected to the sensor electrodes are referred to as "touch wiring lines" or "first wiring lines".

<Structure of a Pixel Region PIX in the Active Matrix Substrate 101>

Next, the structure of a pixel region PIX of the active matrix substrate 101 will be described. A "pixel region PIX" is a region corresponding to each pixel of the touchscreen panel 1001, and may simply be referred to as a "pixel".

Figure 2B:
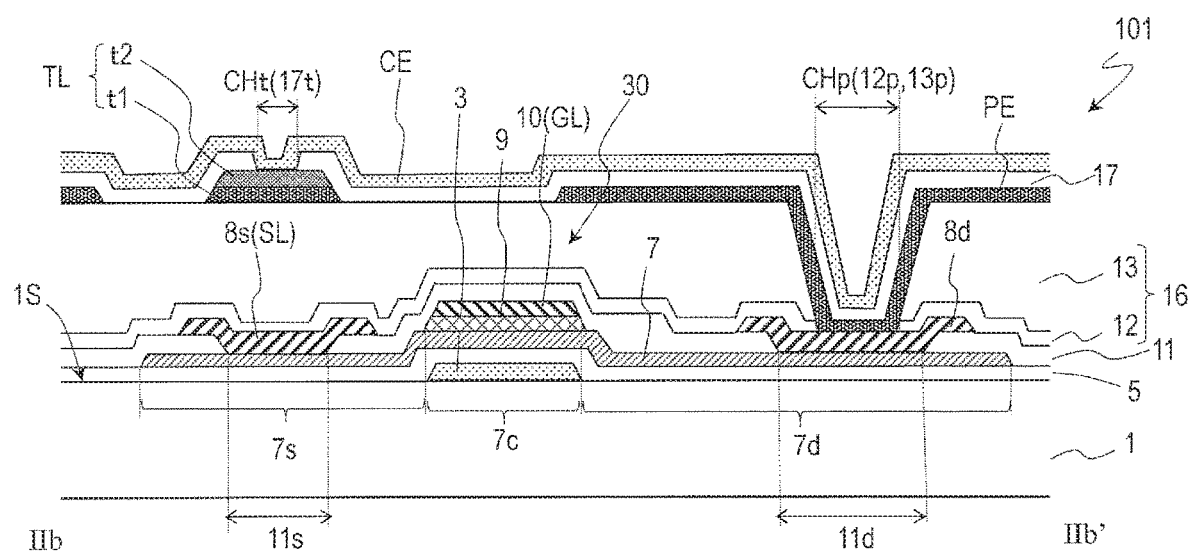
FIG. 2B A cross-sectional view showing a portion of a pixel region of the active matrix substrate 101.

FIG. 2A is an enlarged plan view showing a portion of the displaying region DR of the active matrix substrate 101, and FIG. 2B is a cross-sectional view taken along line IIb-IIb' shown in FIG. 2A.

The displaying region DR of the active matrix substrate 101 includes gate bus lines GL extending along the x direction, source bus lines SL extending along the y direction, and a plurality of pixel regions PIX arranged in a matrix shape along the x direction and along the y direction. The pixel regions PIX are regions corresponding to the pixels on the touchscreen panel 1001. In this example, each pixel region PIX is defined by gate bus lines GL and source bus lines SL.

Each pixel region PIX includes a TFT 30 which is supported on the substrate 1, a pixel electrode PE, and the common electrode CE. The common electrode CE has at least one slit or recess for each pixel.

The TFTs 30 are top-gate type TFTs, for example. In this example, each TFT 30 includes an oxide semiconductor layer 7 that is disposed on a principal face 1S of the substrate 1, a gate electrode 10 that is disposed on a portion of the oxide semiconductor layer 7 via a gate insulating layer 9, and a source electrode 8s and a drain electrode 8d. As viewed from the normal direction of the substrate 1, the oxide semiconductor layer 7 includes a channel region 7c that overlaps the gate electrode 10, and a first region 7s and a second region 7d that are respectively disposed on opposite sides of the channel region 7c. The first region 7s and the second region 7d may be low-resistance regions having a smaller specific resistance than does the channel region 7c.

On the substrate 1 side of the oxide semiconductor layer 7, a light shielding layer 3 may be further provided which is disposed via the lower insulating layer 5. As viewed from the normal direction of the principal face 1S of the substrate 1, the light shielding layer 3 is disposed so as to at least partially overlap the channel region 7c, and has the function of blocking light which heads from the backlight side toward the channel region 7c. Note that the light shielding layer 3 may be connected to a fixed potential.

On the oxide semiconductor layer 7, the gate insulating layer 9, and the gate electrode 10, an upper insulating layer 11 is disposed. The source electrode 8s is disposed on the upper insulating layer 11 and also within an aperture (source-side aperture) 11s that is made in the upper insulating layer 11, and within the source-side aperture 11s is electrically connected to a portion of the oxide semiconductor layer 7 (e.g., a portion of the first region 7s in this example). Similarly, the drain electrode 8d is disposed on the upper insulating layer 11 and also within an aperture (drain-side aperture) 11d that is made in the upper insulating layer 11, and within the drain-side aperture 11d is electrically connected to another portion of the oxide semiconductor layer 7 (e.g., a portion of the second region 7d in this example). The source electrode 8s and the drain electrode 8d may each be directly in contact with the oxide semiconductor layer 7. In the present specification, the connecting portion between the source electrode 8s and the first region 7s is referred to as a "source contact portion", whereas a connecting portion between the drain electrode 8d and the second region 7d is referred to as a "drain contact portion".

The gate electrode 10 is electrically connected to a corresponding gate bus line GL, whereas the source electrode 8s is electrically connected to a corresponding source bus line SL. The gate electrode 10 may be formed in the same layer (gate metal layer) as the gate bus lines GL, while the source electrode 8s and the drain electrode 8d may be formed in the same layer (source metal layer) as the source bus lines SL. The drain electrode 8d is electrically connected to the pixel electrode PE. In the present specification, the connecting portion between the drain electrode 8d and the pixel electrode PE is referred to as a "pixel contact portion" or a "first contact portion". In this example, at the pixel contact portion, the drain electrode 8d and the pixel electrode PE are connected within an aperture (hereinafter a "first contact hole") CHp that is made in the insulating layer which is interposed between them.

The TFTs 30 are covered by an interlayer insulating layer 16. The interlayer insulating layer 16 may include an organic insulating layer 13. The organic insulating layer 13 may have a thickness for being able to function as a planarization film (e.g. 1 μm or more). The interlayer insulating layer 16 may have a multilayer structure including, for example, an inorganic insulating layer 12 and the organic insulating layer 13 that is disposed on the inorganic insulating layer 12.

On the interlayer insulating layer 16, the plurality of pixel electrodes PE are disposed. On the pixel electrodes PE, the common electrode CE is disposed via a dielectric layer (also referred to as a "first dielectric layer") 17. In other words, the pixel electrodes PE are located between the common electrode CE and the interlayer insulating layer 16.

In the present specification, any layer that is made of the same transparent electrically conductive film as the pixel electrodes PE may be referred to as a pixel electrode layer, whereas any layer that is made of the same transparent electrically conductive film as the common electrode CE may be referred to as a common electrode layer. Moreover, among these electrode layers, any layer that is located on the substrate 1 side may be referred to as a "first transparent electrode layer", whereas any layer that is located on the first transparent electrode layer may be referred to as a "second transparent electrode layer". In the present embodiment, the first transparent electrode layer is a pixel electrode layer that includes the pixel electrodes PE, while the second transparent electrode layer is a common electrode layer that includes the common electrode CE; alternatively, the first transparent electrode layer may include the common electrode CE, while the second transparent electrode layer may include the pixel electrodes PE. The transparent electrode(s) made in the second transparent electrode layer has a slit 19s or recess for each pixel.

The pixel electrodes PE are separated from pixel to pixel. Each pixel electrode PE is electrically connected to the drain electrode 8d of the TFT 30. In this example, the pixel electrode PE is in contact with the drain electrode 8d, within the first contact hole CHp being made in the interlayer insulating layer 16 and the first dielectric layer 17.

The common electrode CE does not need to be separated from pixel to pixel. In the present embodiment, the common electrode CE is divided into the plurality of common electrode subportions CEa, such that each common electrode subportion CEa functions as a first electrode for touch sensing (hereinafter a "sensor electrode").

In the displaying region DR, a plurality of first wiring lines for touch sensing (hereinafter "touch wiring lines") TL are also disposed. At least one touch wiring line TL may be provided for each common electrode subportion CEa, rather than having to be provided in every pixel region PIX. In the present specification, any layer that is made of the same electrically conductive film (typically a metal film) as the touch wiring lines TL (or, in the case where the touch wiring lines TL have a multilayer structure, at least one layer thereof) is referred to as a "touch wiring layer".

Each touch wiring line TL is electrically connected to a corresponding common electrode subportion CEa. In the present specification, the connecting portion between a touch wiring line TL and a common electrode subportion CEa is referred to as a "touch wiring contact portion" or a "second contact portion". In this example, in a touch wiring contact portion, the touch wiring line TL and the common electrode subportion CEa are connected within an aperture (hereinafter a "second contact hole") CHt that is made in an insulator which is interposed between them. In this example, the second contact hole CHt is an aperture 17t that is made in the dielectric layer 17. At least one touch wiring contact portion may be provided for one common electrode subportion CEa. Preferably, two or more touch wiring contact portions are provided for one common electrode subportion CEa.

Each touch wiring line TL may extend to a corresponding common electrode subportion CEa, along e.g. the y direction. In this example, as viewed from the normal direction of the active matrix substrate 101, each touch wiring line TL extends on one of the plurality of source bus lines SL, in a manner of following along that source bus line SL.

Moreover, in the example shown, each touch wiring line TL has a multilayer structure including a lower wiring portion t1 that is made of the same transparent electrically conductive film as the pixel electrodes PE (e.g., in the first transparent electrode layer herein) and an upper wiring portion t2 that is in contact with an upper face of the lower wiring portion t1. The upper wiring portion t2 is made of a metal film (so as to be in the touch wiring layer). No insulating layer is provided between the lower wiring portion t1 and the upper wiring portion t2. In other words, after a first transparent electrode layer including the lower wiring portions t1 of the touch wiring lines TL is formed, with no intervening step of forming an insulating layer, the touch wiring layer including the upper wiring portions is of the touch wiring lines TL is formed. This can reduce the number of insulating films in which the second contact hole CHt needs to be made, and allows the resistance of the touch wiring lines TL to be decreased. As viewed from the normal direction of the substrate 1, a side surface of the lower wiring portion t1 may be aligned with a side surface of the upper wiring portion t2. Moreover, the lower wiring portion t1 and the upper wiring portion t2 may have substantially the same width as that of the source bus line SL.

In the present embodiment, as viewed from the normal direction of the substrate 1, the pixel contact portion is disposed so as to at least partially overlap the drain-side aperture 11d of the drain contact portion. In other words, a bottom face of the first contact hole CHp of the pixel contact portion and a bottom face of the drain-side aperture 11d at least partially overlap. Moreover, the touch wiring contact portion is disposed so as to at least partially overlap the source-side aperture of the source contact portion. In other words, a bottom face of the second contact hole CHt of the touch wiring contact portion and a bottom face of the source-side aperture 11s at least partially overlap. In the present specification, a "bottom face" of a contact hole or an aperture means a portion of an upper face of the underlying electrically conductive layer that is exposed through the contact hole or aperture to serve as a connection surface.

In the displaying region DR of the active matrix substrate 101, any region where the drain contact portion, the source contact portion, the pixel contact portion, or the touch wiring contact portion are formed is a region where light from the backlight may be blocked, or alignment of the liquid crystal molecules may be disturbed, and thus is a region that does not contribute to light transmittance. Any such region that does not contribute to light transmittance is usually to be shaded by a black matrix, etc., that is provided on the counter substrate. Therefore, as viewed from the normal direction of the substrate 1, by disposing the pixel contact portion and the drain contact portion so as to at least partially overlap, and disposing the touch wiring contact portion and the source contact portion so as to at least partially overlap, such these regions which do not contribute to light transmittance are overlaid on one another, it becomes possible to suppress a decrease in the pixel aperture ratio (i.e., an areal ratio of the region of a pixel that contributes to light transmittance) that is associated with the contact portions.

Between the source contact portion and the touch wiring contact portion, the organic insulating layer 13, which is relatively thick and may function as a planarization film, may be interposed. This will ensure that, even if the source contact portion and the touch wiring contact portion are overlaid, these contact portions are less likely to interfere with each other. Moreover, since the level difference associated with the drain-side aperture 11d is reduced by the organic insulating layer 13, even if the second contact hole CHt is overlaid on the drain-side aperture 11d, insufficiencies due to the influence of the level difference of the drain-side aperture 11d are unlikely to occur. Therefore, the reliability of these contact portions can be enhanced. Furthermore, by disposing the touch wiring lines TL and the source bus lines SL so as to be overlaid on one another via the relatively thick organic insulating layer 13, a decrease in the pixel aperture ratio associated with the touch wiring lines TL can be reduced while suppressing an increase in capacitance.

Figure 3C:
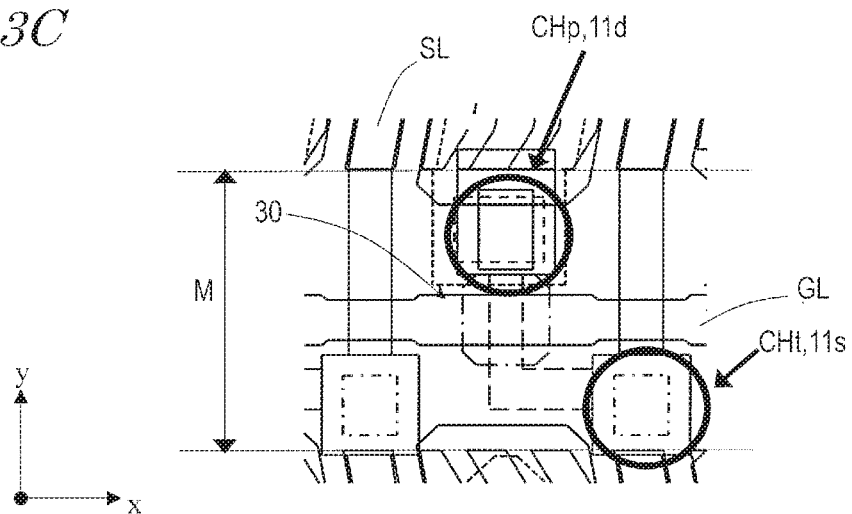
FIG. 3C A plan view showing an arrangement of contact portions according to Example 1.

FIG. 3A and FIG. 3B are plan views showing arrangements of contact portions in the active matrix substrates of Reference Example 1 and Reference Example 2, respectively, and FIG. 3C is a plan view showing an arrangement of contact portions in the active matrix substrate of Example 1. For simplicity, similar component elements to those in FIG. 2A and FIG. 2B are denoted by identical numbers.

In the active matrix substrate of Reference Example 1, touch wiring lines TL are formed on the substrate 1 side of the planarization film 13. In Reference Example 1, in the touch wiring contact portions, the second contact holes CHt are formed in the relatively thick planarization film 13; therefore, the touch wiring contact portions will increase in size. Moreover, if a misalignment occurs in a step of forming the second contact holes CHt in the planarization film 13, the insulating layer (corresponding to the inorganic insulating layer 12) between the touch wiring lines TL and the source bus lines may also become etched. This will result in a leakage between the source bus lines and the common electrode CE. If the pixel design is made so as to suppress such leakage, it becomes possible to overlay the touch wiring contact portions on the source bus lines. Particularly when it is used for a high-resolution panel with a small pixel size, the touch wiring contact portion, the pixel contact portion, and the source contact portion are arranged side by side along the y direction as viewed from the normal direction of the substrate 1. The need to shade these contact portions increases the range (light-shielding range) M within the pixel region that needs shading, whereby the pixel aperture ratio will be lowered.

In the active matrix substrate of Reference Example 2, the touch wiring lines TL are formed on the interlayer insulating layer 16. In Reference Example 2, similar to Reference Example 1, the pixel contact portion is disposed so as to overlap the drain contact portion, but the touch wiring contact portion is disposed in a different position from the source contact portion. However, the interlayer insulating layer 16 being present between the touch wiring lines TL and the source metal layer allows each touch wiring contact portion to be disposed on the source bus line SL, whereby the pixel aperture ratio is improved over Reference Example 1. However, since the contact portions are disposed in three places, as viewed from the normal direction of the principal face 1S of the substrate 1, if adequate interspaces were to be secured between the electrodes and the wiring lines, it might not be possible to make the light-shielding range M sufficiently small.

On the other hand, in Example 1, the touch wiring contact portion and the source contact portion are disposed so as to overlap each other, and thus the width of the light-shielding range M can be made smaller than in Reference Examples 1 and 2, whereby a decrease in the pixel aperture ratio associated with the contact portions can be suppressed.

Examples of pixel aperture ratios in Reference Example 1, Reference Example 2, and Example 1 are indicated in Table 1. Table 1 shows the pixel aperture ratio (%) in the case where each pixel has a width of 25 μm along the x direction and a width of 75 μm along the y direction, as well as a ratio (ratio between pixel aperture ratios) relative to the pixel aperture ratio of Reference Example 1.

TABLE 1

|  | Reference Example 1 | Reference Example 2 | Example 1 |
|---|---|---|---|
| pixel aperture ratio (%) | 33.01 | 35.55 | 42.32 |
| ratio between pixel aperture ratios relative to Reference Example 1 [—] | 100.0 | 107.7 | 128.2 |

It can be seen from Table 1 that the pixel aperture ratio of Example 1 is substantially 30% higher than that of Reference Example 1. Since transmittance with respect to visible light is determined by the pixel aperture ratio, this confirms that optimizing the arrangement of contact portions can greatly improve the transmittance of a high-resolution liquid crystal display panel.

As shown in Example 1 (FIG. 3C) and FIG. 2A, as viewed from the normal direction of the substrate 1, the source contact portion (source-side aperture 11s) and the touch wiring contact portion (second contact hole CHt) may overlap one of the source bus lines SL. As a result of this, the pixel aperture ratio can be further increased.

Moreover, each of the pixel contact portion, the touch wiring contact portion, the drain contact portion, and the source contact portion (i.e., the bottom faces of the first contact hole CHp, the second contact hole CHt, the drain-side aperture 11d, and the source-side aperture 11s) needs to overlap neither the gate bus lines GL nor the gate electrode 10 as viewed from the normal direction of the substrate 1. As a result, while reducing the capacitance between the gate metal layer and the source metal layer, the pixel aperture ratio can be improved. Conventionally, disposing the four aforementioned contact portions so as to not to overlap the gate bus lines GL may have led to a significant increase in the light-shielding range M owing to the contact portions. However, the arrangement of contact portions according to the present embodiment can more effectively suppress the decrease in the pixel aperture ratio.

The pixel contact portion and the drain contact portion may be disposed in a given pixel, i.e., the pixel PIX(1) in which the pixel electrode PE that is connected to the TFT 30 at the pixel contact portion, while the source contact portion and the touch wiring contact portion may be disposed in another pixel (i.e., an adjacent pixel along the y direction) PIX(2) that is adjacent to that pixel. As shown in the figure, as viewed from the normal direction of the substrate 1, the pixel contact portion and drain contact portion, and the source contact portion and touch wiring contact portion, may be disposed on opposite sides of the gate bus line GL. This allows the width of the light-shielding range M to be further decreased.

The arrangement of contact portions according to the present embodiment may be broadly applicable to active matrix substrates in which TFTs having a source-side aperture and a drain-side aperture are used as the pixel TFTs. The pixel TFTs may be top-gate structured TFTs, or bottom-gate structured TFTs of an etchstop type. In particular, those active matrix substrates in which top-gate structured TFTs are used are suitable.

In a top-gate structured TFT, as illustrated in FIG. 2B, it is preferable that the source electrode 8s and the drain electrode 8d are connected to the upper face of the oxide semiconductor layer 7 within the source-side aperture 11s and the drain-side aperture 11d that are made in an insulator, and that, as viewed from the normal direction of the substrate 1, the gate electrode 10 overlaps neither the source electrode 8s nor the drain electrode 8d. This allows the parasitic capacitance between the gate electrode 10 and the source electrode 8s and drain electrode 8d to be reduced. Note that, in a conventional active matrix substrate in which TFTs of such structure are used as the pixel TFTs, the source contact portion and the drain contact portion would be disposed at an interspace from the gate bus line GL (gate electrode 10), and further also the pixel contact portion and the touch wiring contact portion would be disposed in addition to these contact portions, so that light-shielding range M would become particularly large owing to the contact portions. Thus, by applying the arrangement of contact portions according to the present embodiment to an active matrix substrate having the TFTs of the above structure, more outstanding effects can be obtained.

On the other hand, in the case where bottom-gate structured TFTs are used as the pixel TFTs, in order to utilize the gate electrodes also as a light shielding film and to reduce the pixel aperture ratio, a construction in which the width of the gate bus lines GL is increased so as to allow bottom-gate structured TFTs to be disposed upon the gate bus lines GL is desirable. However, with this construction, the intersections between the gate bus lines GL and the source bus lines SL will have an increased geometric area and thus an increased capacitance will result, whereby the load on the source bus lines SL will increase. On the other hand, when a top-gate structured TFT is used, neither a light shielding film nor a contact portion needs to be disposed at each intersection between the gate bus line GL and the source bus line SL, so that the geometric area of the intersection can be made e.g. less than ⅕. As a result, the load on the bus lines can be reduced as compared to the case of using bottom-gate structured TFTs.

In the case where the respective geometric areas of the touch wiring contact portion and the source contact portion are fixed, as the overlapping area between these contact portions increases, the region to be shaded can be decreased, thus allowing the pixel aperture ratio to be more effectively increased. As used herein, the "overlapping area" refers to, as viewed from the normal direction of the substrate 1, the geometric area Sr of a region in which the bottom face of the second contact hole CHt in the touch wiring contact portion and the bottom face of the source-side aperture 11s in the source contact portion overlap. The "region to be shaded" refers to, as viewed from the normal direction of the substrate 1, the region (hereinafter "contact region") in which at least either one of the second contact hole CHt in the touch wiring contact portion and the source-side aperture 11s in the source contact portion exists.

Figure 4:
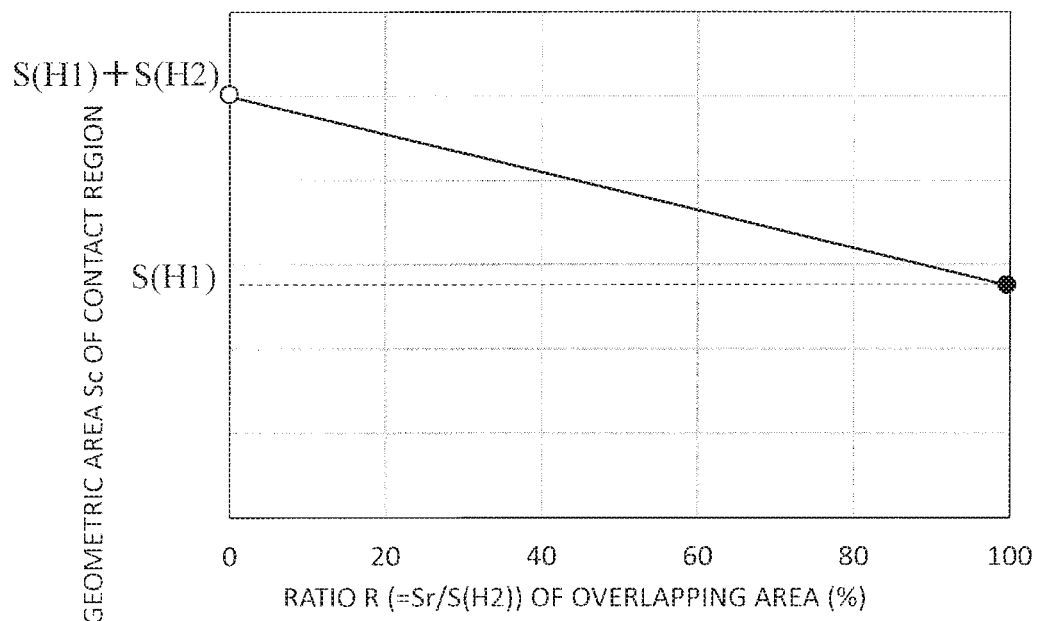
FIG. 4 A diagram showing a ratio R of overlapping area between a second contact hole CHt in a touch wiring contact portion and a source-side aperture 11s in a source contact portion.

Now, regarding the source-side aperture 11s and the second contact hole CHt, the one having a larger bottom face will be referred to as the first aperture H1, and the one having a smaller bottom face as the second aperture H2, and also assume that the bottom faces of the first aperture H1 and the second aperture H2 have geometric areas S(H1) and S(H2). Also, a ratio R of the overlapping area Sr of the smaller second aperture H2 to the geometric area S(H2) will be referred to as a "ratio of overlapping area". As schematically shown in FIG. 4, as the ratio R of overlapping area increases, the geometric area Sc of the contact region can be decreased. Specifically, given the fixed geometric areas S(H1) and S(H2), as viewed from the normal direction of the principal face 1S of the substrate 1, the geometric area Sc of the contact region will have the minimum value when the second aperture H2 is disposed inside the first aperture H1 (ratio R of overlapping area: 100%), thus becoming equal to the geometric area S(H1) of the first aperture H1 (Sc=S (H1)). As the position of the second aperture H2 is shifted from the first aperture H1 so that the overlapping area Sr is decreased (i.e., the ratio R of overlapping area is decreased), the geometric area Sc of the contact region will increase. However, the geometric area Sc of the contact region will be less than a sum of the geometric areas of the bottom faces of the first aperture H1 and the second aperture H2 (Sc<S (H1)+S(H2)).

In the present embodiment, the ratio R of overlapping area is not less than 30% and not more than 100%, and preferably may be not less than 50% and not more than 100%, for example. When it is 30% or more, a decrease in the pixel aperture ratio associated with the touch wiring contact portions can be suppressed with more certainty.

The entire bottom faces of the second contact hole CHt and the source-side aperture 11s may, as viewed from the normal direction of the principal face 1S of the substrate 1, overlap the source electrode 8s (or, a source conducting portion that includes the source electrode 8s and the source bus line SL that is integrally formed with the source electrode 8s). By increasing the overlapping area Sr, the second contact hole CHt and the source-side aperture 11s can be disposed on the source electrode 8s, without allowing the size of the source electrode 8s to increase.

While the ratio R of overlapping area between the source-side aperture 11s and the second contact hole CHt has been described above, a ratio R of overlapping area between the drain-side aperture 11d and the first contact hole CHp may also be not less than 30% and not more than 100%, and preferably not less than 50% and not more than 100%, for example.

Next, with reference to the drawings, the relative positioning between the touch wiring contact portion and the source contact portion will be described more specifically.

FIG. 5A to FIG. 5D are each a plan view showing relative positioning between the second contact hole CHt in the touch wiring contact portion and the source-side aperture 11s in the source contact portion. In all of these examples, as viewed from the normal direction of the principal face 1S of the substrate 1, the source-side aperture 11s and the second contact hole CHt are disposed inside a source conducting portion that includes the source electrode 8s and one source bus line that is integrally formed with the source electrode 8s.

Figure 5A:
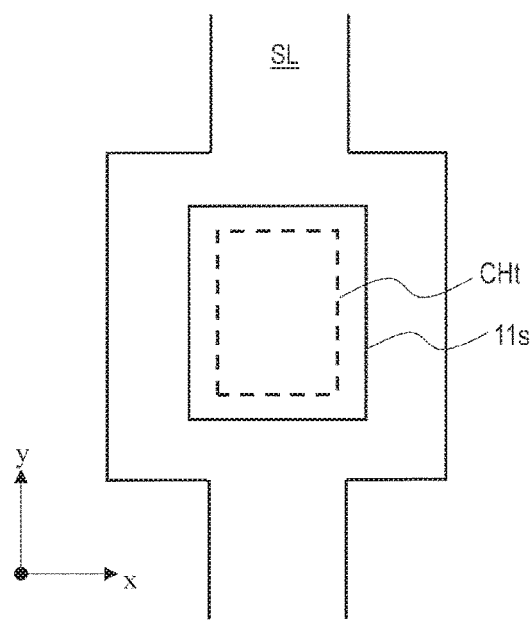
FIG. 5A A plan view illustrating a relative positioning between a second contact hole CHt and a source-side aperture 11s.

As shown in FIG. 5A, as viewed from the normal direction of the substrate 1, the second contact hole CHt may be located inside the source-side aperture 11s. In this case, the geometric area Sc of the first contact region is equal to the geometric area of the bottom face of the source-side aperture 11s. The ratio R of overlapping area is 100%.

When a contact failure between the source electrode 8s and the oxide semiconductor layer 7 occurs, an insufficiency of the liquid crystal display panel will result; therefore, the source contact portion is expected to have stability. For this reason, the size of the source-side aperture 11s is preferably large. On the other hand, two or more touch wiring contact portions are usually provided for one sensor electrode (common electrode subportion CEa). Because of this redundant structure, even if a contact failure occurs in one place between the touch wiring line TL and the sensor electrode, driving of the touch sensor often does not have a problem. From a design perspective, in some cases, the width of the second contact hole CHt may preferably be similar to the width of the touch wiring line TL or smaller. Therefore, as shown in FIG. 5A, the second contact hole CHt may be made smaller in size than the source-side aperture 11s so that the second contact hole CHt may be disposed inside the source-side aperture 11s, thus allowing the pixel aperture ratio to be enhanced while providing stability of the source contact portion.

Figure 5B:
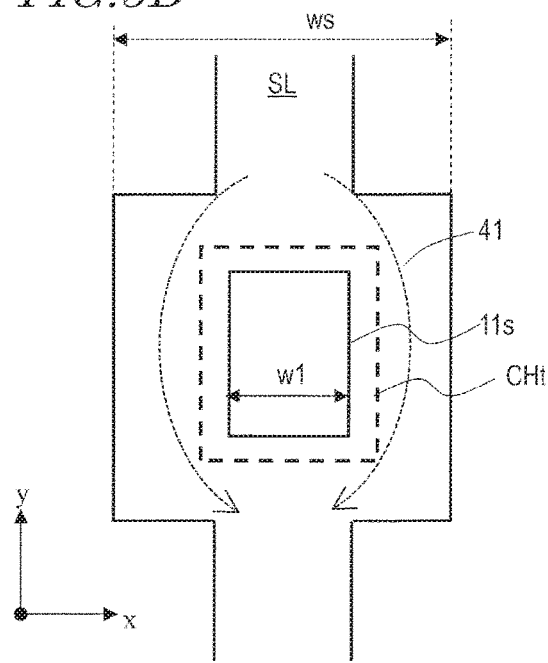
FIG. 5B A plan view illustrating another relative positioning between a second contact hole CHt and a source-side aperture 11s.

Alternatively, as shown in FIG. 5B, the source-side aperture 11s may be located inside the second contact hole CHt, as viewed from the normal direction of the substrate 1. In this case, the geometric area Sc of the first contact region is equal to the geometric area of the bottom face of the second contact hole CHt. The ratio R of overlapping area is 100%.

In the case where a portion of the source bus line SL is to function as the source electrode 8s, the source-side aperture 11s is to be made in the source bus line SL. In this case, if the source-side aperture 11s has a taper insufficiency, the contact resistance between the source electrode 8s and the oxide semiconductor layer 7 may increase, or the wiring resistance of the source bus lines SL may increase. On the other hand, as shown in FIG. 5B, when the width (width along the x direction) w1 of the source-side aperture 11s is made sufficiently small relative to the width ws of the region of the source bus line SL that defines the source-side aperture 11s (i.e., the width of the source electrode 8s along the x direction), current paths as indicated by an arrow 41 can be obtained even in the presence of a taper insufficiency. The width w1 of the source-side aperture 11s may be e.g. ⅓ or less, or ¼ or less of the width ws of the source electrode 8s. Moreover, in the case where the width w1 of the source-side aperture 11s is to be kept small, as viewed from the normal direction of the substrate 1, the entire second contact hole CHt may be disposed so as to overlap the source conducting portion and the source-side aperture 11s may be disposed inside the second contact hole CHt, whereby the pixel aperture ratio can be improved more effectively.

Figure 5C:
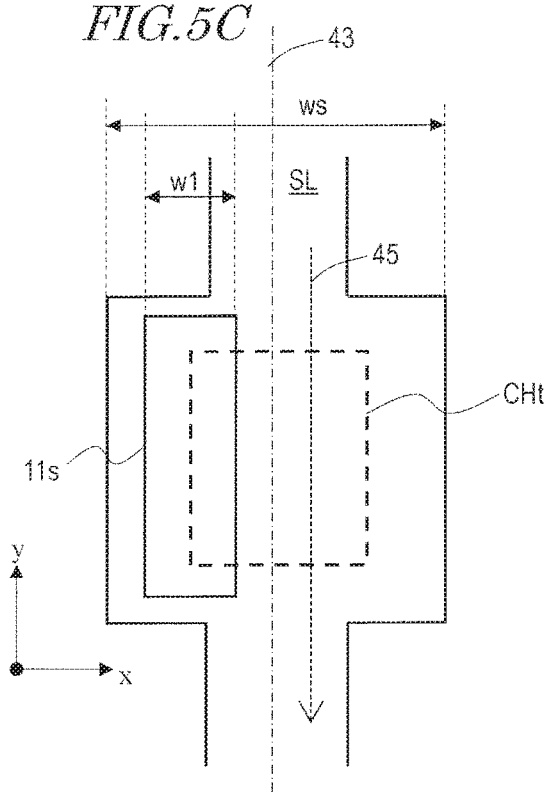
FIG. 5C A plan view illustrating still another relative positioning between a second contact hole CHt and a source-side aperture 11s.

In the example shown in FIG. 5C, as viewed from the normal direction of the principal face 1S of the substrate 1, inside the source conducting portion, the source-side aperture 11s is disposed only on one side of a median line 43 of the source bus lines SL (e.g., on the left side herein). The median line 43 is a line that equally divides the width of the source bus line into two (along the y direction). As a result of this, even if the source-side aperture 11s has a taper insufficiency, a current path as indicated by arrow 45 can be obtained. The width w1 of the source-side aperture 11s may be sufficiently small relative to the width ws of the source electrode 8s. For example, the width w1 of the source-side aperture 11s may be e.g. ⅓ or less, or ¼ or less, of the width ws of the source electrode 8s (or the source conducting portion). On the other hand, the second contact hole CHt may be disposed inside the source conducting portion, so as to overlap the median line 43. Only one end (e.g., the left end herein) of the second contact hole CHt overlaps the source-side aperture 11s. The ratio R of overlapping area may be not less than 30% but less than 100%, and preferably not less than 40% and not more than 80%, for example.

The source-side aperture 11s may extend so as to traverse one end (i.e., the left end in the example shown) of the second contact hole CHt along the y direction, for example. Thus, while allowing a geometric area for the source-side aperture 11s, increase in the resistance of the source bus lines SL can be suppressed, and furthermore the pixel aperture ratio can be improved more effectively.

Figure 5D:
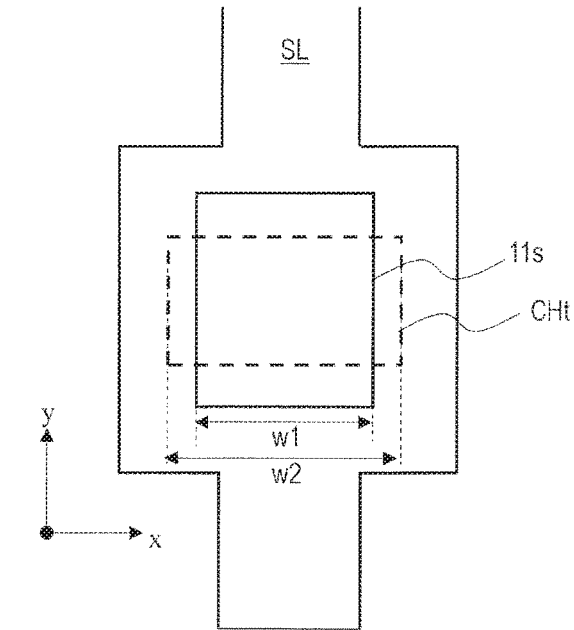
FIG. 5D A plan view illustrating still another relative positioning between a second contact hole CHt and a source-side aperture 11s.

As shown in FIG. 5D, as viewed from the normal direction of the substrate 1, the source-side aperture 11s and the second contact hole CHt may be disposed both so as to overlap the source conducting portion, and to intersect each other (i.e., traverse each other). The ratio R of overlapping area in this case may be not less than 50% and not more than 90%, for example.

For example, the width w2 of the second contact hole CHt along the x direction may be greater than the width w1 of the source-side aperture 11s along the x direction. As shown in the figure, the source-side aperture 11s may have a shape which is longer along the y direction, while the second contact hole CHt may have a shape which is longer along the x direction. By reducing the width w1 of the source-side aperture 11s, even if the source-side aperture 11s has a taper insufficiency, current paths are likely to be obtained along the y direction. As for the second contact hole CHt, the touch wiring line TL (not shown) is to be connected to the common electrode CE (common electrode subportion CEa), and this connecting portion is likely to have a larger geometric area than does the source conducting portion, and the touch wiring contact portion has a redundant structure such that two or more of them are provided for one common electrode subportion CEa; therefore, unlike for the source contact portion, considerations do not need to be given to the shape or arrangement of the contact hole in order to secure current paths. Therefore, by increasing the width w2 of the second contact hole CHt along the x direction (e.g., by making the width w2 greater than the width (not shown) of the touch wiring line TL), a more stable source line contact portion can be created. Moreover, with this construction, since the planar shapes of the source-side aperture 11s and the second contact hole CHt are differed, there is an advantage in that insufficiencies are easier to detect through an image check or the like for the active matrix substrate.

<Method for Manufacturing the Active Matrix Substrate 101>

Hereinafter, with reference to FIG. 6A to FIG. 6K and FIG. 7, a method for manufacturing the active matrix substrate 101 will be described.

FIG. 6A to FIG. 6K are step-by-step cross-sectional views showing an exemplary method for manufacturing the active matrix substrate 101. FIG. 7 is a flowchart showing an exemplary method for manufacturing the active matrix substrate 101.

STEP 1-1 to STEP 1-3

Figure 6A:
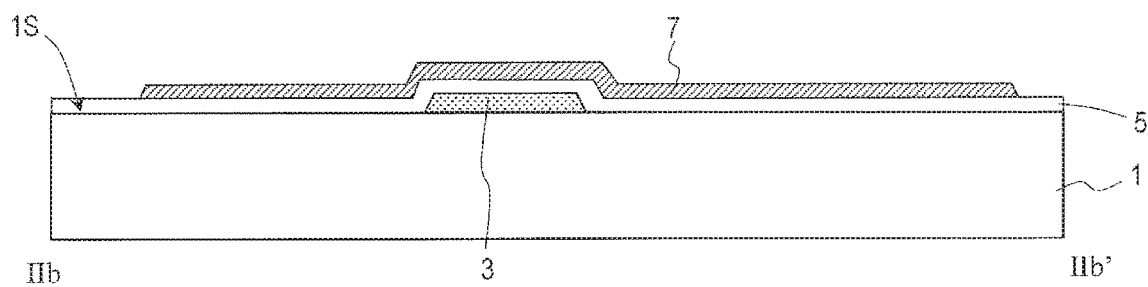
FIG. 6A A step-by-step cross-sectional view showing an exemplary method for manufacturing the active matrix substrate 101.
Figure 7:
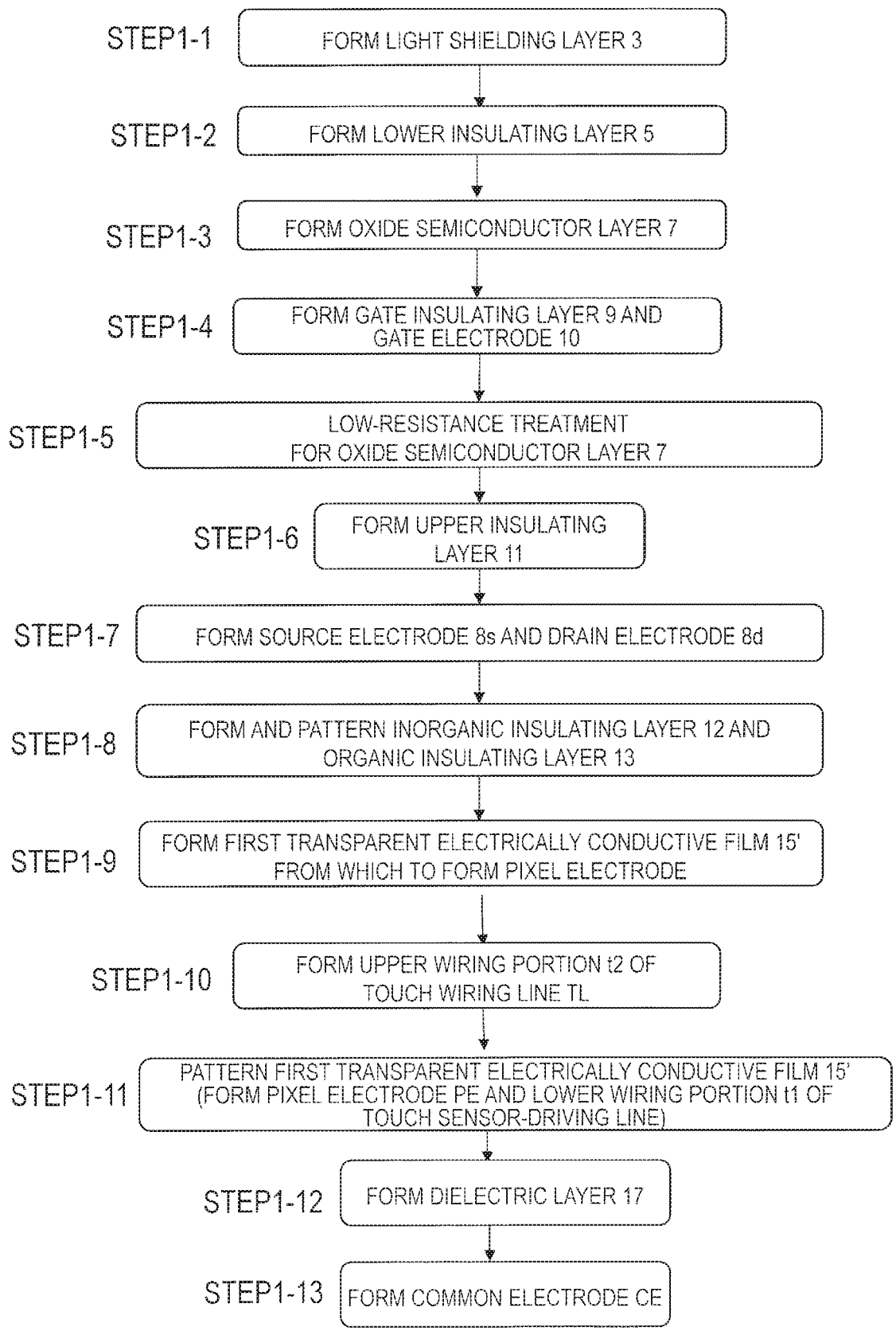
FIG. 7 A flowchart showing an exemplary method for manufacturing the active matrix substrate 101.

As shown in FIG. 6A, on a substrate 1, a light shielding layer 3, a lower insulating layer 5, and an oxide semiconductor layer 7 are formed.

First, on the substrate 1, an electrically conductive film for the light shielding layer is formed, and through known photolithography, the electrically conductive film for the light shielding layer is patterned, whereby the light shielding layer 3 is obtained (STEP 1-1).

As the substrate 1, for example, a glass substrate, a silicon substrate, a thermally resistant plastic substrate (resin substrate), or the like can be used.

As the electrically conductive film for the light shielding layer, although not particularly limited, a metal film containing an element(s) selected from among aluminum (Al), chromium (Cr), copper (Cu), tantalum (Ta), titanium (Ti), molybdenum (Mo), and tungsten (W), an alloy film having any such elements as its components, and the like can be used, for example. Moreover, a multilayer film that includes a plurality of such films may be used. For example, a multilayer film having a three-layer structure of titanium film-aluminum film-titanium film, or a three-layer structure of molybdenum film-aluminum film-molybdenum film can be used. Note that the electrically conductive film for the light shielding layer is not limited to a three-layer structure; it may have a single layer, a two-layer structure, or a multilayer structure of four or more layers. Herein, as the electrically conductive film for the light shielding layer, a multilayer film having a Ti film (thickness: 15 to 70 nm) as a lower layer and a Cu film (thickness: 200 to 400 nm) as an upper layer is used.

Next, a lower insulating layer (thickness: e.g. not less than 200 nm and not more than 600 nm) 5 covering the light shielding layer 3 is formed (STEP 1-2).

As the lower insulating layer 5, a silicon oxide ($SiO_2$) layer, a silicon nitride (SiNx) layer, a silicon oxide nitride (SiOxNy;x>y) layer, a silicon nitride oxide (SiNxOy;x>y) layer, an aluminum oxide layer, a tantalum oxide layer, or the like may be used as appropriate. The lower insulating layer 5 may have a multilayer structure. Herein, as the lower insulating layer 5, by using CVD technique, a multilayer film having a silicon nitride (SiNx) layer (thickness: 50 to 600 nm) as a lower layer and a silicon oxide ($SiO_2$) layer (thickness: 50 to 600 nm) as an upper layer is formed, for example. In the case where an oxide film such as a silicon oxide film is used as the lower insulating layer 5 (or, in the case where the lower insulating layer 5 has a multilayer structure, as the uppermost layer thereof), oxidation defects occurring in a channel region of an oxide semiconductor layer to be formed later can be reduced by the oxide film, so that a decrease in resistance of the channel region can be suppressed.

Then, on the lower insulating layer 5, an oxide semiconductor film (thickness: e.g. not less than 15 nm and not more than 200 nm) is formed by using sputtering technique, and the oxide semiconductor film is patterned through known photolithography, for example, the oxide semiconductor layer 7 is formed (STEP 1-3). Although not particularly limited, the oxide semiconductor film may be an In—Ga—Zn—O based semiconductor film, for example.

STEP 1-4

Figure 6B:
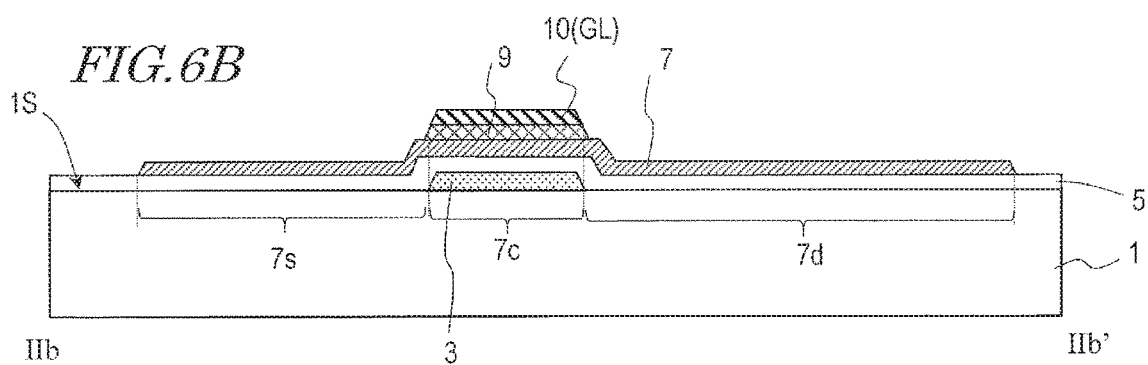
FIG. 6B A step-by-step cross-sectional view showing an exemplary method for manufacturing the active matrix substrate 101.

Next, as shown in FIG. 6B, a gate insulating layer 9 and a gate electrode 10 are formed.

First, an insulating film (thickness: e.g. not less than 80 nm and not more than 250 nm) and an electrically conductive film for the gate (thickness: e.g. not less than 50 nm and not more than 500 nm) are formed in this order, so as to cover the oxide semiconductor layer 7. The electrically conductive film for the gate is formed by using e.g. a sputtering technique, and the insulating film is formed by using e.g. a CVD technique.

As the insulating film, an insulating film similar to the lower insulating layer 5 (any insulating film that has been exemplified by the lower insulating layer 5) can be used. When an oxide film such as a silicon oxide film is used as the insulating film, oxidation defects occurring in the channel region of the oxide semiconductor layer 7 can be reduced by the oxide film, so that a decrease in resistance of the channel region can be suppressed.

As the electrically conductive film for the gate, for example, a metal film containing an element(s) selected from among aluminum (Al), chromium (Cr), copper (Cu), tantalum (Ta), titanium (Ti), molybdenum (Mo), and tungsten (W), an alloy film having any such elements as its components, and the like can be used. Moreover, a multilayer film that includes a plurality of such films may be used. For example, a multilayer film having a three-layer structure of titanium film-aluminum film-titanium film, or a three-layer structure of molybdenum film-aluminum film-molybdenum film can be used. Note that the electrically conductive film for the gate is not limited to a three-layer structure; it may have a single layer, a two-layer structure, or a multilayer structure of four or more layers. As the electrically conductive film for the gate, a multilayer film having a Ti film (thickness: 15 to 70 nm) as a lower layer and a Cu film (thickness: 200 to 400 nm) as an upper layer may be used.

Herein, as the insulating film, a silicon oxide ($SiO_2$) film is used, for example. As the electrically conductive film for the gate, a multilayer film having a Ti film (thickness: 15 to 70 nm) as a lower layer and a Cu film (thickness: 200 to 400 nm) as an upper layer is used, for example.

Then, by using a first resist mask not shown, the electrically conductive film for the gate is patterned, thereby forming the gate electrode 10. Patterning of the electrically conductive film for the gate may be conducted through wet etching or dry etching.

Thereafter, by using the first resist mask, the insulating film is patterned. Alternatively, after the first resist mask is removed, the insulating film may be patterned by using the patterned gate electrode 10 as a mask. As a result, the gate insulating layer 9 is obtained. Patterning of the insulating film may be conducted through dry etching, for example.

During patterning of the insulating film, a surface portion of a portion of the lower insulating layer 5 that is not covered by the oxide semiconductor layer may also become etched (overetched).

In this step, since the insulating film and the electrically conductive film for the gate are patterned by using the same mask, the side surface of the gate insulating layer 9 and the side surface of the gate electrode 10 are aligned, regarding the thickness direction. In other words, as viewed from the normal direction of the principal face 1S of the substrate 1, the peripheral edge of the gate insulating layer 9 is aligned with the peripheral edge of the gate electrode 10.

Note that an insulating film may be formed and patterned to thereby form the gate insulating layer 9, and then an electrically conductive film for the gate may be formed and patterned to thereby form the gate electrode 10.

STEP 1-5

Then, with the gate electrode 10 as a mask, the oxide semiconductor layer 7 is subjected to a low-resistance treatment. As the low-resistance treatment, a plasma treatment may be performed, for example. As a result, as viewed from the normal direction of the principal face 1S of the substrate 1, the first region 7s and the second region 7d of the oxide semiconductor layer 7, which do not overlap the gate electrode 10 and the gate insulating layer 9, become low-resistance regions having a lower specific resistance than does the channel region 7c, which overlaps the gate electrode 10 and the gate insulating layer 9. The first region 7s and the second region 7d may be regions of electrically-conductive matter (e.g. sheet resistance: 200Ω/□ or less).

In a low-resistance treatment (plasma treatment), portions of the oxide semiconductor layer 7 that are not covered by the gate electrode 10 may be subjected to a reductive plasma or a plasma containing a doping element (e.g. argon plasma). As a result, resistance is lowered near the surface of the exposed portions 7s and 7d of the oxide semiconductor layer 7, thereby becoming low-resistance regions. The portion 7c of the oxide semiconductor layer 7 that is masked by the gate electrode 10 remains as a semiconductor region. Note that the method, conditions, etc., of low-resistance treatment are described in Japanese Laid-Open Patent Publication No. 2008-40343, for example. The entire disclosure of Japanese Laid-Open Patent Publication No. 2008-40343 is incorporated herein by reference.

STEP 1-6

Figure 6C:
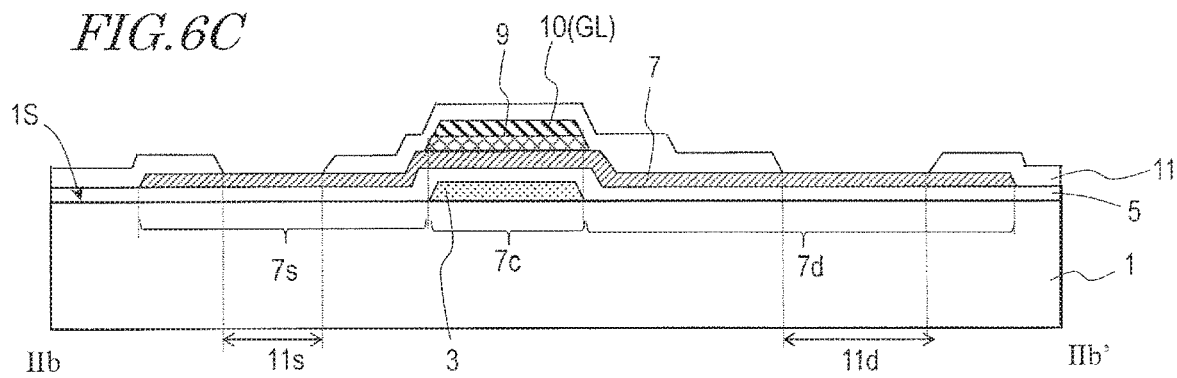
FIG. 6C A step-by-step cross-sectional view showing an exemplary method for manufacturing the active matrix substrate 101.

Next, as shown in FIG. 6C, an upper insulating layer 11 covering the gate electrode 10 and the oxide semiconductor layer 7 is formed. As the upper insulating layer 11, one or more inorganic insulating layers, e.g., a silicon oxide film, a silicon nitride film, a silicon oxide nitride film, and/or a silicon nitride oxide film, may be formed. The thickness of the inorganic insulating layer may be not less than 100 nm and not more than 500 nm. It is preferable to form the upper insulating layer 11 by using an insulating film that causes reduction of an oxide semiconductor, e.g., a silicon nitride film, because this will allow regions of the oxide semiconductor layer 7 that are in contact with the upper insulating layer 11 (which herein are the first region 7s and the second region 7d) to maintain a low specific resistance. Herein, as the upper insulating layer 11, an SiNx layer (thickness: 300 nm) is formed by CVD technique, for example.

Thereafter, by dry etching, for example, a source-side aperture 11s and a drain-side aperture 11d reaching the first region 7s and the second region 7d of the oxide semiconductor layer 7 are formed in the upper insulating layer 11.

STEP 1-7

Figure 6D:
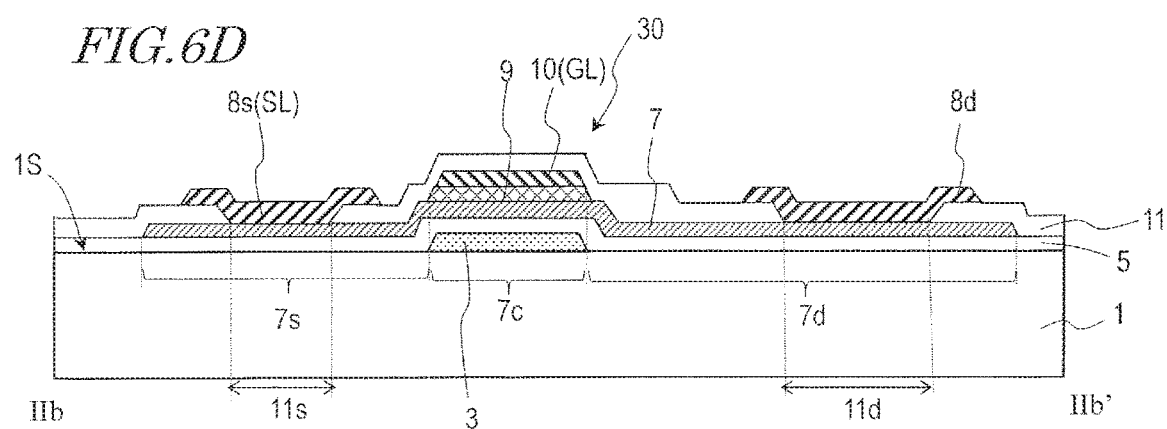
FIG. 6D A step-by-step cross-sectional view showing an exemplary method for manufacturing the active matrix substrate 101.

Next, as shown in FIG. 6D, a source metal layer including a source electrode 8s, a drain electrode 8d, and source bus line SL is formed on the upper insulating layer 11. Herein, on the upper insulating layer 11 and within the apertures 11s and 11d, an electrically conductive film for the source (thickness: e.g. not less than 50 nm and not more than 500 nm) is formed, and the electrically conductive film for the source is patterned through known photolithography, whereby the source metal layer is obtained. Patterning can be conducted through dry etching or wet etching. In this manner, the TFT 30 is obtained.

As the electrically conductive film for the source, for example, an element(s) selected from among aluminum (Al), chromium (Cr), copper (Cu), tantalum (Ta), titanium (Ti), molybdenum (Mo), and tungsten (W), or an alloy having any such elements as its components, and the like can be used. For example, it may have a three-layer structure of titanium film-aluminum film-titanium film, a three-layer structure of molybdenum film-aluminum film-molybdenum film, or the like. The electrically conductive film for the source is not limited to a three-layer structure; it may have a single layer, a two-layer structure, or a multilayer structure of four or more layers. Herein, a multilayer film having a Ti film (thickness: 15 to 70 nm) as a lower layer and a Cu film (thickness: 200 to 400 nm) as an upper layer is used.

STEP 1-8

Figure 6E:
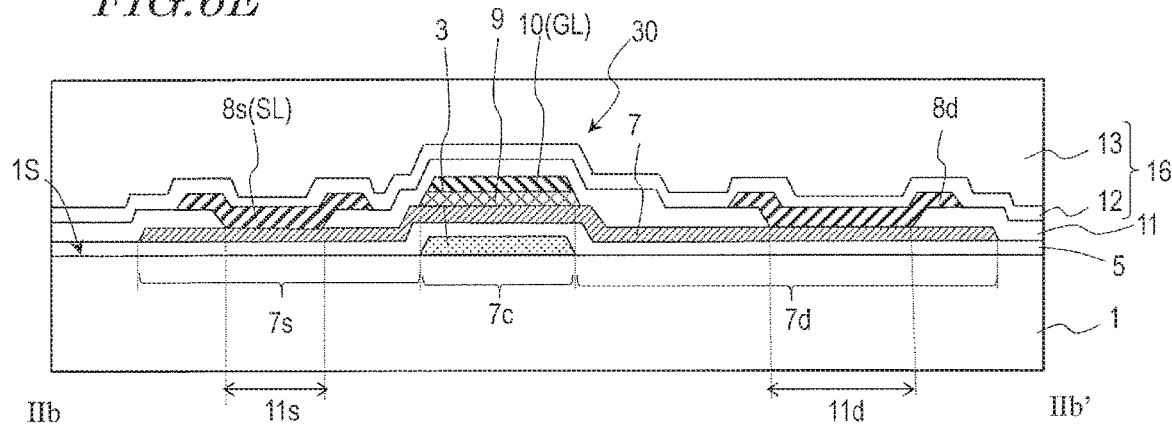
FIG. 6E A step-by-step cross-sectional view showing an exemplary method for manufacturing the active matrix substrate 101.

Then, as shown in FIG. 6E, an interlayer insulating layer 16 is formed so as to cover the TFT 30 and the source bus line SL. The interlayer insulating layer 16 includes an organic insulating layer 13 that may function as a planarization film. As the interlayer insulating layer 16, an inorganic insulating layer (thickness: e.g. not less than 100 nm and not more than 400 nm) 12 and the organic insulating layer (thickness: e.g. 1 to 3 μm, preferably 2 to 3 μm) 13 may be formed in this order. The material of the inorganic insulating layer 12 may be the same as any of the materials exemplified for the upper insulating layer 11. Herein, as the inorganic insulating layer 12, an SiNx layer (thickness: e.g. 200 nm) is formed by CVD technique. The organic insulating layer 13 may an organic insulating film containing a photosensitive resin material, for example.

Figure 6F:
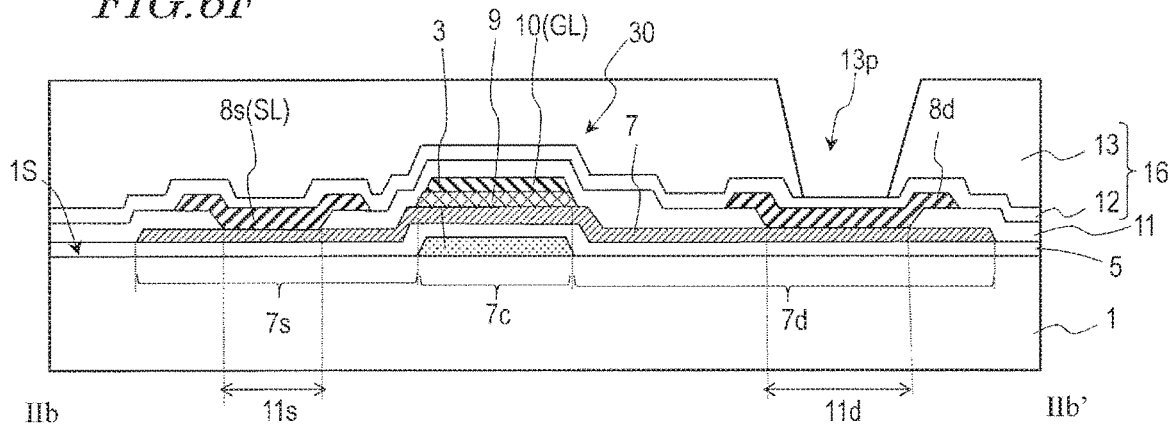
FIG. 6F A step-by-step cross-sectional view showing an exemplary method for manufacturing the active matrix substrate 101.
Figure 6G:
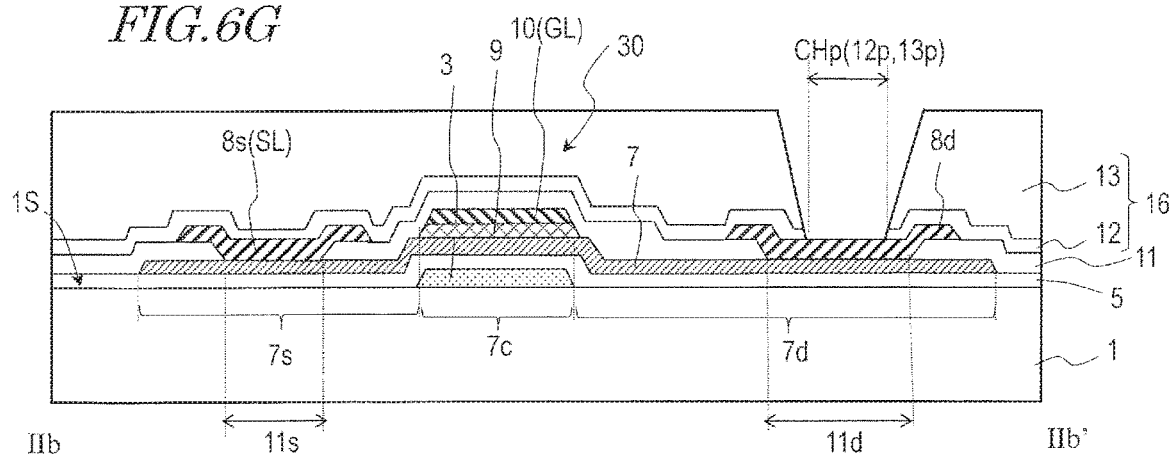
FIG. 6G A step-by-step cross-sectional view showing an exemplary method for manufacturing the active matrix substrate 101.

Thereafter, as shown in FIG. 6F, the organic insulating layer 13 is patterned, whereby an aperture 13p is formed. Next, as shown in FIG. 6G, by using the organic insulating layer 13 in which the aperture 13p has been formed as a mask, an aperture 12p may be formed in the inorganic insulating layer 12. As a result, a first contact hole CHp that is composed of the apertures 12p and 13p is obtained.

Alternatively, after patterning the organic insulating layer 13, an etching mask may be separately provided, and the etching mask may be used to pattern the inorganic insulating layer 12, thereby forming the aperture 12p to expose the drain electrode 8d.

STEP 1-9

Figure 6H:
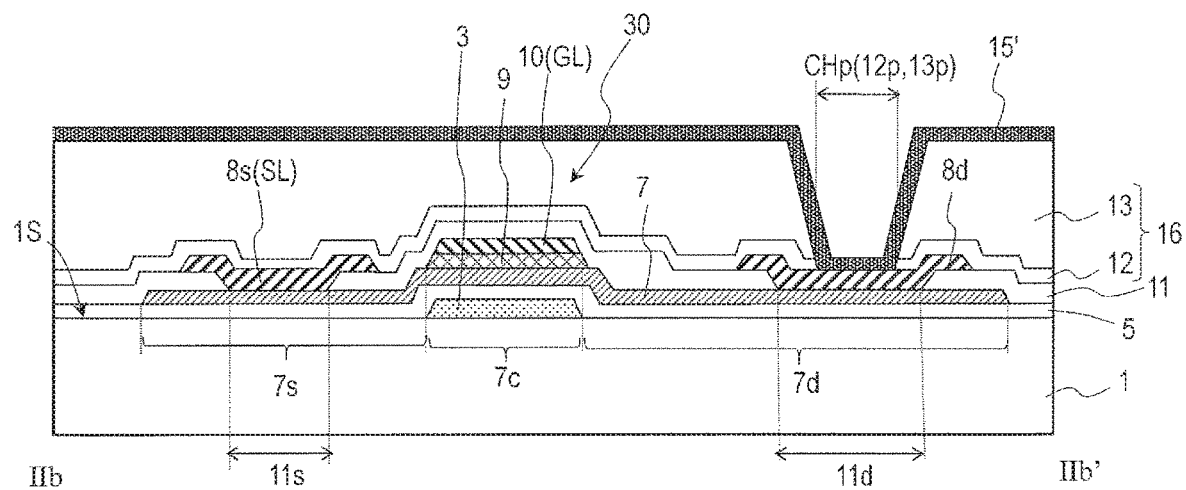
FIG. 6H A step-by-step cross-sectional view showing an exemplary method for manufacturing the active matrix substrate 101.

Then, as shown in FIG. 6H, on the interlayer insulating layer 16 and within the first contact hole CHp, a first transparent electrically conductive film (thickness: 20 to 300 nm) 15' from which to form a pixel electrode PE is formed. Herein, by sputtering technique, for example, an indium-zinc oxide film is formed as the first transparent electrically conductive film 15'. As the material of the first transparent electrode film, metal oxides such as indium-tin oxide (ITO), indium-zinc oxide, and ZnO can be used.

STEP 1-10

Figure 6I:
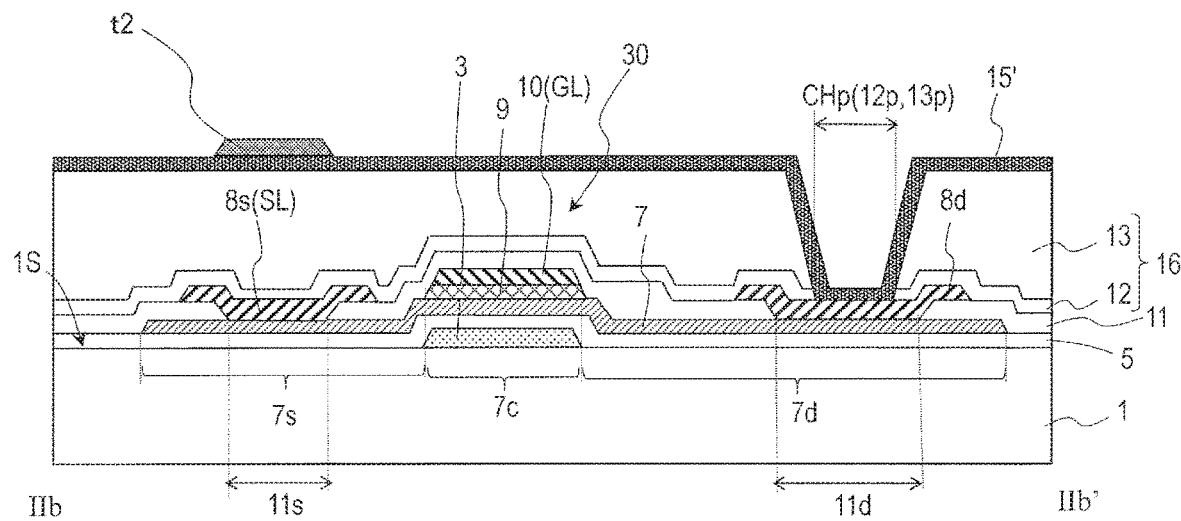
FIG. 6I A step-by-step cross-sectional view showing an exemplary method for manufacturing the active matrix substrate 101.

Next, as shown in FIG. 6I, on the first transparent electrically conductive film 15', an upper wiring portion t2 of the touch wiring line TL is formed by using a metal film.

Specifically, first, a metal film (thickness: 50 to 500 nm) from which to form the touch wiring line is formed on the first transparent electrically conductive film 15'. As the metal film, an electrically conductive film which is similar to the electrically conductive film for the gate or the electrically conductive film for the source can be used. Herein, by sputtering technique, for example, a single layer or a multilayer structure film which is mainly composed of a Cu film or Al is formed. Thereafter, the metal film is patterned, whereby the upper wiring portion t2 of the touch wiring line TL is obtained.

STEP 1-11

Figure 6J:
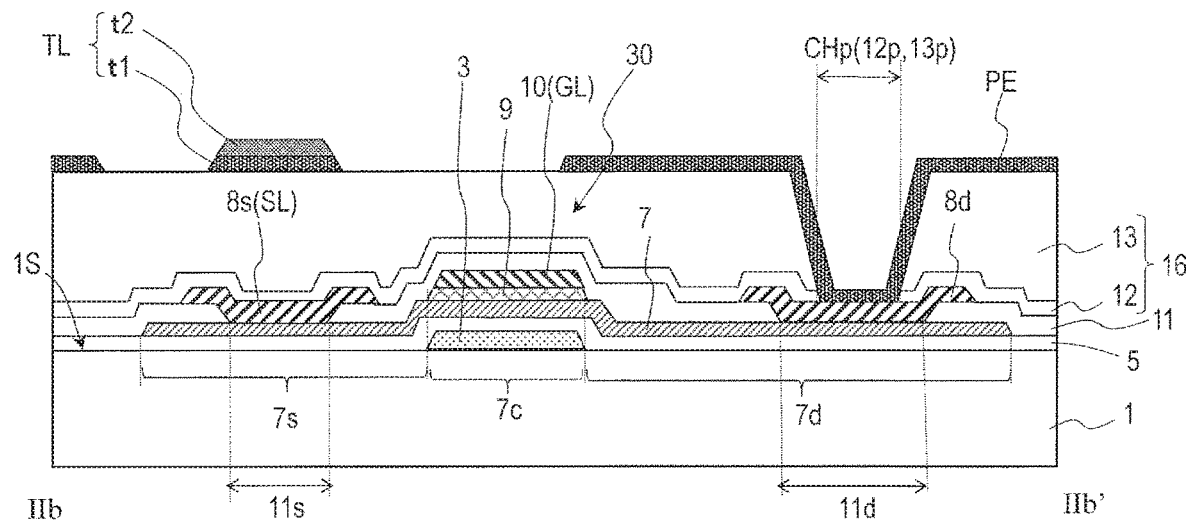
FIG. 6J A step-by-step cross-sectional view showing an exemplary method for manufacturing the active matrix substrate 101.

Then, as shown in FIG. 6J, by wet etching, for example, the first transparent electrically conductive film 15' is patterned, whereby a first transparent electrode layer including the pixel electrode PE and a lower wiring portion t1 of the touch wiring line TL is obtained.

The pixel electrode PE is a separate pixel, from pixel to pixel. Each pixel electrode PE is electrically connected to the drain electrode 8d of the TFT 30 within the first contact hole CHp. Moreover, the pixel electrode PE and the lower wiring portion t1 are spaced apart, and electrically separated. During the pattern, the upper wiring portion t2 may also be allowed to function as a mask. As a result of this, the side surface of the lower wiring portion t1 and the side surface of the upper wiring portion t2 will become aligned.

STEP 1-12

Figure 6K:
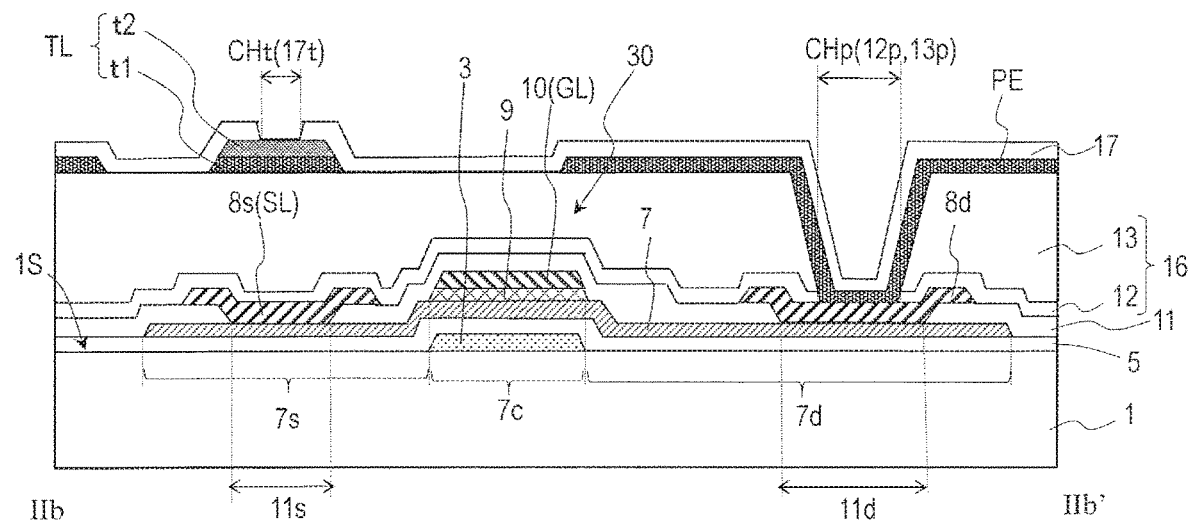
FIG. 6K A step-by-step cross-sectional view showing an exemplary method for manufacturing the active matrix substrate 101.

Next, as shown in FIG. 6K, on the first transparent electrode layer and the touch wiring line TL, a dielectric layer (thickness: 50 to 500 nm) 17 is formed. The material of the dielectric layer 17 may be the same as any of the materials exemplified for the inorganic insulating layer 12. Herein, as the dielectric layer 17, an SiN film is formed by CVD technique, for example.

Thereafter, the dielectric layer 17 is etched, thereby forming an aperture 17t (second contact hole CHt) through which a portion of the upper wiring portion t2 of the touch wiring line TL is exposed.

STEP 1-13

Next, although not shown, a second transparent electrically conductive film (thickness: 20 to 300 nm) is formed on the dielectric layer 17 and within the second contact hole CHt. Thereafter, the second transparent electrically conductive film is patterned, whereby a second transparent electrode layer including the common electrode CE is formed on the dielectric layer 17. In the common electrode CE, at least one aperture (or recess) is made for each pixel. Moreover, the common electrode CE is separated into a plurality of common electrode subportions CEa, such that each common electrode subportion CEa is electrically connected to the touch wiring line TL within the second contact hole CHt.

The material of the second transparent electrically conductive film may be the same as any of the materials exemplified for the first transparent electrically conductive film. The second transparent electrically conductive film may be a single layer or a multilayer film. Herein, by sputtering technique, for example, an indium-zinc oxide film is formed. In this manner, the active matrix substrate 101 shown in FIG. 2A and FIG. 2B is produced.

In the above method, since no insulating layer is present between the first transparent electrode layer and the touch wiring layer, the number of insulating layers in which to form contact holes can be reduced. Each of the above contact portions and the like is designed usually by taking into consideration misalignment (e.g. 1 μm), variation in the sizes of apertures to be made in each insulating layer (e.g. ±1 μm), and so on. Reducing the number of insulating layers allows the sizes of the contact portions (first contact hole CHp, second contact hole CHt) to be reduced, whereby a decrease in the pixel aperture ratio associated with the contact portions can be suppressed more effectively.

<Variant>

Figure 8A:
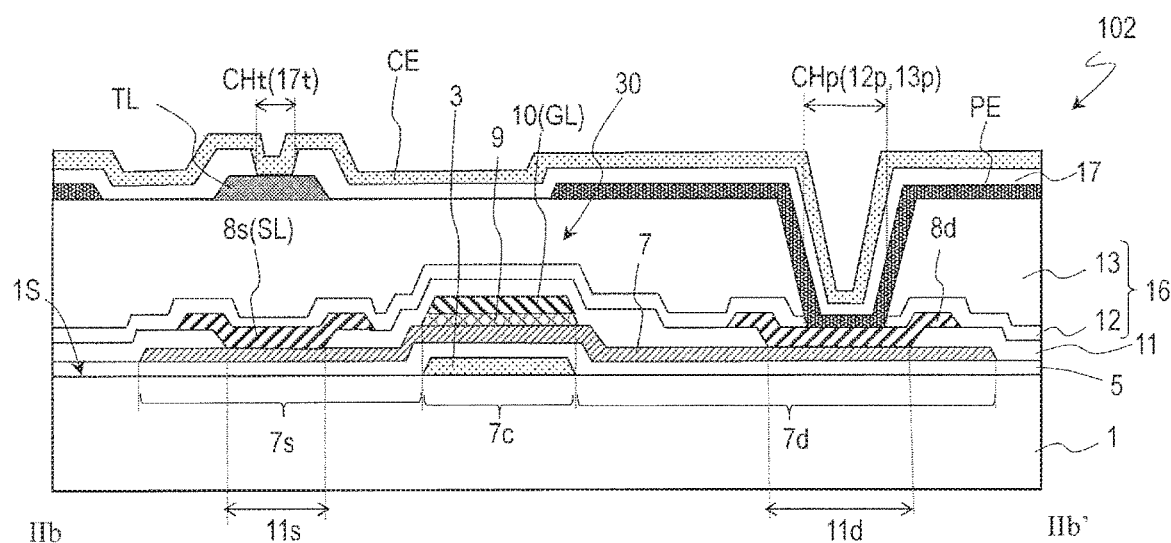
FIG. 8A A cross-sectional view illustrating another active matrix substrate 102 according to the first embodiment.
Figure 8B:
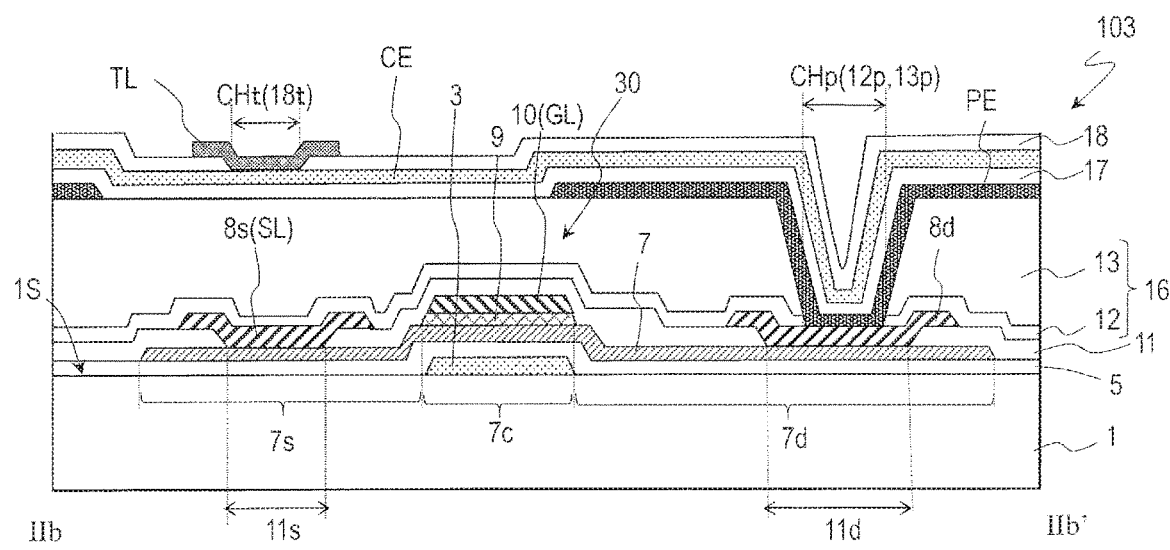
FIG. 8B A cross-sectional view illustrating another active matrix substrate 103 according to the first embodiment.
Figure 8C:
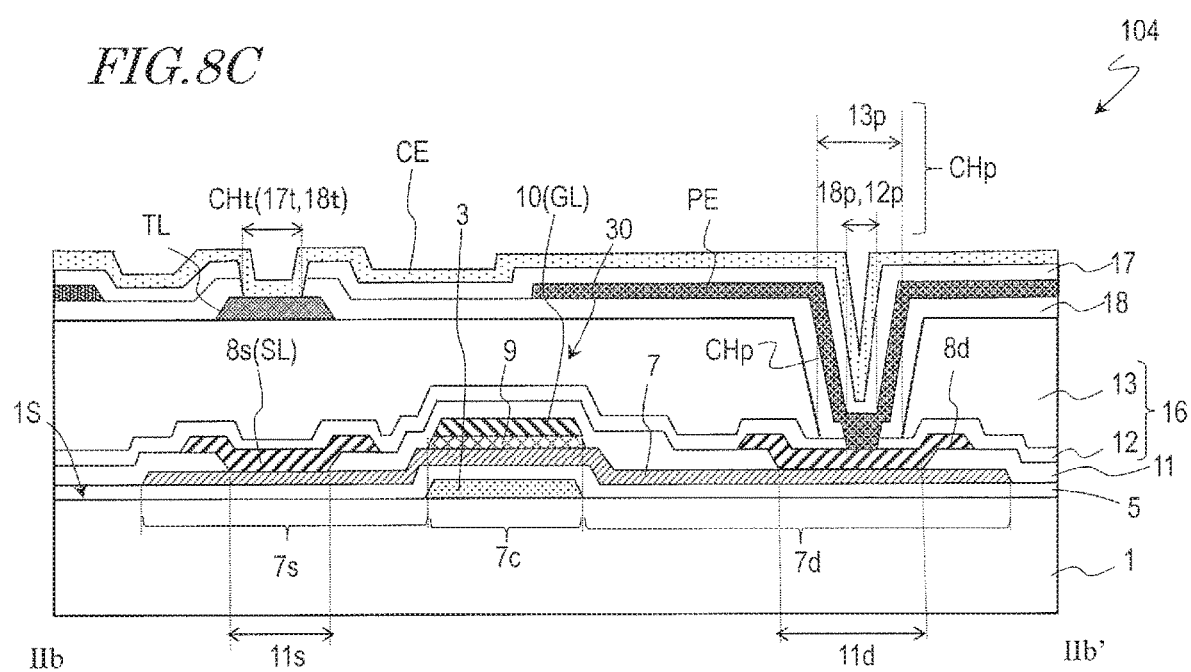
FIG. 8C A cross-sectional view illustrating another active matrix substrate 104 according to the first embodiment.

FIG. 8A to FIG. 8C are cross-sectional views respectively illustrating other active matrix substrates 102, 103 and 104 according to the present embodiment.

In the active matrix substrate 102 shown in FIG. 8A, the touch wiring line TL is composed only of a layer that is made of a metal film. Such construction is obtained by patterning the first transparent electrically conductive film 15' to form the pixel electrode PE, and thereafter forming a metal film from which to form the touch wiring line TL, and patterning it. Alternatively, after the touch wiring line TL is formed on the interlayer insulating layer 16, the first transparent electrically conductive film 15' may be formed and patterned to thereby form the pixel electrode PE. In the example shown in FIG. 8A, another dielectric layer may be formed between the first transparent electrode layer including the pixel electrode PE and the touch wiring layer including the touch wiring lines TL.

In the active matrix substrate 103 shown in FIG. 8B, the touch wiring layer is disposed on the common electrode CE via a second dielectric layer 18. The touch wiring line TL is connected to the common electrode CE within an aperture 18t (second contact hole CHt) that is made in the dielectric layer 18.

In the active matrix substrate 104 shown in FIG. 8C, the touch wiring layer is disposed on the substrate 1 side of the first transparent electrode layer, which includes the pixel electrode PE. Herein, on the interlayer insulating layer 16, the touch wiring layer, the second dielectric layer 18, the first transparent electrode layer including the pixel electrode PE, the first dielectric layer 17, and the second transparent electrode layer including the common electrode CE are formed in this order. The second contact hole CHt is composed of an aperture 17t being made in the dielectric layer 17 and an aperture 18t being made in the second dielectric layer 18. The first contact hole CHp is composed of apertures 12p, 13p and 18p which are made in the inorganic insulating layer 12, the organic insulating layer 13, and the second dielectric layer 18, respectively.

<Method for Manufacturing the Active Matrix Substrate 104>

Figure 9A:
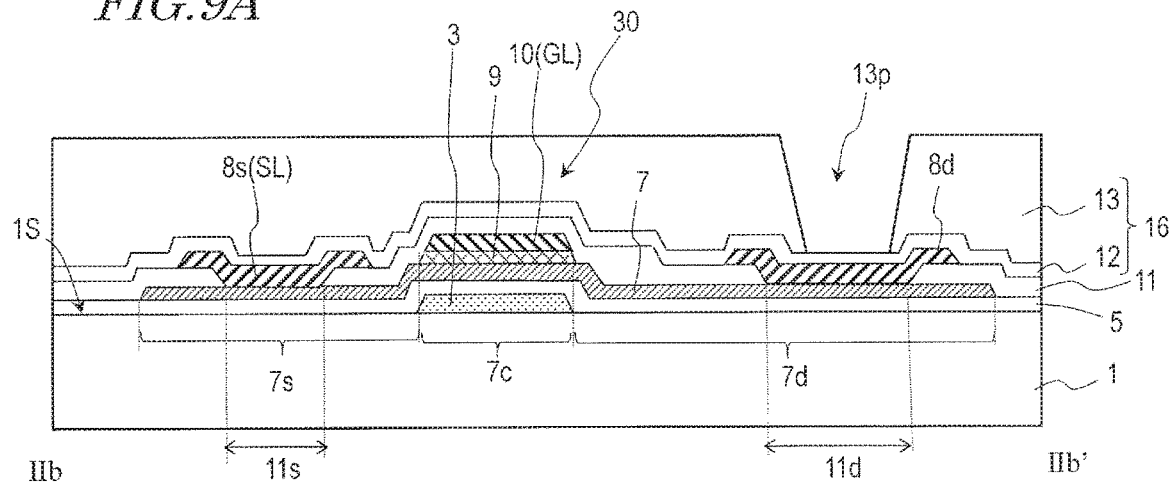
FIG. 9A A step-by-step cross-sectional view showing an exemplary method for manufacturing the active matrix substrate 104.

By taking the active matrix substrate 104 shown in FIG. 8C as an example, another manufacturing method according to the present embodiment will be described. FIG. 9A to FIG. 9F are step-by-step cross-sectional views for describing an exemplary method for manufacturing the active matrix substrate 104. FIG. 10 is a flowchart showing the exemplary method for manufacturing the active matrix substrate 104. In the following description, regarding the method of forming each layer, its material, thickness, etc., explanation will be conveniently omitted whenever similar to that for the active matrix substrate 101.

In STEPS 2-1 to 2-7, a TFT 30 is formed by a method similar to STEPS 1-1 to 1-7.

STEP 2-8

Then, an interlayer insulating layer 16 is formed so as to cover the TFT 30 and the source bus line SL. Herein, as the interlayer insulating layer 16, an inorganic insulating layer 12 and an organic insulating layer 13 are formed in this order. Thereafter, as shown in FIG. 9A, the organic insulating layer 13 is patterned, whereby an aperture 13p through which a portion of the inorganic insulating layer 12 is exposed is formed.

STEP 2-9

Figure 9B:
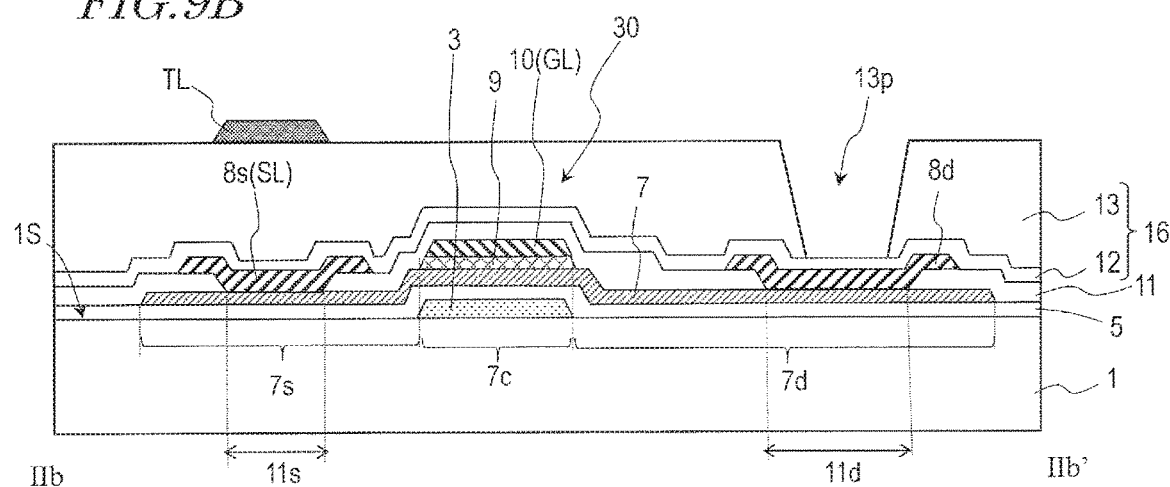
FIG. 9B A step-by-step cross-sectional view showing an exemplary method for manufacturing the active matrix substrate 104.
Figure 10:
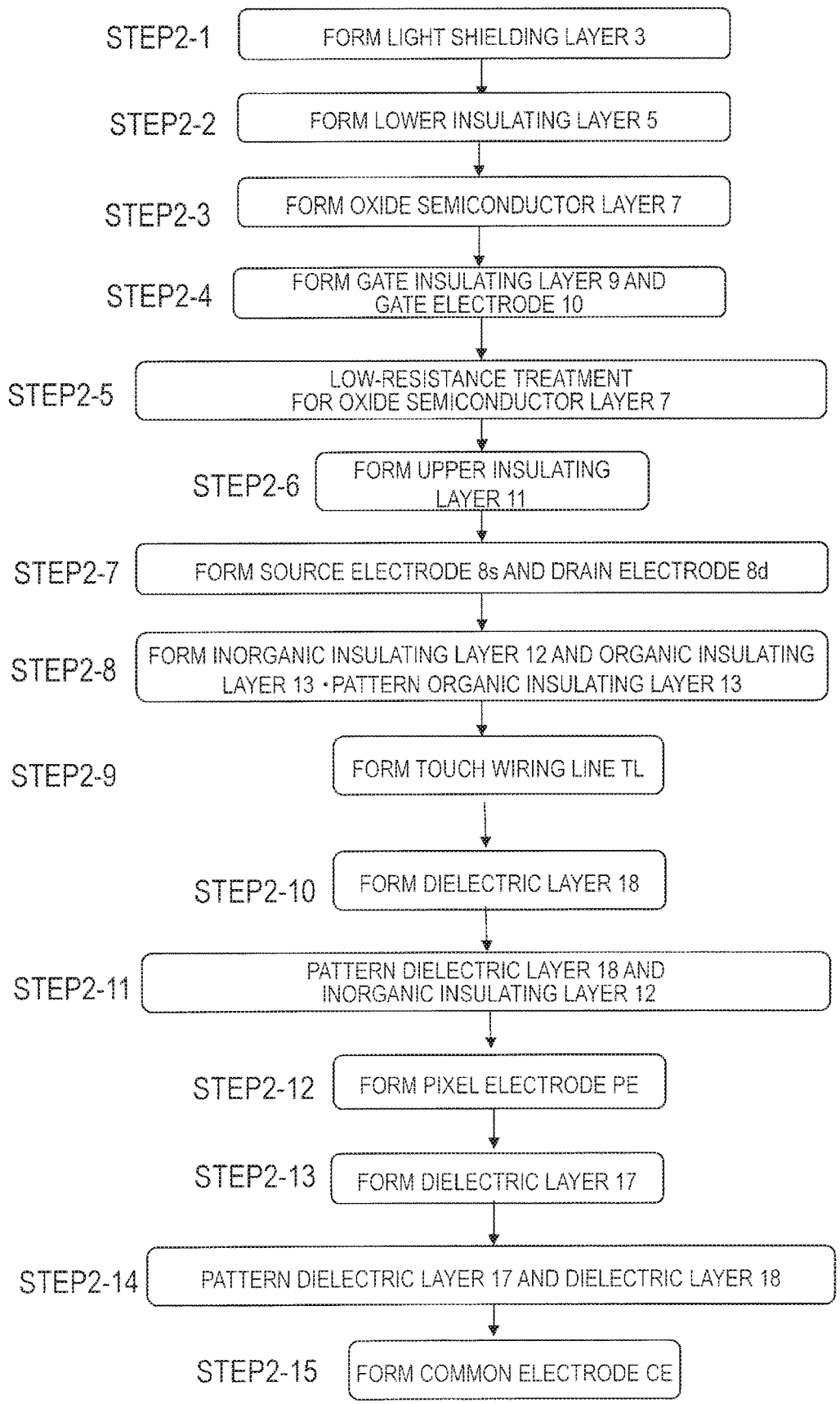
FIG. 10 A flowchart showing an exemplary method for manufacturing the active matrix substrate 104.

Next, as shown in FIG. 9B, a metal film from which to form a touch wiring line is formed on the interlayer insulating layer 16, and the metal film is patterned, whereby a touch wiring line TL is obtained.

STEP 2-10

Figure 9C:
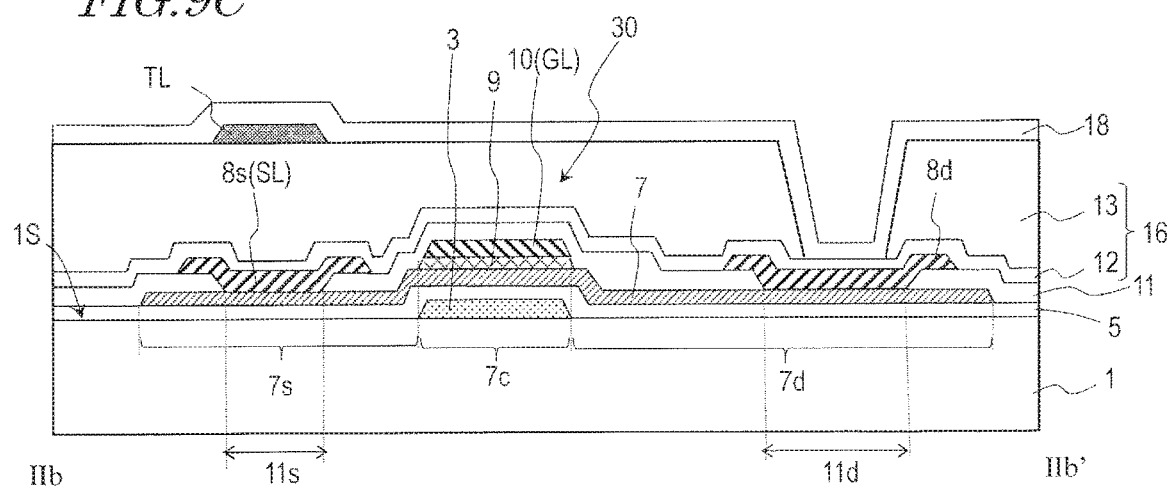
FIG. 9C A step-by-step cross-sectional view showing an exemplary method for manufacturing the active matrix substrate 104.

Next, as shown in FIG. 9C, a dielectric layer (thickness: 50 to 500 nm) 18 is formed on the interlayer insulating layer 16 and the touch wiring line TL. The material of the second dielectric layer 18 may be the same as any of the materials exemplified for the inorganic insulating layer 12.

STEP 2-11

Figure 9D:
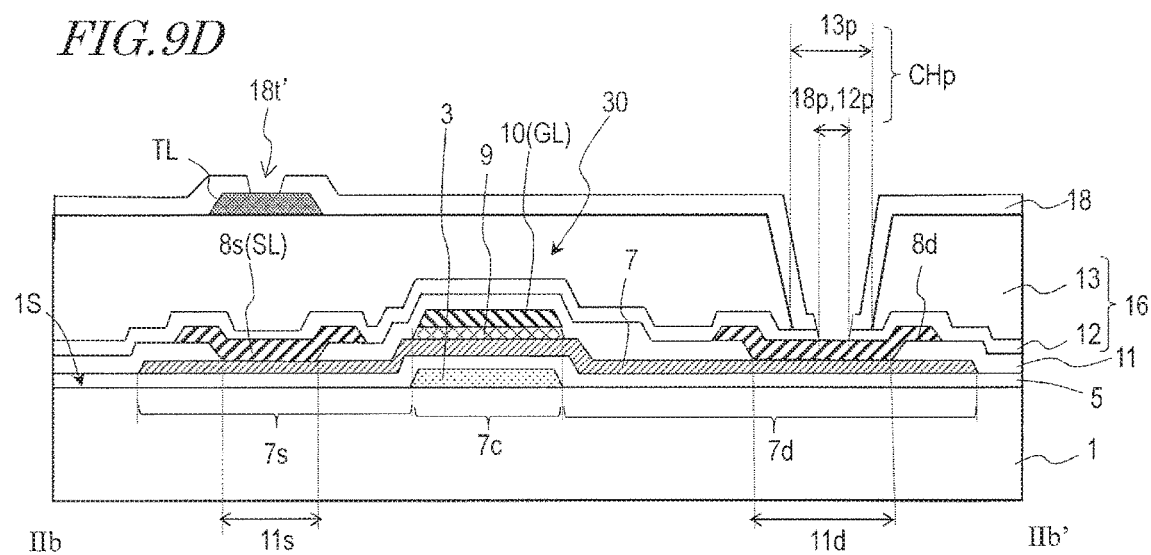
FIG. 9D A step-by-step cross-sectional view showing an exemplary method for manufacturing the active matrix substrate 104.

Then, as shown in FIG. 9D, by using the same resist mask (also referred to as the first mask), the second dielectric layer 18 and the inorganic insulating layer 12 are patterned (wet etching or dry etching). As a result, in the second dielectric layer 18, a preliminary aperture 18t' through which a portion of the touch wiring line TL is exposed and an aperture 18p which at least partially overlaps the aperture 13p are made; and, a part or a whole of the portion of the inorganic insulating layer 12 that is exposed through the aperture 13p is removed, thereby forming an aperture 12p through which a portion of the drain electrode 8d is exposed. At least a portion of the side surface of the aperture 12p is aligned with the aperture 18p. Because the relative positioning between the aperture 18p and the aperture 13p, another portion of the side surface of the aperture 12p is aligned also with the aperture 13p. As a result, a first contact hole CHp that is composed of the apertures 18p, 12p and 13p is obtained.

STEP 2-12

Figure 9E:
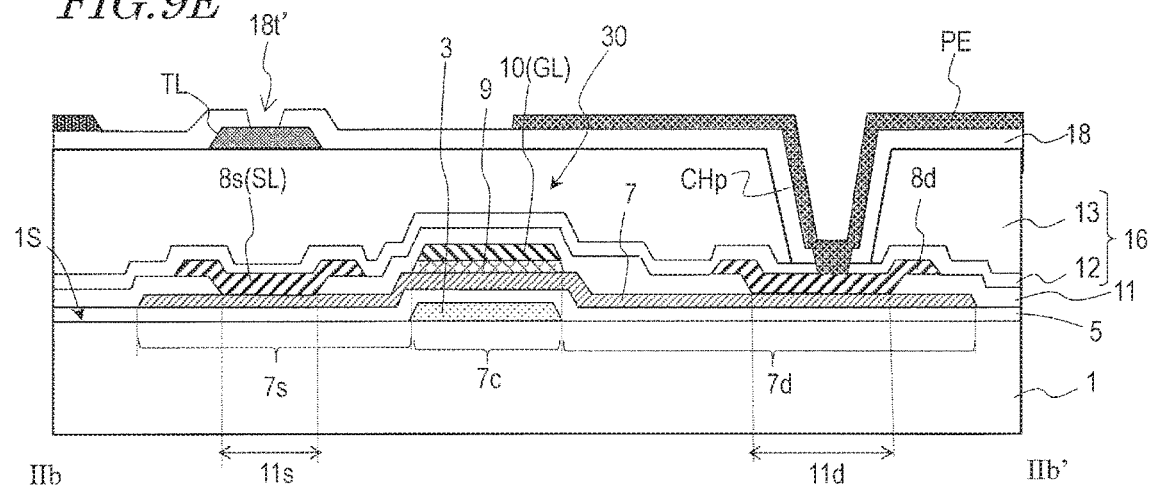
FIG. 9E A step-by-step cross-sectional view showing an exemplary method for manufacturing the active matrix substrate 104.

Then, as shown in FIG. 9E, a first transparent electrode layer including a pixel electrode PE is formed.

First, on the second dielectric layer 18, within the preliminary aperture 18t' in the second dielectric layer 18, and within the first contact hole CHp, a first transparent electrically conductive film is formed. Then, by wet etching, for example, the first transparent electrically conductive film is patterned, whereby a first transparent electrode layer including the pixel electrode PE is obtained. A portion of the first transparent electrically conductive film that is located within the preliminary aperture 18t' of the second dielectric layer 18 is removed.

STEP 2-13

Figure 9F:
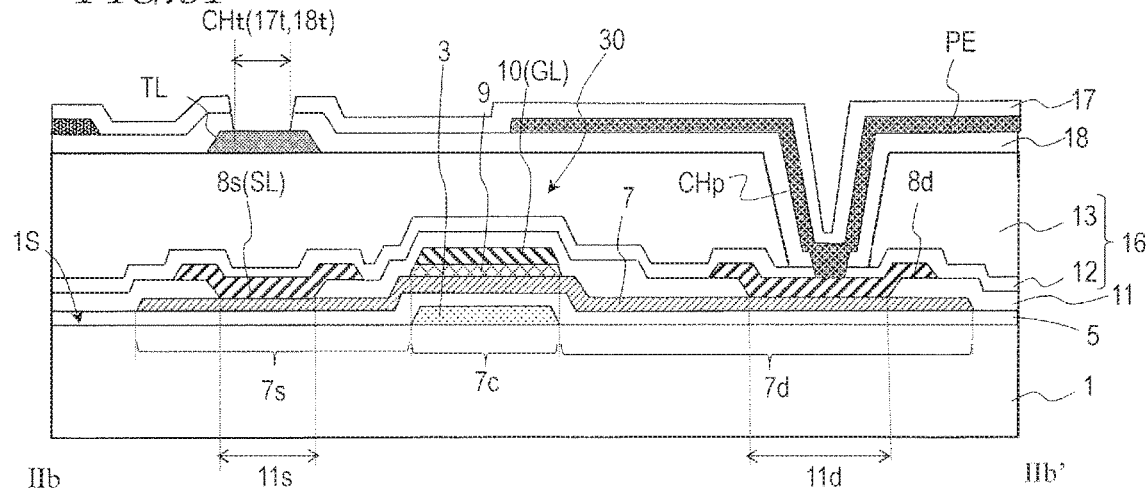
FIG. 9F A step-by-step cross-sectional view showing an exemplary method for manufacturing the active matrix substrate 104.

Next, as shown in FIG. 9F, a first dielectric layer 17 is formed on the first transparent electrode layer, on the second dielectric layer 18, and within the preliminary aperture 18t'.

STEP 2-14

Next, as shown in FIG. 9F, by using a resist mask (also referred to as a second mask), the first dielectric layer 17 is patterned, thereby forming an aperture 17t so as to at least partially overlap the preliminary aperture 18t'. Dry etching or wet etching may be used for the patterning. At this time, by using the aforementioned resist mask, the second dielectric layer 18 may also be simultaneously patterned. As a result, an aperture 18t that is larger than the preliminary aperture 18t' is made. In this manner, a second contact hole CHt is obtained which is composed of the aperture 17t and the aperture 18t and through which a portion of the touch wiring line TL is exposed.

At STEP 2-12, the preliminary aperture 18t' may not be made in the second dielectric layer 18. In that case, in this step, patterning of the first dielectric layer 17 and the second dielectric layer 18 may be simultaneously performed by using the same mask.

STEP 2-15

Next, on the first dielectric layer 17 and within the second contact hole CHt, a second transparent electrically conductive film is formed. Thereafter, the second transparent electrically conductive film is patterned, thereby forming on the first dielectric layer 17 a second transparent electrode layer including the common electrode CE. The common electrode CE is separated into a plurality of common electrode subportions CEa, such that each common electrode subportion CEa is electrically connected to the touch wiring line TL within the second contact hole CHt. In this manner, the active matrix substrate 104 (FIG. 8C) is produced.

In the above method, at STEP 2-11, patterning of the inorganic insulating layer 12 and the second dielectric layer 18 is performed simultaneously (i.e., by using the same mask). Moreover, at STEP 2-14, patterning of the second dielectric layer 18 and the first dielectric layer 17 is simultaneously performed. This allows the number of photomasks to be used in the fabrication process, whereby the production cost can be reduced.

Moreover, by etching two or more insulating layers with the same mask, misalignment, variation in the sizes of apertures to be made in each insulating layer, and the like can be reduced. This allows the sizes of the contact portions (first contact hole CHp, second contact hole CHt) to be reduced, whereby a decrease in the pixel aperture ratio can be suppressed more effectively.

Since the second dielectric layer 18 is etched simultaneously with each of the inorganic insulating layer 12 and the first dielectric layer 17 (in two steps), the second dielectric layer 18 may have a side surface which is at least partially aligned with the side surface of the inorganic insulating layer 12 within the first contact hole CHp, and have a side surface which is at least partially aligned with the side surface of the first dielectric layer 17 within the second contact hole CHt. Thus, making the aperture 18t by performing the etching of the second dielectric layer 18 in two steps allows malformation of the second contact hole CHt to be suppressed more effectively, whereby a touch wiring contact portion with high reliability is formed.

Figure 11A:
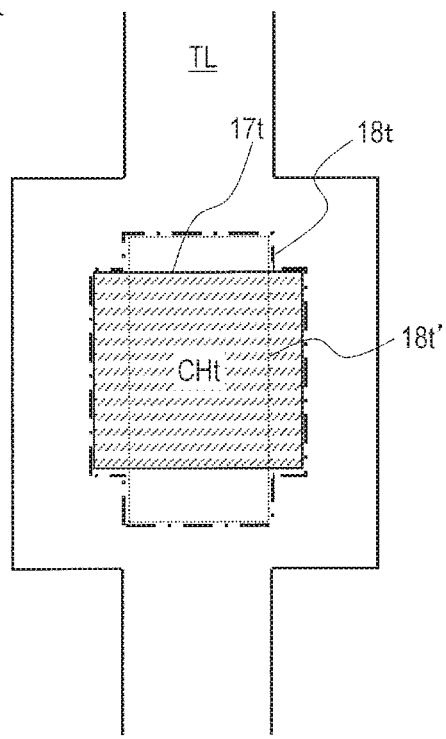
FIG. 11A A plan view illustrating a relative positioning between a preliminary aperture 18p' and an aperture 18p in a second dielectric layer 18 and an aperture 17p in a first dielectric layer 17.

As illustrated in FIG. 11A, as viewed from the normal direction of the substrate 1, after making the preliminary aperture 18t' in the second dielectric layer 18 through a first etching, an aperture 17t which intersects the preliminary aperture 18t' may be made in the first dielectric layer 17, and through a second etching, a portion of the second dielectric layer 18 that overlaps the aperture 17t may be removed, thereby making the aperture 18t.

Figure 11B:
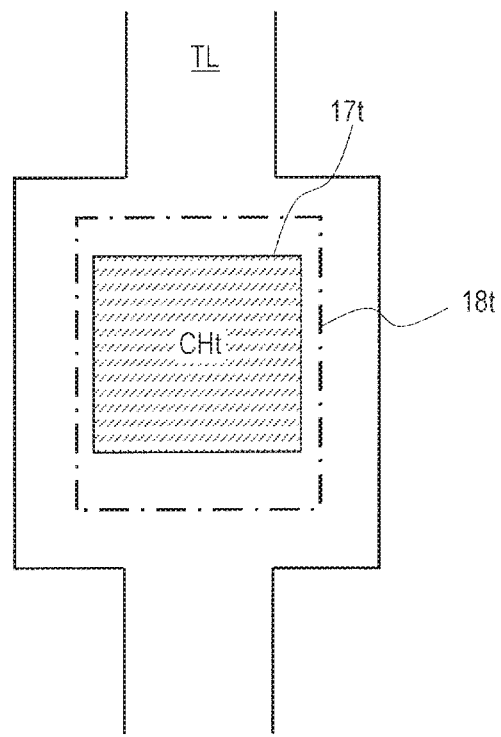
FIG. 11B A plan view illustrating a relative positioning between a preliminary aperture 18p' and an aperture 18p in the second dielectric layer 18 and an aperture 17p in the first dielectric layer 17.

Alternatively, as illustrated in FIG. 11B, after an aperture 18t of a relatively large size is made in the second dielectric layer 18 at the etching step of STEP 2-11, the first dielectric layer 17 may be formed, and an aperture 17t may be made in the first dielectric layer 17 so as to be located inside the aperture 18t as viewed from the normal direction of the substrate 1. As a result of this, a second contact hole CHt having a staircase-like side surface is created by the second dielectric layer 18 and the first dielectric layer 17, whereby the touch wiring line TL to be formed on the second contact hole CHt can provide better coverage.

Second Embodiment

An active matrix substrate according to a second embodiment differs from the above-described embodiment in that the common electrode is disposed on the substrate side of the pixel electrodes.

Figure 12A:
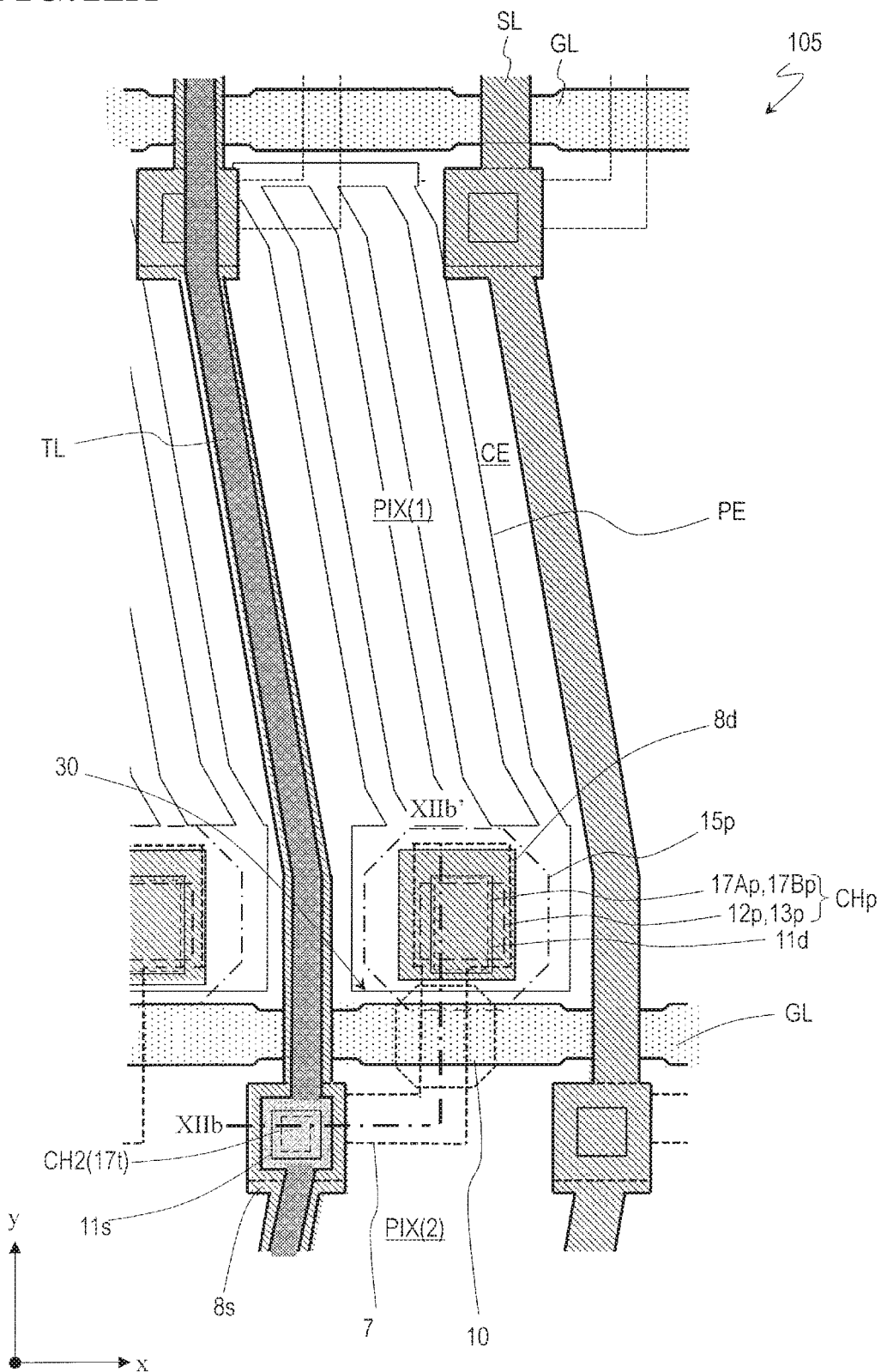
FIG. 12A A plan view showing a portion of a displaying region of an active matrix substrate 105.
Figure 12B:
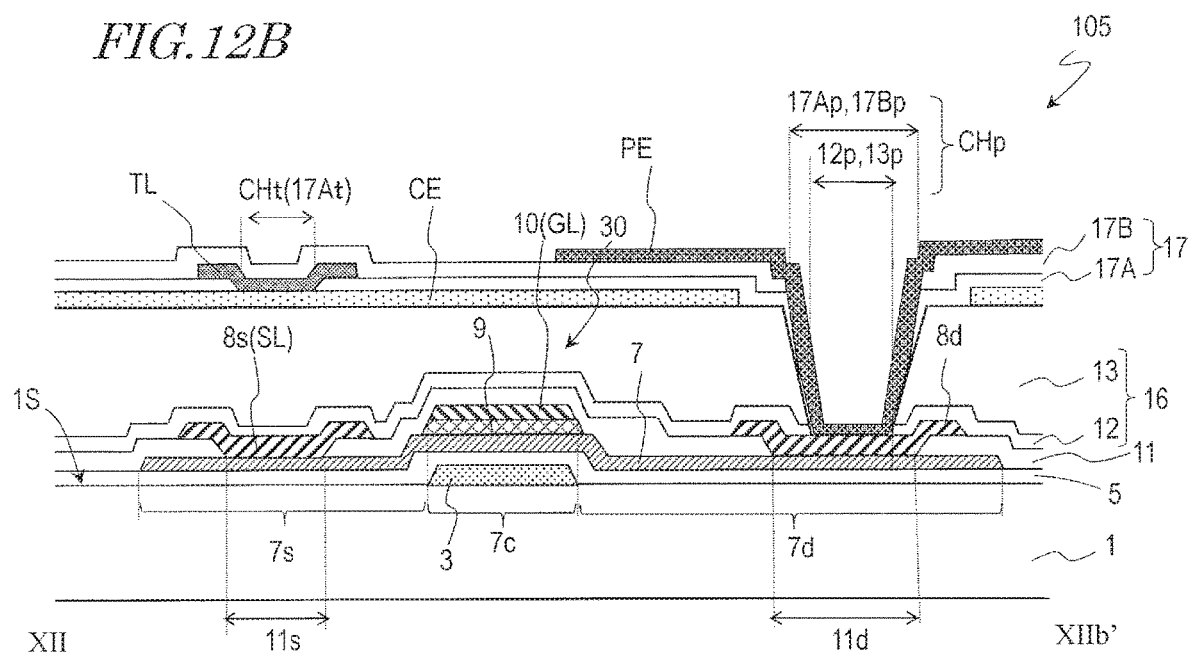
FIG. 12B A cross-sectional view showing a portion of the pixel region of the active matrix substrate 105.

FIG. 12A is an enlarged plan view showing a portion of the displaying region DR of the active matrix substrate 105, and FIG. 12B is a cross-sectional view taken along line XIIb-XIIb' shown in FIG. 12A. In these figures, component elements which are similar to those in FIG. 2A and FIG. 2B are denoted by like reference numerals, with their description being omitted. Hereinafter, differences from FIG. 2A and FIG. 2B will be mainly described, and description of any similar component elements will be omitted.

In an active matrix substrate 105, the following are formed on an interlayer insulating layer 16, in this order: a first transparent electrode layer including a common electrode CE, a lower dielectric layer 17A, a touch wiring layer including touch wiring lines TL, an upper dielectric layer 17B, and a second transparent electrode layer including pixel electrodes PE.

The pixel electrodes PE have, for each pixel, a slit or a recess. The common electrode CE is divided into a plurality of common electrode subportions CEa, each common electrode subportion CEa functioning as an electrode for touch sensing (sensor electrode). The common electrode CE has an aperture 15p above a drain contact portion. The pixel electrodes PE and the common electrode CE overlap each other, via a first dielectric layer 17 that includes the lower dielectric layer 17A and the upper dielectric layer 17B.

In a touch wiring contact portion, the touch wiring line TL is electrically connected to one corresponding common electrode subportion CEa of the common electrode CE, within an aperture 17At (second contact hole CHt) that is made in the lower dielectric layer 17A. The touch wiring line TL and the common electrode CE may be directly in contact. In this example, the touch wiring lines TL are made of a metal film, and do not include any transparent electrically conductive film.

In a pixel contact portion, the pixel electrode PE is electrically connected to a drain electrode 8d of one corresponding TFT 30, within a first contact hole CHp that is composed of apertures 17Ap, 17Bp, 13p and 12p in the lower dielectric layer 17A, the upper dielectric layer 17B, the organic insulating layer 13, and the inorganic insulating layer 12. The pixel electrode PE and the drain electrode 8d may be directly in contact. The common electrode CE is not formed in the pixel contact portion. In other words, the first contact hole CHp is disposed in the aperture 15p of the common electrode CE.

Within the first contact hole CHp, the side surface of the aperture 12p and the side surface of the aperture 13p may be aligned. Moreover, the side surface of the aperture 17Ap and the side surface of the aperture 17Bp may be aligned. Note that, depending on the fabrication process, a portion of the side surface of the aperture 12p may be aligned with the side surface of the aperture 13p, while another portion thereof may be aligned with the side surface of the upper dielectric layer 17B.

The TFT 30, the source contact portion, and the drain contact portions may be similar in construction to those of the active matrix substrate 101.

In the present embodiment, too, as viewed from the normal direction of the substrate 1, the second contact hole CHt in the touch wiring contact portion and the source-side aperture 11s in the source contact portion are disposed so as to at least partially overlap. Moreover, the first contact hole CHp in the pixel contact portion and the drain-side aperture 11d in the drain contact portion are disposed so as to at least partially overlap. As a result, a decrease in the pixel aperture ratio associated with the contact portions can be suppressed.

Furthermore, by allowing an organic insulating layer 13 which may function also as a planarization film to be present between the touch wiring contact portion and the source contact portion (or the source electrode 8s), these contact portions are made less likely to interfere with each other.

In the present embodiment, too, the drain-side aperture 11d in the drain contact portion and the second contact hole CHt in the touch wiring contact portion may be disposed in the manner described above with reference to FIG. 5A to FIG. 5D.

<Method for Manufacturing the Active Matrix Substrate 105>

Hereinafter, with reference to FIG. 13A to FIG. 13D and FIG. 14, a method for manufacturing the active matrix substrate 105 will be described. FIG. 13A to FIG. 13D are step-by-step cross-sectional views for describing an exemplary method for manufacturing the active matrix substrate 105. FIG. 14 is a flowchart showing the exemplary method for manufacturing the active matrix substrate 105. In the following description, regarding the method of forming each layer, its material, thickness, etc., explanation will be conveniently omitted whenever similar to that for the above-described embodiment (e.g., the active matrix substrate 101).

In STEPS 3-1 to 3-7, a TFT 30 is formed by a method similar to STEPS 1-1 to 1-7.

STEP 3-8

Then, an interlayer insulating layer 16 is formed so as to cover the TFT 30 and the source bus line SL. Herein, as the interlayer insulating layer 16, an inorganic insulating layer 12 and an organic insulating layer 13 are formed in this order. Thereafter, the organic insulating layer 13 is patterned, whereby an aperture 13p through which a portion of the inorganic insulating layer 12 is exposed is formed. Next, by using the organic insulating layer 13 having the aperture 13p made therein as a mask, an aperture 12p is made in the inorganic insulating layer 12.

STEP 3-9

Figure 13A:
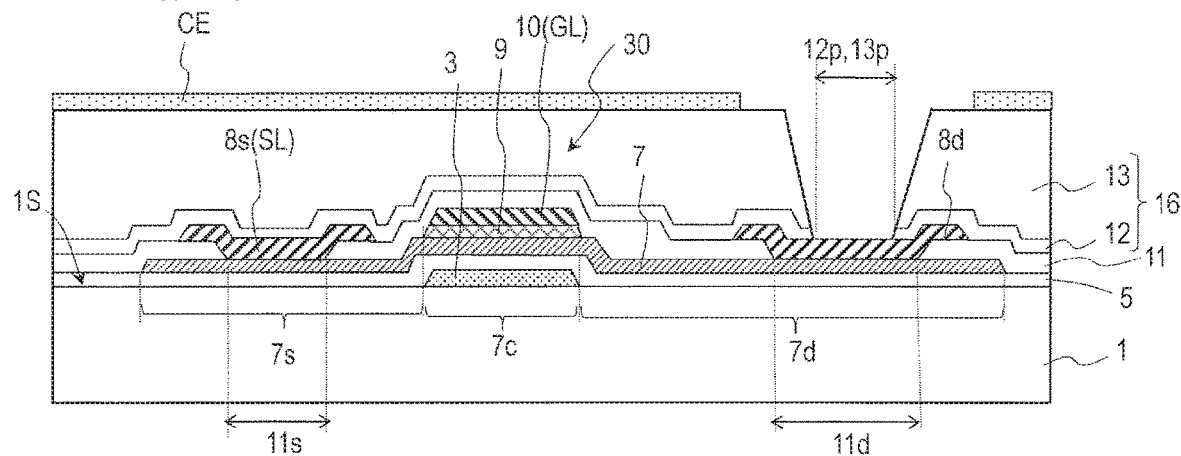
FIG. 13A A step-by-step cross-sectional view showing an exemplary method for manufacturing the active matrix substrate 105.
Figure 14:
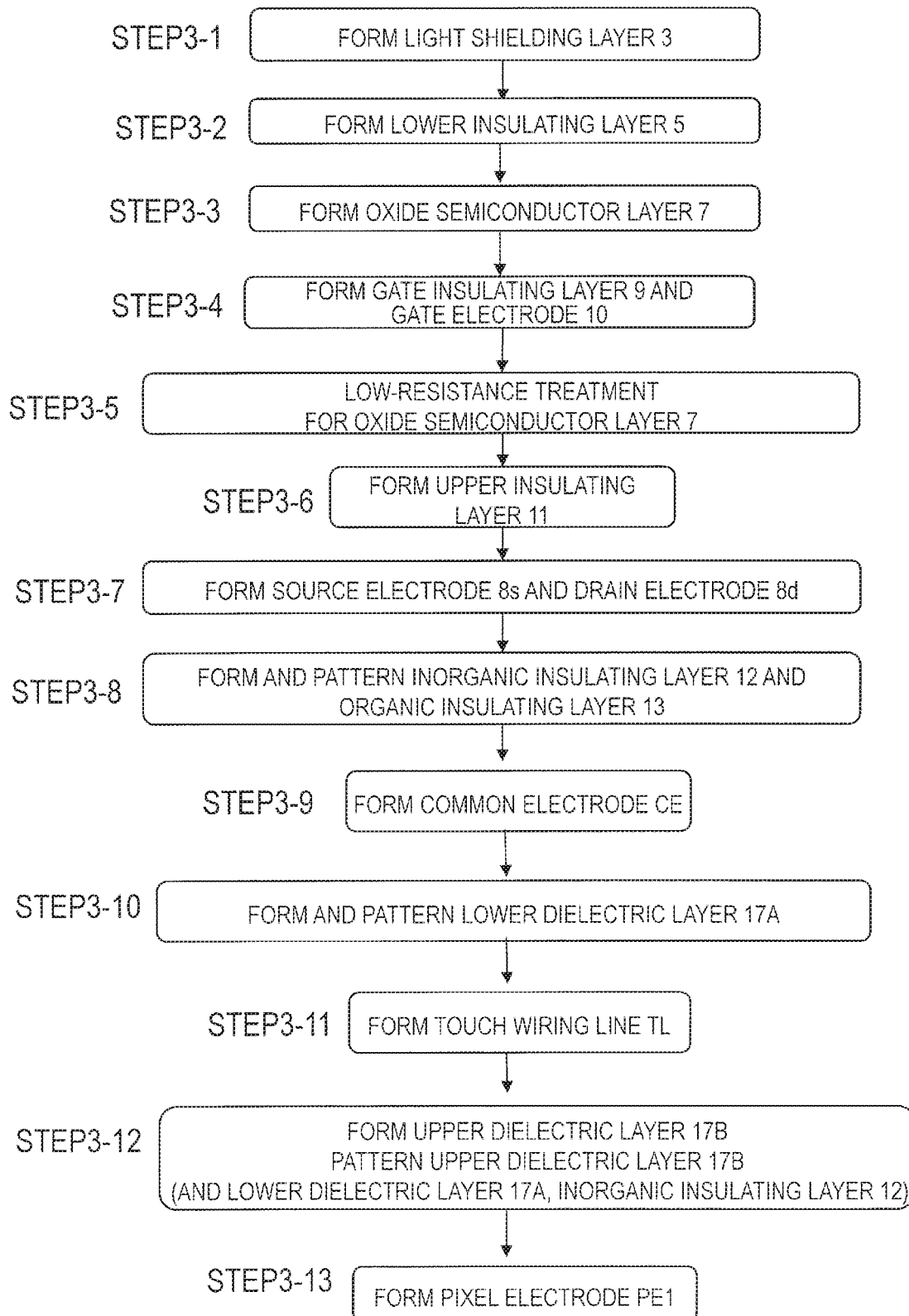
FIG. 14 A flowchart showing an exemplary method for manufacturing the active matrix substrate 105.

Then, as shown in FIG. 13A, on the interlayer insulating layer 16 and within the aperture 13p and the aperture 12p, a first transparent electrically conductive film is formed and then patterned, thereby forming a first transparent electrode layer including a common electrode CE. Portions of the first transparent electrically conductive film that are located within the aperture 13p and the aperture 12p are removed.

STEP 3-10

Figure 13B:
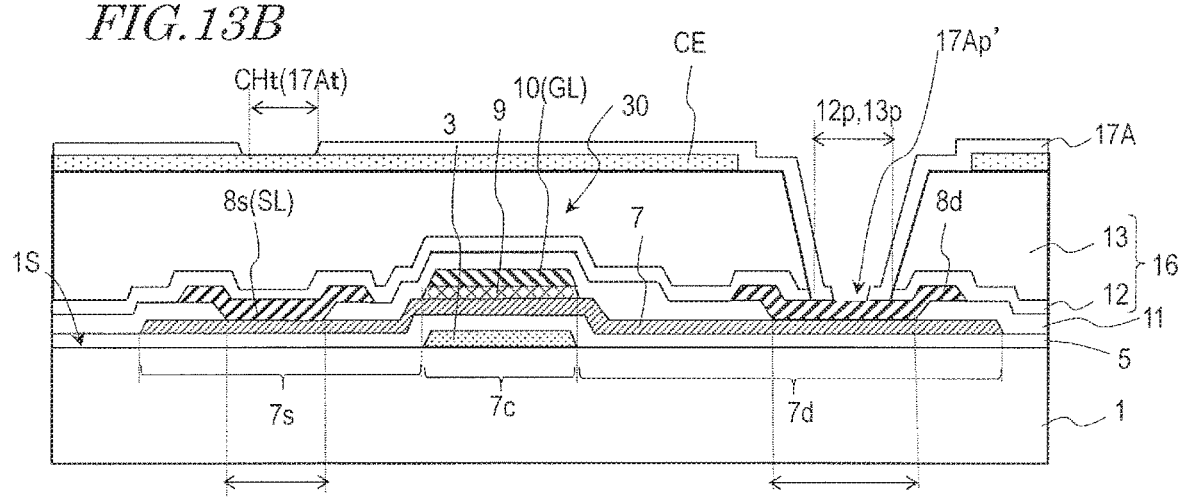
FIG. 13B A step-by-step cross-sectional view showing an exemplary method for manufacturing the active matrix substrate 105.

Next, as shown in FIG. 13B, a lower dielectric layer (thickness: 50 to 500 nm) 17A is formed so as to cover the common electrode CE. The material of the lower dielectric layer 17A may be the same as any of the materials exemplified for the inorganic insulating layer 12. Thereafter, the lower dielectric layer 17A is patterned, thereby forming an aperture 17At (second contact hole CHt) through which a portion of the common electrode CE (common electrode subportions CEa) is exposed and a preliminary aperture 17Ap' through which a portion of the drain electrode 8d is exposed. The preliminary aperture 17Ap' is disposed so as to at least partially overlap the aperture 13p.

STEP 3-11

Figure 13C:
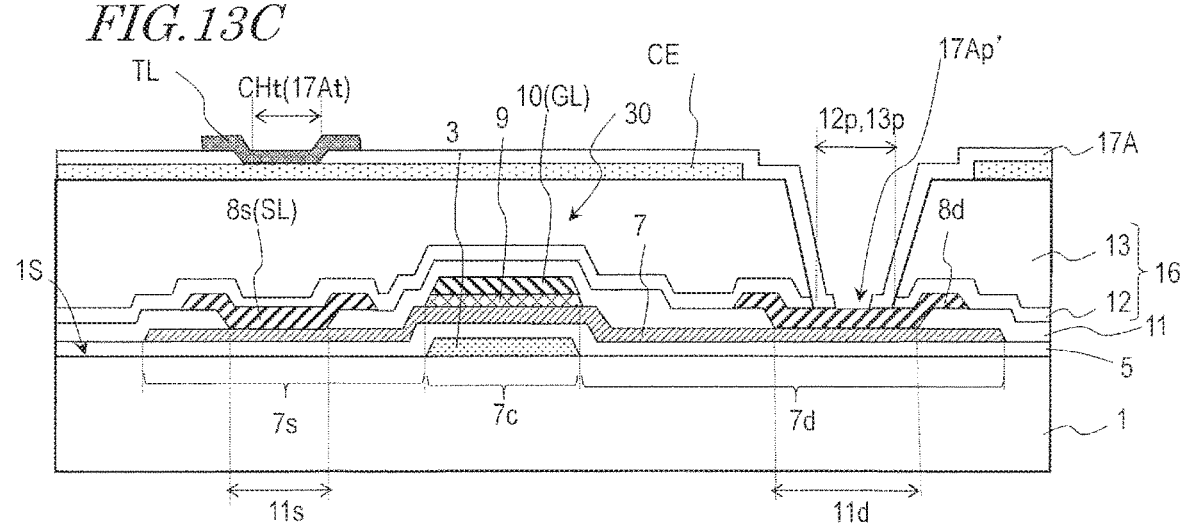
FIG. 13C A step-by-step cross-sectional view showing an exemplary method for manufacturing the active matrix substrate 105.

Next, as shown in FIG. 13C, on the lower dielectric layer 17A and within the second contact hole CHt, a metal film from which to form a touch wiring line is formed, and the metal film is patterned, whereby a touch wiring line TL is obtained. The touch wiring line TL is electrically connected to a common electrode CE (common electrode subportions CEa) within the second contact hole CHt.

STEP 3-12

Figure 13D:
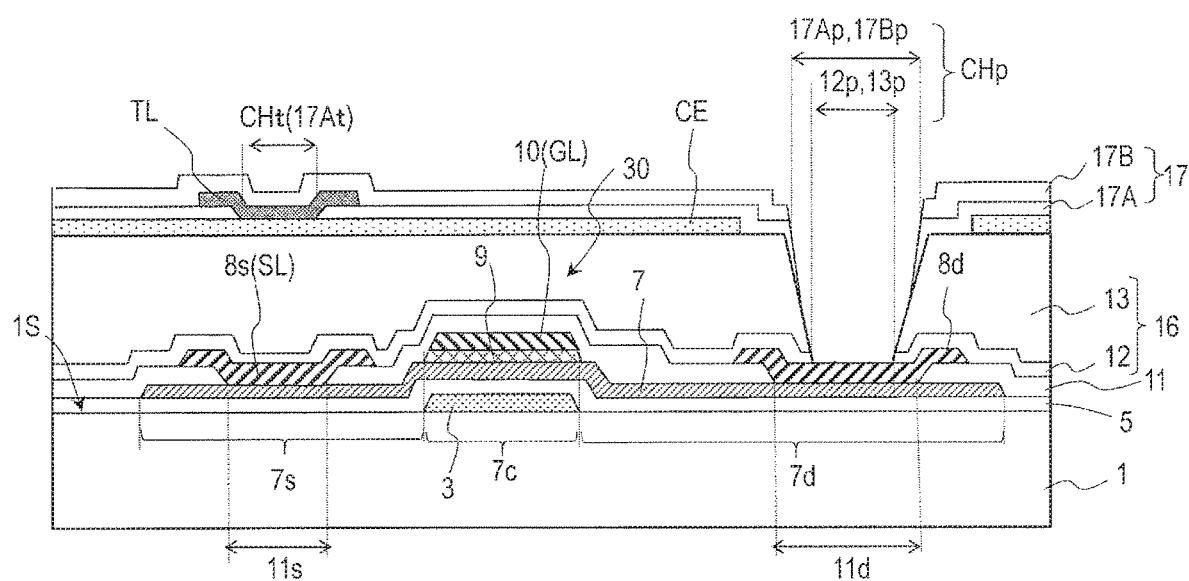
FIG. 13D A step-by-step cross-sectional view showing an exemplary method for manufacturing the active matrix substrate 105.

Then, as shown in FIG. 13D, on the touch wiring line TL and the lower dielectric layer 17A, an upper dielectric layer (thickness: 50 to 500 nm) 17B is formed. The material of the upper dielectric layer 17B may be the same as that of the lower dielectric layer 17A. Thereafter, by using a resist mask, the upper dielectric layer 17B is patterned, thereby forming an aperture 17Bp through which a portion of the drain electrode 8d is exposed. At this time, by using the aforementioned resist mask, a portion of the lower dielectric layer 17A that overlaps the aperture 17Bp is also simultaneously etched, whereby the aperture 17Ap is made in the lower dielectric layer 17A. Note that if the inorganic insulating layer 12 suffers etching insufficiencies or the like, any portion of the inorganic insulating layer 12 that overlaps the aperture 17Ap may also be removed through this etching step. The method of etching may be dry etching or wet etching. In this manner, a first contact hole CHp which is composed of the apertures 12p, 13p, 17Ap and 17Bp is obtained. Within the first contact hole CHp, the side surface of the aperture 12p and the side surface of the aperture 13p may be aligned, while the side surface of the aperture 17Ap and the side surface of the aperture 17Bp may be aligned.

There is no particular limitation as to the relative positioning between the aperture 17Bp and the preliminary aperture 17Ap' in the lower dielectric layer 17A. For example, the preliminary aperture 17Ap' may be located inside the aperture 17Bp as viewed from the normal direction of the substrate 1, and through this etching step, an aperture 17Ap that is aligned with the aperture 17Bp may be formed. Alternatively, the aperture 17Bp may be formed so as to intersect the preliminary aperture 17Ap' as viewed from the normal direction of the substrate 1. Alternatively, the aperture 17Bp may be formed so as to be located inside the preliminary aperture 17Ap'. In this case, the preliminary aperture 17Ap' would straightforwardly become the aperture 17Ap.

STEP 3-13

Then, a second transparent electrically conductive film is formed on the upper dielectric layer 17B and within the first contact hole CHp. Thereafter, by patterning the second transparent electrically conductive film through wet etching, for example, a second transparent electrode layer including the pixel electrode PE is obtained. In this manner, the active matrix substrate 105 as shown in FIG. 12A and FIG. 12B is obtained.

In the above method, when patterning the upper dielectric layer 17B, the lower dielectric layer 17A and the inorganic insulating layer 12 may also be simultaneously etched. Therefore, even if the preliminary aperture 17Ap' in the lower dielectric layer 17A and/or the aperture 12p in the inorganic insulating layer 12 should suffer malformations, misalignments, etc., the lower dielectric layer 17A and/or the inorganic insulating layer 12 may be again etched by using the resist mask for the patterning of the upper dielectric layer 17B. As a result, within the first contact hole CHp, the area of contact between the drain electrode 8d and the pixel electrode PE can be secured with increased certainty, whereby a highly reliable pixel contact portion can be formed.

Figure 15:
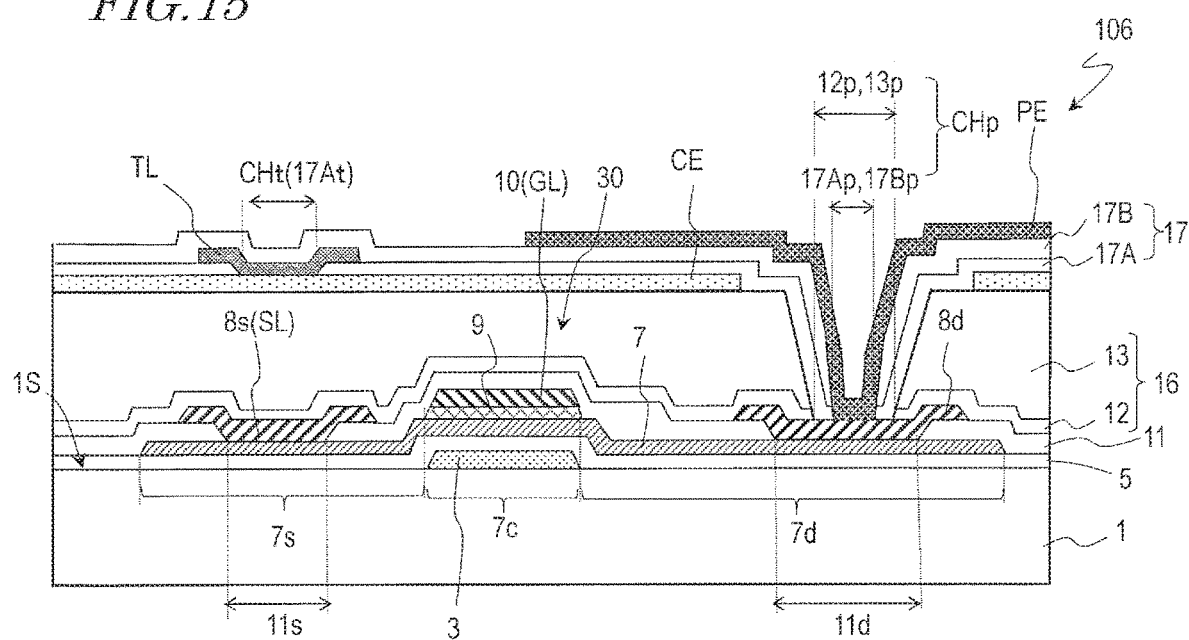
FIG. 15 A cross-sectional view showing another active matrix substrate 106.

In STEP 3-12, as viewed from the normal direction of the principal face 1S of the substrate 1, the aperture 13p may be located inside the aperture 17Bp, or the aperture 17Bp may be located inside the aperture 13p (see FIG. 15). Alternatively, the aperture 17Bp and the aperture 13p may be disposed so as to intersect each other as viewed from the normal direction of the principal face 1S of the substrate 1.

<Another Method for Manufacturing the Active Matrix Substrate 105>

Next, with reference to FIG. 16A to FIG. 16D and FIG. 17, another exemplary method for manufacturing the active matrix substrate 105 will be described. FIG. 16A to FIG. 16D are step-by-step cross-sectional views for describing another method for manufacturing the active matrix substrate 105. FIG. 17 is a flowchart showing the other method for manufacturing the active matrix substrate 105.

In STEPS 4-1 to 4-7, a TFT 30 is formed by a method similar to STEPS 1-1 to 1-7.

STEP 4-8

Then, an interlayer insulating layer 16 is formed so as to cover the TFT 30 and the source bus line SL. Herein, as the interlayer insulating layer 16, an inorganic insulating layer 12 and an organic insulating layer 13 are formed in this order. Thereafter, the organic insulating layer 13 is patterned, whereby an aperture 13p through which a portion of the inorganic insulating layer 12 is exposed is formed.

STEP 4-9

Figure 16A:
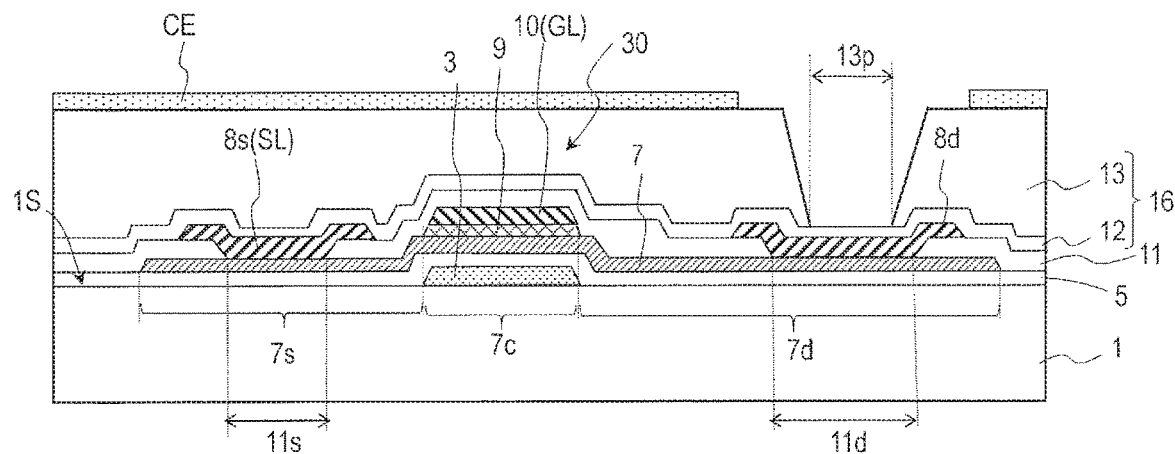
FIG. 16A A step-by-step cross-sectional view showing another method for manufacturing the active matrix substrate 105.
Figure 17:
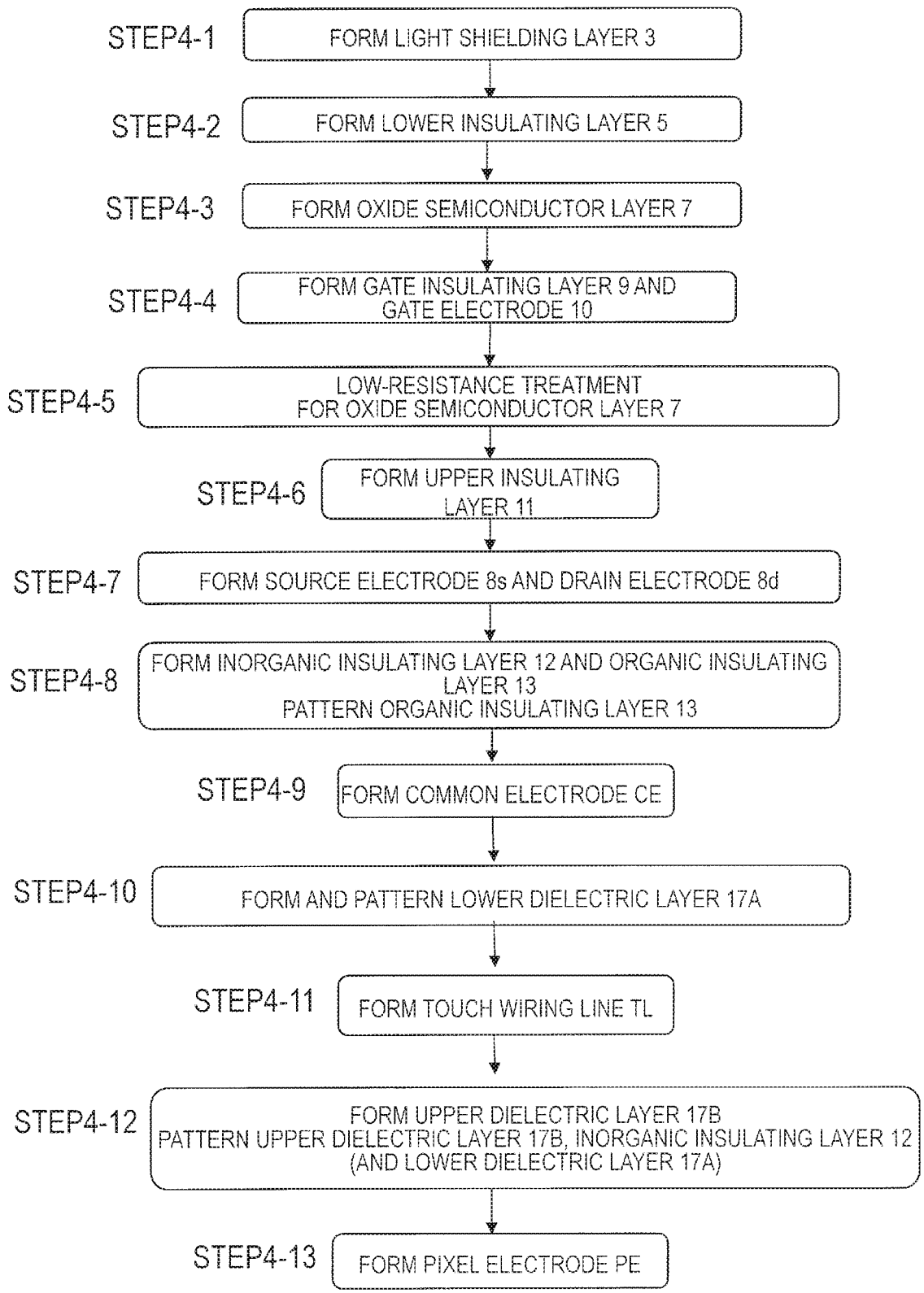
FIG. 17 A flowchart showing another method for manufacturing the active matrix substrate 105.

Then, as shown in FIG. 16A, a first transparent electrically conductive film is formed on the interlayer insulating layer 16 and within the aperture 13p, and the first transparent electrically conductive film is patterned, whereby a first transparent electrode layer including a common electrode CE is obtained. Any portion of the first transparent electrically conductive film that is located within the aperture 13p is removed.

STEP 4-10

Figure 16B:
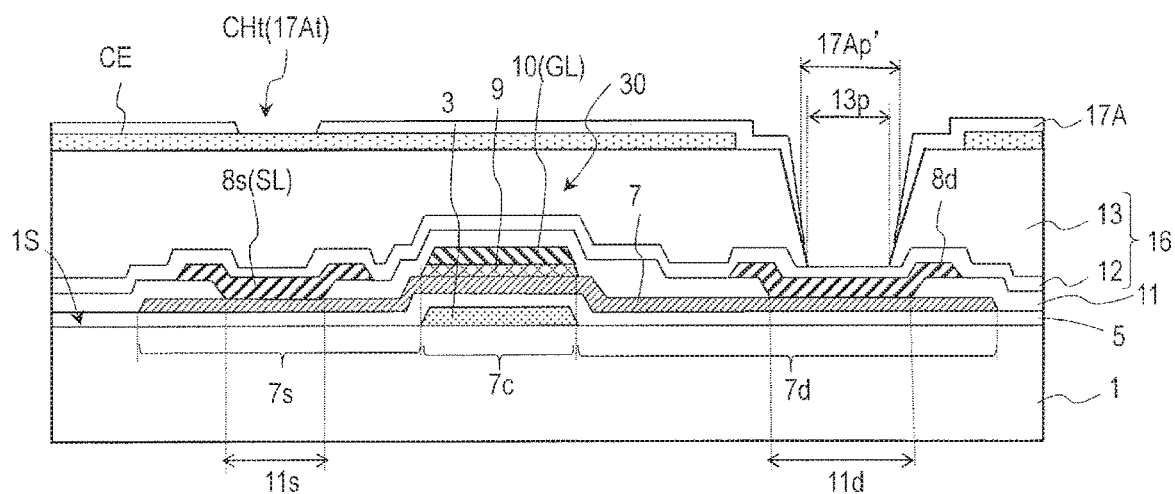
FIG. 16B A step-by-step cross-sectional view showing another method for manufacturing the active matrix substrate 105.

Next, as shown in FIG. 16B, a lower dielectric layer 17A is formed on the interlayer insulating layer 16 and on the common electrode CE, and the lower dielectric layer 17A is patterned. As a result, an aperture 17At (second contact hole CHt) through which a portion of the touch wiring line TL is exposed, and a preliminary aperture 17Ap' which is disposed so as to at least partially overlap the aperture 13p, are formed in the lower dielectric layer 17A.

STEP 4-11

Figure 16C:
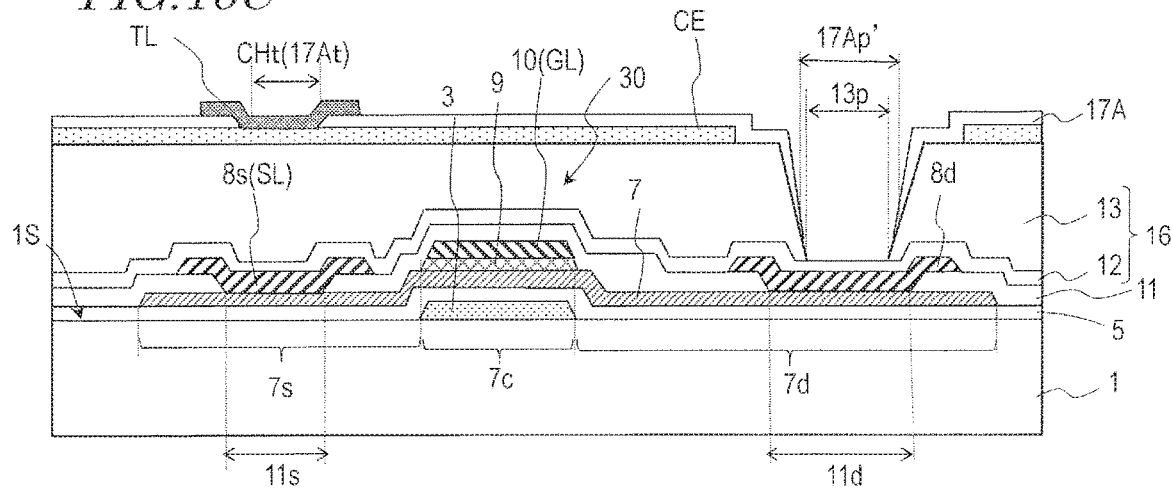
FIG. 16C A step-by-step cross-sectional view showing another method for manufacturing the active matrix substrate 105.

Next, as shown in FIG. 16C, on the lower dielectric layer 17A and within the second contact hole CHt and within the aperture 13p, a metal film from which to form a touch wiring line is formed, and the metal film is patterned, whereby a touch wiring line TL is obtained.

STEP 4-12

Figure 16D:
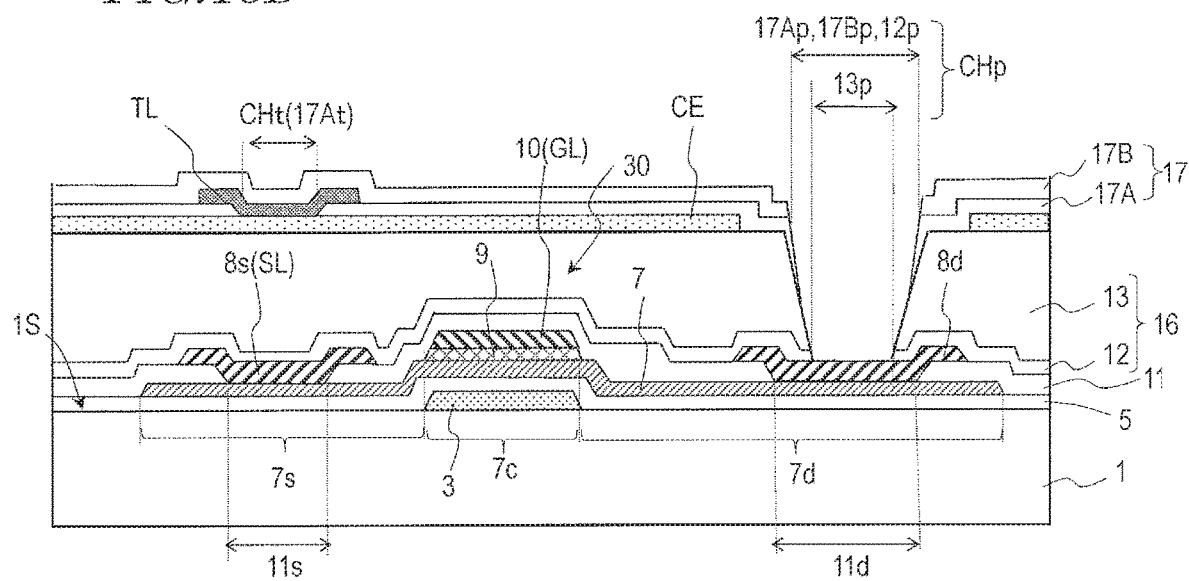
FIG. 16D A step-by-step cross-sectional view showing another method for manufacturing the active matrix substrate 105.

Next, as shown in FIG. 16D, on the touch wiring line TL and on the lower dielectric layer 17A, an upper dielectric layer 17B is formed. Thereafter, the upper dielectric layer 17B and the inorganic insulating layer 12 are patterned by using the same resist mask. As a result, in the upper dielectric layer 17B, an aperture 17Bp through which a portion of the drain electrode 8d is exposed is formed, and also, within the exposed portion of the inorganic insulating layer 12 (i.e., the portion exposed by the aperture 13p), a portion that overlaps the aperture 17Bp is removed, whereby an aperture 12p is formed. In other words, as viewed from the normal direction of the substrate 1, the aperture 12p is formed in a portion that overlaps both of the aperture 13p and the aperture 17Bp. Note that, when the aperture 17Ap suffers a malformation, a portion of the lower dielectric layer 17A that overlaps the aperture 17Bp can also be etched through this step. In this manner, a first contact hole CHp which is composed of the apertures 12p, 13p, 17Ap and 17Bp is obtained. In the case where the aperture 13p and the aperture 17Bp are disposed so as to intersect each other as viewed from the normal direction of the principal face 1S of the substrate 1, within the first contact hole CHp, a portion of the side surface of the aperture 12p may be aligned with the side surface of the aperture 13p, while another portion thereof may be aligned with the aperture 17Bp.

STEP 4-13

Then, a second transparent electrically conductive film is formed on the upper dielectric layer 17B and within the first contact hole CHp, and the second transparent electrically conductive film is patterned, whereby a second transparent electrode layer including a pixel electrode PE is obtained. In this manner, the active matrix substrate 105 (FIGS. 12A and 12B) is obtained.

In the above method, since the upper dielectric layer 17B and the inorganic insulating layer 12 are simultaneously etched, alignment work between the inorganic insulating layer 12 and the upper dielectric layer 17B is unnecessary. Moreover, when patterning the upper dielectric layer 17B, the lower dielectric layer 17A may also be simultaneously etched; therefore, even if the lower dielectric layer 17A should suffer a malformation, a misalignment, etc., the lower dielectric layer 17A may be again etched by using the resist mask for the patterning of the upper dielectric layer 17B. As a result, within the first contact hole CHp, the area of contact between the drain electrode 8d and the pixel electrode PE can be secured with increased certainty, whereby a highly reliable pixel contact portion can be formed.

Although not shown, a touch wiring layer including the touch wiring line TL may be provided on the substrate 1 side of the first transparent electrode layer including the common electrode CE. For example, on the interlayer insulating layer 16, the touch wiring layer, the second dielectric layer 18, the first transparent electrode layer including the common electrode CE, the first dielectric layer 17, and the second transparent electrode layer including the pixel electrode PE may be formed in this order.

<Variant>

Figure 18:
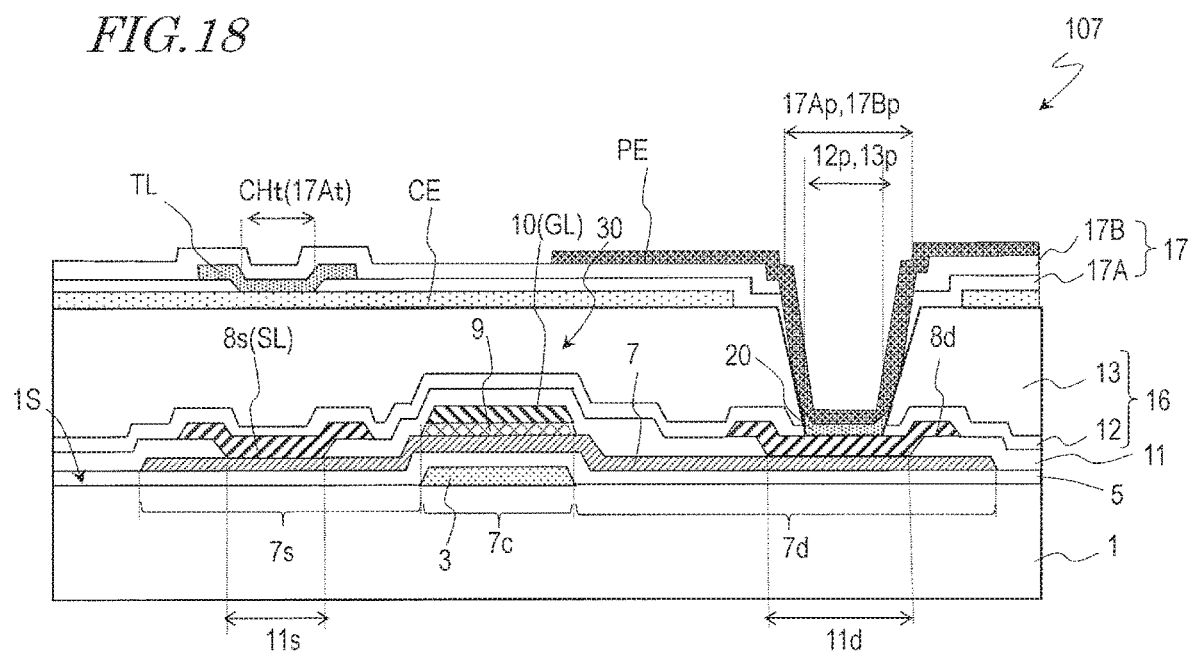
FIG. 18 A cross-sectional view showing still another active matrix substrate 107 according to a second embodiment.

FIG. 18 is a cross-sectional view illustrating a pixel contact portion in an active matrix substrate 107 according to a variant.

In the variant, within a first contact hole CHp, an island-shaped metal layer 20 is disposed between the drain electrode 8d and the pixel electrodes PE. The drain electrode 8d and the pixel electrodes PE are electrically connected via the island-shaped metal layer 20. The island-shaped metal layer 20 is formed by using the same metal film as the touch wiring line TL (i.e., formed in the touch wiring layer), for example. For example, in the method described above with reference to FIG. 13A to FIG. 13D and FIG. 14, after the step (STEP 3-10) of forming the aperture 17Ap in the lower dielectric layer 17A, a metal film for the touch wiring line TL may be formed, and the metal film may be patterned, thereby forming the touch wiring line TL and the island-shaped metal layer 20 (STEP 3-11). The island-shaped metal layer 20 may be disposed so as to be directly in contact with the drain electrode 8d within a contact hole that is composed of the aperture 17Ap, the aperture 13p, and the aperture 12p. Thereafter, an upper dielectric layer 17B may be formed, and an aperture 17Bp through which a part or a whole of the island-shaped metal layer 20 is exposed may be formed in the upper dielectric layer 17B. The common electrode CE is disposed so as to be in contact with the island-shaped metal layer 20 within the aperture 17Bp. With this construction, the pixel electrodes PE provide better coverage, whereby a more reliable pixel contact portion is obtained.

The structure of the active matrix substrate according to embodiments of the present invention is not limited to the structures that have been described with reference to FIG. 1 to FIG. 18.

In the aforementioned examples, the TFTs 30 are disposed so that the channel length direction of their channel region is the y direction (structure with vertical TFT placement); however, the pixel TFTs may be disposed so that their channel length direction is the x direction (structure with horizontal TFT placement).

Figure 19:
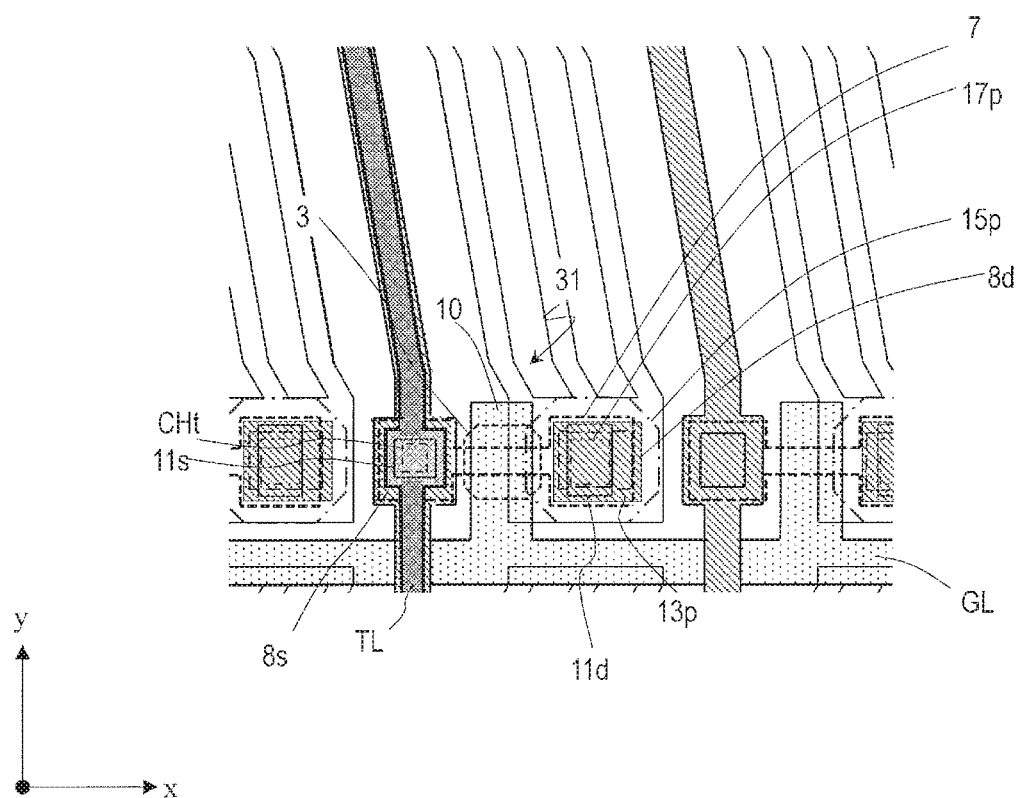
FIG. 19 A plan view showing a variant of the active matrix substrate.

FIG. 19 is a plan view showing an example where the arrangement of contact portions according to the present embodiment is applied to an active matrix substrate having a structure with horizontal TFT placement.

TFTs 31, which are pixel TFTs, are disposed so that their channel length direction is the x direction. In this example, too, as viewed from the normal direction of the substrate 1, the second contact hole CHt in the touch wiring contact portion and the source-side aperture 11s in the source contact portion at least partially overlap, and the first contact hole CHp in the pixel contact portion and the drain-side aperture 11d in the drain contact portion are disposed so as to at least partially overlap. As a result, a decrease in the pixel aperture ratio associated with these contact portions can be suppressed.

Under a structure with horizontal TFT placement, the second contact hole CHt and the first contact hole CHp can be disposed side by side along the x direction, so that the width of the light shielding region (light-shielding range) M can be made smaller. However, such an arrangement would be difficult when the pixel size (or in particular, the width of each pixel along the x direction) is small. On the other hand, a structure with vertical TFT placement may be suitably used for an active matrix substrate having a small pixel size (e.g., 30 µm or less). By applying the arrangement of contact portions according to the present embodiment to a structure with vertical TFT placement, an active matrix substrate having a high resolution and a high pixel aperture ratio can be realized.

Although FIG. 19 illustrates an example where the common electrode CE is disposed on the substrate 1 side of the pixel electrodes PE, the pixel electrodes PE may be disposed on the substrate 1 side of the common electrode CE.

Furthermore, so long as the touch wiring layer, the transparent electrode layer including the common electrode CE, and the transparent electrode layer including the pixel electrodes PE are each formed above the interlayer insulating layer 16, their order is not limited to the orders illustrated in FIG. 2 to FIG. 18. In each case, the second contact hole CHt is to be formed in the insulator between the common electrode CE and the touch wiring line TL, and the first contact hole CHp is to be formed in the insulator (including the interlayer insulating layer 16) between the pixel electrode PE and the drain electrode 8d.

The structure of each pixel TFT is not particularly limited, either. In the first and second embodiments above, the TFTs 30 and 31 being the pixel TFTs are both top-gate structured TFTs; alternatively, they may be double-gate structure TFTs including still another gate electrode (referred to as a lower gate electrode) on the substrate 1 side of the oxide semiconductor layer 7. For example, to the light shielding layer 3 as shown in FIG. 2B, a gate signal may be input, so that it functions as a lower gate electrode. In this case, the gate bus lines GL may be formed of the same electrically conductive film as the gate electrodes 10, or formed of the same electrically conductive film as the lower gate electrodes.

Alternatively, the pixel TFTs may be bottom-gate structured TFTs whose gate electrode is disposed on the substrate of the oxide semiconductor layer. As bottom-gate structured TFTs, for example, etchstop-type TFTs having a channel protection layer (etchstop layer) between the source/drain electrode and the oxide semiconductor layer may be used. In the etchstop layer, a source-side aperture and a drain-side aperture through which the oxide semiconductor layer is exposed are made. As viewed from the normal direction of the substrate 1, the source-side aperture in the etchstop layer and the touch wiring contact portion may be disposed so as to overlap each other, while the drain-side aperture and the pixel contact portion may be disposed so as to overlap each other.

(Regarding the Oxide Semiconductor)

The oxide semiconductor that is contained in the oxide semiconductor layer 7 may be an amorphous oxide semiconductor film, or a crystalline oxide semiconductor having a crystalline portion(s). Examples of crystalline oxide semiconductors may include polycrystalline oxide semiconductors, microcrystalline oxide semiconductors, and crystalline oxide semiconductors whose c axis is oriented substantially perpendicular to the layer plane.

The oxide semiconductor layer 7 may have a multilayer structure of two or more layers. When the oxide semiconductor layer 7 has a multilayer structure, the oxide semiconductor layer 7 may include an amorphous oxide semiconductor layer and a crystalline oxide semiconductor layer. Alternatively, a plurality of crystalline oxide semiconductor layers with different crystal structures may be included. Moreover, a plurality of amorphous oxide semiconductor layers may be included. In the case where the oxide semiconductor layer 7 has a two-layer structure including an upper layer and a lower layer, it is preferable that the oxide semiconductor that is contained in the upper layer has an energy gap which is greater than the energy gap of the oxide semiconductor that is contained in the lower layer. However, when the difference between the energy gaps of these layers is relatively small, the energy gap of the oxide semiconductor of the lower layer may be greater than the energy gap of the oxide semiconductor of the upper layer.

Materials, structures, film formation methods, and the like of amorphous oxide semiconductors and the aforementioned crystalline oxide semiconductors, the construction of an oxide semiconductor layer having a multilayer structure, and the like are described in Japanese Laid-Open Patent Publication No. 2014-007399, for example. The entire disclosure of Japanese Laid-Open Patent Publication No. 2014-007399 is incorporated herein by reference.

The oxide semiconductor layer 7 may contain at least one metallic element among In, Ga, and Zn, for example. In the present embodiment, the oxide semiconductor layer 7 contains an In—Ga—Zn—O based semiconductor (e.g., indium gallium zinc oxide), for example. Herein, the In—Ga—Zn—O based semiconductor is a ternary oxide of In (indium), Ga (gallium), and Zn (zinc). The ratio between In, Ga, and Zn (composition ratio) is not particularly limited, and includes In:Ga:Zn=2:2:1, In:Ga:Zn=1:1:1, In:Ga:Zn=1:1:2, and the like, for example. Such an oxide semiconductor layer 7 may be made of an oxide semiconductor film containing an In—Ga—Zn—O based semiconductor.

The In—Ga—Zn—O based semiconductor may be amorphous or crystalline. As a crystalline In—Ga—Zn—O based semiconductor, a crystalline In—Ga—Zn—O based semiconductor whose c axis is oriented generally perpendicular to the layer plane is preferable.

Note that the crystal structure of a crystalline In—Ga—Zn—O based semiconductor is disclosed in, for example, Japanese Laid-Open Patent Publication No. 2014-007399, supra, Japanese Laid-Open Patent Publication No. 2012-134475, Japanese Laid-Open Patent Publication No. 2014-209727, and so on. The entire disclosure of Japanese Laid-Open Patent Publication No. 2012-134475 and Japanese Laid-Open Patent Publication No. 2014-209727 is incorporated herein by reference. A TFT having an In—Ga—Zn—O based semiconductor layer has a high mobility (more than 20 times that of an a-Si TFT) and a low leak current (less than 1/100 of that of an a-Si TFT), and is suitably used as a driving TFT (e.g., a TFT that is included in a driving circuit which is provided around a displaying region that includes a plurality of pixels and on the same substrate as the displaying region) or a pixel TFT (a TFT which is provided in a pixel).

The oxide semiconductor layer 7 may contain other oxide semiconductors instead of an In—Ga—Zn—O based semiconductor. For example, it may contain an In—Sn—Zn—O based semiconductor (e.g., $In_2O_3$—$SnO_2$—ZnO; InSnZnO). An In—Sn—Zn—O based semiconductor is a ternary oxide of In (indium), Sn (tin), and Zn (zinc). Alternatively, the oxide semiconductor layer 7 may contain an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), an Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, a Ga—Zn—O based semiconductor, an In—Ga—Zn—Sn—O based semiconductor, or the like.

Embodiments of the present invention are widely applicable to a variety of semiconductor devices that include oxide semiconductor TFTs, and particularly suitably applicable to a liquid crystal display device with touch sensing having a high resolution.

This application is based on US Provisional Application No. 62/733,267 filed on Sep. 19, 2018, the entire contents of which are hereby incorporated by reference.

What is claimed is:

1. A method for manufacturing an active matrix substrate having a plurality of pixel regions, the active matrix substrate including a thin film transistor associated with each of the plurality of pixel regions, a plurality of electrodes for touchscreen panel function, and a plurality of wiring lines for touchscreen panel function, the plurality of pixel regions including a first pixel region with which a first thin film transistor is associated, the plurality of electrodes for touchscreen panel function including a first electrode which is at least partially located in the first pixel region, the plurality of wiring lines for touchscreen panel function including a first wiring line which is electrically connected to the first electrode, the first wiring line having a multilayer structure including a lower wiring portion and an upper wiring portion which is disposed on the lower wiring portion;
the method comprising, in the first pixel region:
(A) a step of forming, on a substrate having a principal face, an oxide semiconductor layer to become an active layer of the first thin film transistor, and a gate electrode which overlaps at least a portion of the oxide semiconductor layer via a gate insulating layer;
(B) a step of forming an insulating layer covering the gate electrode, the gate insulating layer, and the oxide semiconductor layer, and having a source-side aperture through which a portion of the oxide semiconductor layer is exposed and a drain-side aperture through which another portion of the oxide semiconductor layer is exposed, such that, when viewed from a normal direction of the principal face of the substrate, the source-side aperture and the drain-side aperture are located on opposite sides of a region of the oxide semiconductor layer that overlaps the gate electrode;
(C) a step of forming a source electrode on the insulating layer and within the source-side aperture and forming a drain electrode on the insulating layer and within the drain-side aperture, thereby providing the first thin film transistor;
(D) a step of forming an interlayer insulating layer that includes an organic insulating layer, the interlayer insulating layer covering the first thin film transistor and having a first contact hole through which a portion of the drain electrode is exposed;
(E) a step of forming a first transparent electrically conductive film on the interlayer insulating layer and within the first contact hole;
(F) a step of forming by using a metal film, on a portion of the first transparent electrically conductive film, the upper wiring portion of the first wiring line;
(G) a step of patterning the first transparent electrically conductive film to form a pixel electrode which is electrically connected to the drain electrode within the first contact hole, and form the lower wiring portion of the first wiring line;
(H) a step of forming a dielectric layer covering the pixel electrode and the first wiring line and having a second contact hole through which a portion of the first wiring line is exposed;
(I) a step of forming, on the dielectric layer and within the second contact hole, a common electrode which is electrically connected to the first wiring line within the second contact hole, such that the common electrode is capable of functioning as the first electrode, wherein, when viewed from a normal direction of the principal face of the substrate, a bottom face of the first contact hole at least partially overlaps a bottom face of the drain-side aperture, and a bottom face of the second contact hole at least partially overlaps a bottom face of the source-side aperture.

2. The method for manufacturing an active matrix substrate of claim 1, wherein, in step (A), the gate electrode is disposed on a portion of the oxide semiconductor layer via the gate insulating layer.

3. The method for manufacturing an active matrix substrate of claim 2, further comprising, in between step (A) and step (B), a step of performing a low-resistance treatment for the oxide semiconductor layer by using the gate electrode as a mask, so that a specific resistance of a region of the oxide semiconductor layer that does not overlap the gate electrode is lower than a specific resistance of a region that overlaps the gate electrode.

4. The method for manufacturing an active matrix substrate of claim 2, further comprising a step of forming, on the substrate side of the oxide semiconductor layer and via another insulating layer, a light shielding layer or another gate electrode that at least partially overlaps the portion of the oxide semiconductor layer.

5. The method for manufacturing an active matrix substrate of claim 1, the active matrix substrate further including a plurality of gate bus lines and a plurality of source bus lines, the source electrode of the first thin film transistor being electrically connected to a corresponding one of the plurality of source bus lines, and the gate electrode of the first thin film transistor being electrically connected to a corresponding one of the plurality of gate bus lines, wherein, step (A) further comprises a step of forming the one corresponding gate bus line by using a same electrically conductive film as the gate electrode;

step (C) further comprises a step of forming the one corresponding source bus line by using a same electrically conductive film as the source electrode.

6. The method for manufacturing an active matrix substrate of claim 5, wherein, when viewed from the normal direction of the principal face of the substrate, the first contact hole, the second contact hole, the source-side aperture, and the drain-side aperture are each disposed so as to overlap neither the one corresponding gate bus lines nor the gate electrode.

7. The method for manufacturing an active matrix substrate of claim 5, wherein, the source electrode is formed integrally with the one corresponding source bus line; and, when viewed from the normal direction of the principal face of the substrate, the source-side aperture is disposed inside a source conducting portion that includes the one corresponding source bus line and the source electrode, the source-side aperture being disposed only on one side of a median line that equally divides a width of the one corresponding source bus line into two, and the second contact hole is disposed so as to overlap the median line inside the source conducting portion.

8. The method for manufacturing an active matrix substrate of claim 1, wherein, when viewed from the normal direction of the principal face of the substrate, the second contact hole is located inside the source-side aperture.

9. The method for manufacturing an active matrix substrate of claim 1, wherein, when viewed from the normal direction of the principal face of the substrate, the source-side aperture is located inside the second contact hole.

10. The method for manufacturing an active matrix substrate of claim 1, wherein, when viewed from the normal direction of the principal face of the substrate, the bottom face of the second contact hole and the bottom face of the source-side aperture intersect each other.

11. The method for manufacturing an active matrix substrate of claim 1, wherein the oxide semiconductor layer comprises an In—Ga—Zn—O based semiconductor.

12. An active matrix substrate manufactured by the method of claim 1.

13. A method for manufacturing a liquid crystal display device with touch sensing that includes:

an active matrix substrate;

a counter substrate that is opposed to the active matrix substrate; and a liquid crystal layer that is provided between the active matrix substrate and the counter substrate, wherein the method comprises a step of providing the active matrix substrate; and the step is performed by the method of claim 1.

* * * * *